US012635499B2

(12) United States Patent
Chen et al.

(10) Patent No.: US 12,635,499 B2
(45) Date of Patent: May 19, 2026

(54) THROUGH SUBSTRATE VIA LANDING ON FRONT END OF LINE STRUCTURE

(71) Applicant: Taiwan Semiconductor Manufacturing Company, Ltd., Hsinchu (TW)

(72) Inventors: Chieh-En Chen, Tainan City (TW); Chen-Hsien Lin, Tainan City (TW); Shyh-Fann Ting, Tainan City (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 369 days.

(21) Appl. No.: 18/358,164

(22) Filed: Jul. 25, 2023

(65) Prior Publication Data

US 2024/0379500 A1 Nov. 14, 2024

Related U.S. Application Data

(60) Provisional application No. 63/501,437, filed on May 11, 2023.

(51) Int. Cl.
| | |
|---|---|
| *H10W 20/20* | (2026.01) |
| *H10W 20/42* | (2026.01) |
| *H10W 72/20* | (2026.01) |
| *H10W 72/29* | (2026.01) |
| *H10W 72/90* | (2026.01) |

(52) U.S. Cl.
CPC ........... *H10W 20/20* (2026.01); *H10W 20/42* (2026.01); *H10W 72/252* (2026.01); *H10W 72/29* (2026.01); *H10W 72/952* (2026.01)

(58) Field of Classification Search
CPC .................................................... H01L 23/481
See application file for complete search history.

(56) References Cited

U.S. PATENT DOCUMENTS

| | | | | |
|---|---|---|---|---|
| 5,716,218 A | * | 2/1998 | Farnworth | ........ H01L 23/49838 |
| | | | | 257/E23.07 |
| 6,352,923 B1 | * | 3/2002 | Hsuan | ............... H01L 21/76898 |
| | | | | 257/E21.597 |
| 6,909,188 B2 | * | 6/2005 | Akiyama | .......... H01L 21/76807 |
| | | | | 257/784 |

(Continued)

FOREIGN PATENT DOCUMENTS

JP 2019021681 A 2/2019

*Primary Examiner* — William A Harriston
(74) *Attorney, Agent, or Firm* — Eschweiler & Potashnik, LLC

(57) ABSTRACT

The problem of connecting a TSV to a BEOL metal interconnect structure without damaging the BEOL metal interconnect structure is solved by landing the TSV on a metal coupling structure formed during FEOL processing. The metal coupling structure is produced in accordance with design rules that apply to FEOL processing. The metal coupling structure may include substructures that have the composition and shape of wires in a transistor level metal interconnect and substructures that have the composition and shape of metal gate strips. The metal coupling structure may include pluralities of the substructures arrayed across the TSV landing area. The substructures that make up the metal coupling structure are connected to the BEOL metal interconnect through vias.

20 Claims, 61 Drawing Sheets

(56) References Cited

U.S. PATENT DOCUMENTS

| | | | |
|---|---|---|---|
| 2007/0032059 A1* | 2/2007 | Hedler | H01L 21/76898 |
| | | | 257/E21.597 |
| 2007/0069364 A1* | 3/2007 | Kawano | H01L 21/76898 |
| | | | 438/584 |
| 2009/0057844 A1* | 3/2009 | Tanida | H01L 21/76898 |
| | | | 257/E21.597 |
| 2010/0102454 A1* | 4/2010 | Akiyama | H01L 21/76898 |
| | | | 257/774 |
| 2011/0316168 A1* | 12/2011 | Moon | H01L 25/0657 |
| | | | 257/E21.578 |
| 2012/0061827 A1* | 3/2012 | Fujita | H01L 23/481 |
| | | | 257/737 |
| 2015/0235898 A1 | 8/2015 | Vick et al. | |
| 2016/0351474 A1* | 12/2016 | Dote | H01L 23/481 |
| 2022/0020803 A1 | 1/2022 | Kim et al. | |
| 2022/0093757 A1* | 3/2022 | Huang | H10D 64/021 |
| 2022/0399250 A1* | 12/2022 | Chen | H10F 39/809 |
| 2022/0415742 A1 | 12/2022 | Sahu et al. | |
| 2022/0415929 A1 | 12/2022 | Chuang et al. | |
| 2023/0134770 A1 | 5/2023 | Ganesan et al. | |

* cited by examiner

1300D

1700D

2110A

2110B

2110C

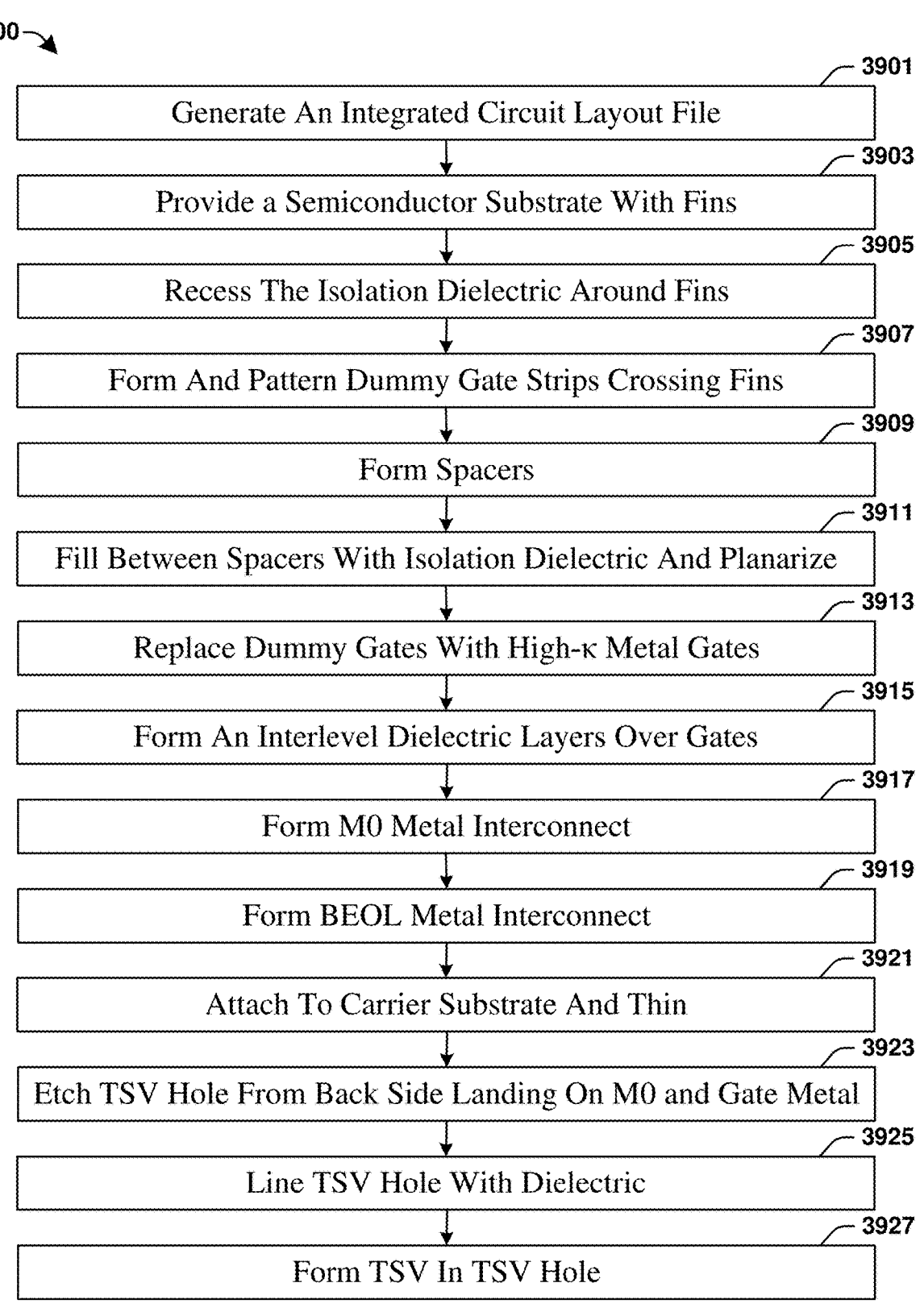

3900

3901
Generate An Integrated Circuit Layout File

3903
Provide a Semiconductor Substrate With Fins

3905
Recess The Isolation Dielectric Around Fins

3907
Form And Pattern Dummy Gate Strips Crossing Fins

3909
Form Spacers

3911
Fill Between Spacers With Isolation Dielectric And Planarize

3913
Replace Dummy Gates With High-κ Metal Gates

3915
Form An Interlevel Dielectric Layers Over Gates

3917
Form M0 Metal Interconnect

3919
Form BEOL Metal Interconnect

3921
Attach To Carrier Substrate And Thin

3923
Etch TSV Hole From Back Side Landing On M0 and Gate Metal

3925
Line TSV Hole With Dielectric

3927
Form TSV In TSV Hole

Fig. 39

THROUGH SUBSTRATE VIA LANDING ON FRONT END OF LINE STRUCTURE

REFERENCE TO RELATED APPLICATION

This application claims the benefit of U.S. Provisional Application No. 63/501,437, filed on May 11, 2023, the contents of which are incorporated herein by reference in their entirety.

BACKGROUND

Modern day integrated circuit devices contain billions or trillions of semiconductor devices formed in or on a semiconductor substrate during front-end-of-line (FEOL) processing. The semiconductor devices are electrically interconnected through a metal interconnect structure formed above the semiconductor substrate during back-end-of-line (BEOL) processing. A typical BEOL metal interconnect structure includes wires arranged in a plurality of metallization layers. Vias between the metallization layers interconnect the wires and the wires and vias are embedded within a dielectric. The dielectric may be a low-κ dielectric or an extremely low-κ dielectric. In some integrated circuit devices, the BEOL metal interconnect structure is supplemented by additional wiring formed at the level of the semiconductor devices, e.g., at the level of transistors on the semiconductor substrate. This additional wiring may be referred to as an FEOL metal interconnect structure or an M0 metallization layer.

BRIEF DESCRIPTION OF THE DRAWINGS

Aspects of the present disclosure are best understood from the following detailed description when read with the accompanying figures. In accordance with standard industry practice, features are not drawn to scale. Moreover, the dimensions of various features within individual drawings may be arbitrarily increased or reduced relative to one-another to facilitate illustration or provide emphasis.

FIGS. 13A-32C are a series of cross-sectional and plan views showing a process according to some embodiments. The "A" figures correspond to a first cross-section, the "B" figures a second cross-section, and the "C" figures a third cross-section. The "D" figures, where included in this series, show plan views, and indicate the relative locations of the cross-sections where they cross a TSV landing area.

FIGS. 33A-34C are cross-sectional views illustrating a variation of the process of FIGS. 13A-32C providing an alternate embodiment.

FIGS. 35A-36C are cross-sectional views illustrating a variation of the process of FIGS. 13A-32C providing another alternate embodiment.

FIGS. 37A-38C are cross-sectional views illustrating a variation of the process of FIGS. 13A-32C providing another alternate embodiment.

FIG. 39 provides a flow chart of a process according to some embodiments.

DETAILED DESCRIPTION

Figure 1A:
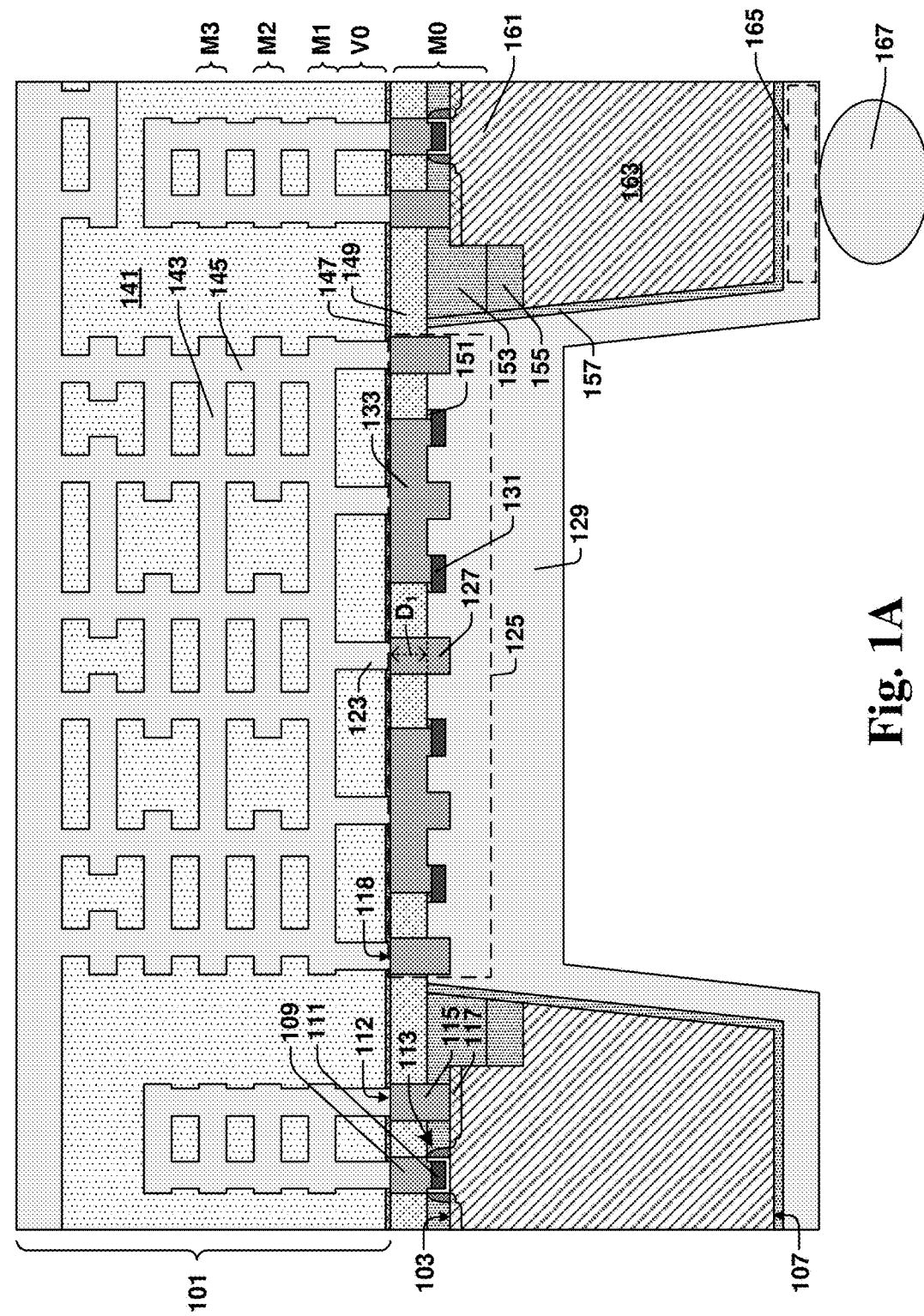
FIGS. 1A-E illustrate cross-sectional views of an integrated circuit (IC) device according to some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

Spatially relative terms, such as "beneath," "below," "lower," "above," "upper", and the like, may be used herein to describe one element or feature's relationship to another element(s) or feature(s) as illustrated in the figures. These spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may be interpreted accordingly. Terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

An integrated circuit device typically connects to off chip components through a top metallization layer of a BEOL metal interconnect structure disposed over the front side of a semiconductor substrate. To increase functionality, a plurality of substrates may be stacked together. The second substrate may have a second BEOL metal interconnect structure. In order to form connections between the BEOL metal interconnect structure of the second semiconductor substrate and that of the first semiconductor substrate, it is often desirable to form through substrate vias (TSVs). A TSV passes from the back side of the first semiconductor substrate to the front side and typically lands on a landing pad disposed in the first metallization layer of the BEOL metal interconnect structure on the front side.

Forming the TSV involves etching through the thickness of the first semiconductor substrate. As semiconductor devices are made smaller, the wires of the BEOL metal interconnect structure, particularly those of the first metallization layer, are made narrower so as to provide a higher density of connections. As the wires are made narrower with respect to width, they are made proportionally thinner with respect to depth. As a consequence, it has become progressively more difficult to complete the etch through the thickness of the semiconductor substrate and have the etch stop on the first metallization layer without causing damage to the wiring or the surrounding dielectric, particularly if the surrounding dielectric is an extremely low-κ dielectric.

The present disclosure solves the problem of connecting a TSV to a BEOL metal interconnect structure without damaging the BEOL metal interconnect structure by landing the TSV on a metal coupling structure formed during FEOL processing. In some embodiments, the metal coupling structure includes a substructure of a first metal composition which is distinct from a composition of the wires in the BEOL metal interconnect. The first metal composition may be harder than the metal of the wires. For example, the first metal composition may be or comprise tungsten (W) or the like while the wires are or comprise copper (Cu) or the like.

In some embodiments, the metal coupling structure includes a substructure that has the same composition as, is disposed at the same height as, and is formed simultaneously with the wires of an FEOL metal interconnect on the same chip. In some embodiments, the metal coupling structure includes a substructure that has the same composition as, is disposed at the same height as, and is formed simultaneously with a gate strip that provides gate electrodes for transistors on the same chip. In some embodiments, the metal coupling structure include a first substructure having the composition of the FEOL metal interconnect and a second substructure having the composition of the gate strip. The metal coupling structure is connected to the BEOL metal interconnect through vias. In some embodiments, the vias are part of the BEOL metal interconnect and have the same composition as the wires of the BEOL metal interconnect.

A metal coupling structure formed during FEOL processing obeys design rules that apply to FEOL processing. These design rules may limit the area coverage density for each distinct material in the metal coupling structure. For example, if the metal coupling structure include substructures composed of the gate electrode metal, the gate electrode metal coverage density in the TSV landing area does not differ widely from the gate electrode metal coverage density in other areas of the chip. Likewise, if the metal coupling structure include substructures composed of the FEOL metal interconnect material, the FEOL metal interconnect material coverage density in the TSV landing area does not differ widely from the FEOL metal interconnect material coverage density in other areas of the chip.

Forming the metal coupling structure in accordance with FEOL design rules may include specifying an FEOL layout unit in accordance with those rules. The FEOL layout unit may include one or more semiconductor fins, one or more gate strips crossing the fins, one or more transistor-level wires running parallel to the gate strips and at a common height with the gate strips, and one or more wires connecting the gate-level wires to the gate strips. In some embodiments, the FEOL layout unit includes a plurality of each of those structures. In some embodiments, the TSV landing area is tiled with a two-dimensional array of the FEOL layout units. The TSV landing area may be surrounded by a guard ring formed with the same types of structures as those that make up an FEOL layout unit.

In some embodiments, the metal coupling structure includes substructures with dimension that correspond to structures providing distinct functionalities from the metal coupling structure elsewhere on the chip. In some embodiments, the metal coupling structure includes a substructure corresponding to a gate strip. The substructure may have an uppermost surface that is coplanar with an uppermost surface of the gate strip. The substructure may also have a lowermost surface that is coplanar with a lower most surface of the gate strip. In some embodiments, the transistor is a fin field-effect transistor (FinFET), and the substructure has a horizontal slab structure corresponding to a portion of the gate strip on top of the fin and vertical slab structures corresponding to portions of the gate strip on the sides of the fin.

In some embodiments, the metal coupling structure includes a substructure corresponding to an FEOL metal interconnect. The FEOL metal interconnect may comprise wires disposed in a common horizontal plane with the gate strips. In some embodiments, the FEOL metal interconnect comprises wires that extend above the gate strips and contact the tops of the gate strips. In some embodiments, FEOL metal interconnect comprises wires disposed between the gate strips. In some embodiments, the wires and the gate strips run crosswise to semiconductor fins and include peaks corresponding to areas on tops of the fins and valleys corresponding to areas between the fins. The substructure may have an uppermost surface that is coplanar with an uppermost surface of the FEOL metal interconnect. The substructure may also have a lowermost surface that is coplanar with a lower most surface of the FEOL metal interconnect.

In some embodiments, the metal coupling structure includes a plurality of distinct substructures. In some embodiments, some of these substructures have distinct compositions from others of these substructures. In some embodiments, some of these substructures are physically separated from the others. Forming the metal coupling structure from a plurality of distinct substructures facilitates meeting the FEOL process constraints while still providing sufficient area coverage to form a low resistance coupling between the TSV and the BEOL metal interconnect structure. In some embodiments, pluralities of the substructures form two-dimensional arrays in the TSV landing area.

In some embodiments, a bottom of the metal coupling structure provides incomplete coverage of the TSV landing area. When a hole for the TSV is etched by a process that is selective for removing non-metal material, the hole extends into gaps in and around the metal coupling structure so that the metal coupling structure protrudes into the hole. When the TSV is formed by filling the hole, the TSV has a notched end with notches corresponding to the protrusions. The notches are concavities in a front side end of the TSV. The protrusions intermesh with the notches. In some embodiments, the TSV lands in part on one or more dielectric structures. In some embodiments, the etching of the hole for the TSV stops at or before the tops of the gate strips. Accordingly, the TSV may be vertically spaced from the top of the metal coupling structure. In some embodiments, the etching of the hole for the TSV stops at or before etching reaches the top of the metal coupling structure. Accordingly, the TSV may be vertically spaced from the lowest wires in the BEOL metal interconnect.

In some embodiments, the etch for the hole in which the TSV is formed continues past the metal coupling structure in some locations. This may occur in a consistent manner, or sporadically due to process variability. In some embodiments, the etch proceeds to the point of exposing a wire in the BEOL metal interconnect structure so that when the TSV is formed it is in direct contact with the wire. The wires of the BEOL metal interconnect structure may thus provide a back stop for the metal coupling structure. The wires of the BEOL metal interconnect may be located so as to facilitate that functionality. For example, the wires in the lowest metallization layer may form a grid and the grid segments may be positioned so as to correspond to areas where the areal coverage density of the metal coupling structure is lowest.

FIG. 1A illustrates a cross-sectional view of an integrated circuit device 100 in accordance with some embodiments. The integrated circuit device 100 includes a semiconductor substrate 163 with a BEOL metal interconnect 101 over its front side 103. The BEOL metal interconnect 101 includes wires 143 arranged in a plurality of metallization layers M1, M2, M3 etc. interconnected by vias 145 and surrounded by a low-κ interlevel dielectric 141. A TSV 129 extends from the back side 107 of the semiconductor substrate 163 to the front side 103 and is separated from the semiconductor substrate 163 by a dielectric liner 157. The TSV 129 connects to a contact pad 165 on the back side 107. A solder ball 167 may be placed on the contact pad 165. On the front side 103, the TSV 129 lands on a metal coupling structure 125 through which the TSV 129 is coupled to the BEOL metal interconnect 101.

Figure 3:
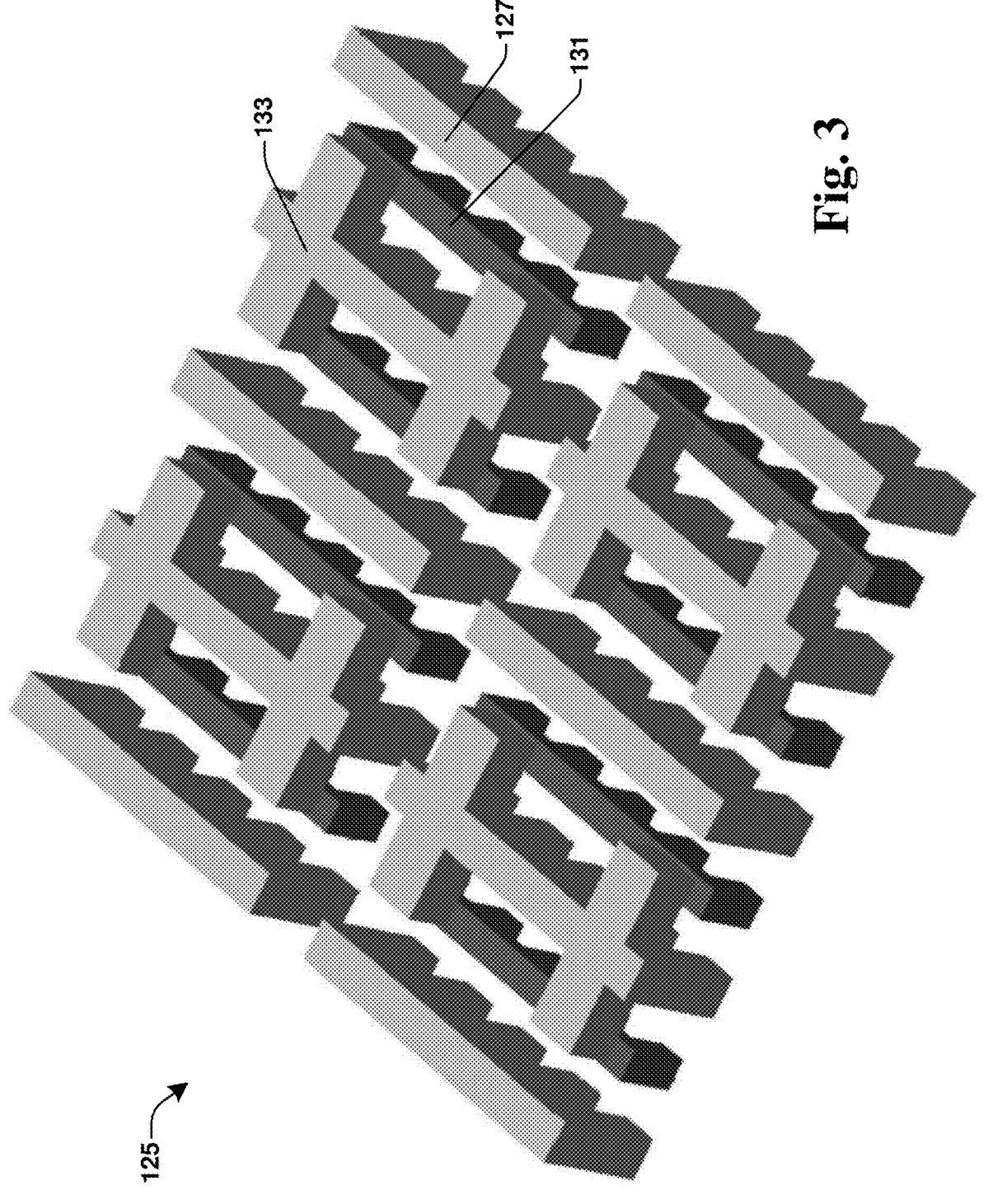
FIG. 3 illustrates a perspective view of a metal coupling structure according to some embodiments.

FIG. 3 illustrates a perspective view of the metal coupling structure 125 showing its top side. As can be seen in FIG. 3, the metal coupling structure 125 includes a plurality of distinct substructures some of which are physically separated from others, and each of which is arrayed. The substructures include M0 metal substructures 127 and 133, which are of a first metal, and electrode metal substructures 131 which are of a second metal, which is distinct from the first metal.

Returning to FIG. 1A, transistors 113 have channels in and metal electrodes 111 disposed over fins 161 at the front side 103. An M0 metallization layer (an FEOL metal interconnect) includes wires 115 that are lateral to the metal electrodes 111 and wires 109 that extend over the metal electrodes 111. The wires 115 contact source/drain regions 117 of the transistors 113. The wires 109 contact the metal electrodes 111 of the transistors 113. The wires 115 couple the source/drain regions 117 to the BEOL metal interconnect 101. The wires 109 couple the metal electrodes 111 to the BEOL metal interconnect 101. The transistors 113 that are shown in FIG. 1A may form parts of a guard ring that surrounds a landing area for the TSV 129.

The metal coupling structure 125 is at a height of the M0 metallization layer with respect to the front side 103 of the semiconductor substrate 163. The M0 metal substructures 127 and 133 have the same composition as the wires 109 and 115. The M0 metal substructures 127 and 133 have uppermost surfaces 118 that are coplanar with the uppermost surfaces 112 of the wires 109 and 115. These uppermost surfaces may be coplanar with the top of an interlevel dielectric layer 149 and the bottom of an etch stop layer 147. Vias 123 of the BEOL metal interconnect 101 land on the uppermost surfaces 118 and connect the metal coupling structure 125 to the BEOL metal interconnect 101.

Figure 2:
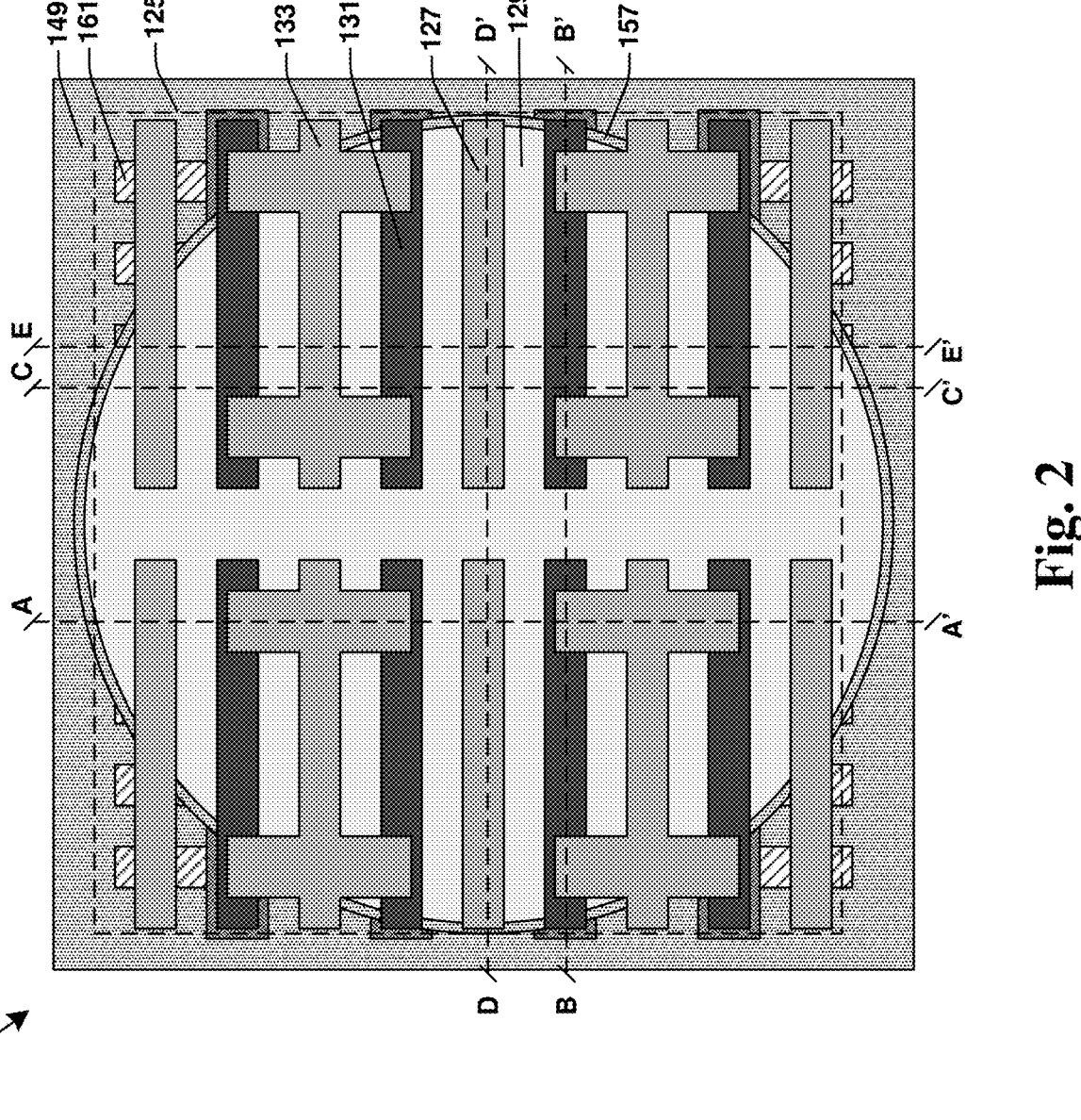
FIG. 2 illustrates a plan view of a TSV landing area including a metal coupling structure according to some embodiments.

FIG. 2 illustrates a plan view 200 of the integrated circuit device 100 of FIG. 1A focusing on the landing area of the TSV 129. The cross-section of FIG. 1A corresponds to the line A-A'. The M0 metal substructures 127 and 133 and the electrode metal substructures 131 were formed over fins 161. Although these fins 161 may have been etched away during formation of the TSV 129, remnants may remain around the edges of the TSV 129 as shown in FIG. 2.

Figure 1B:
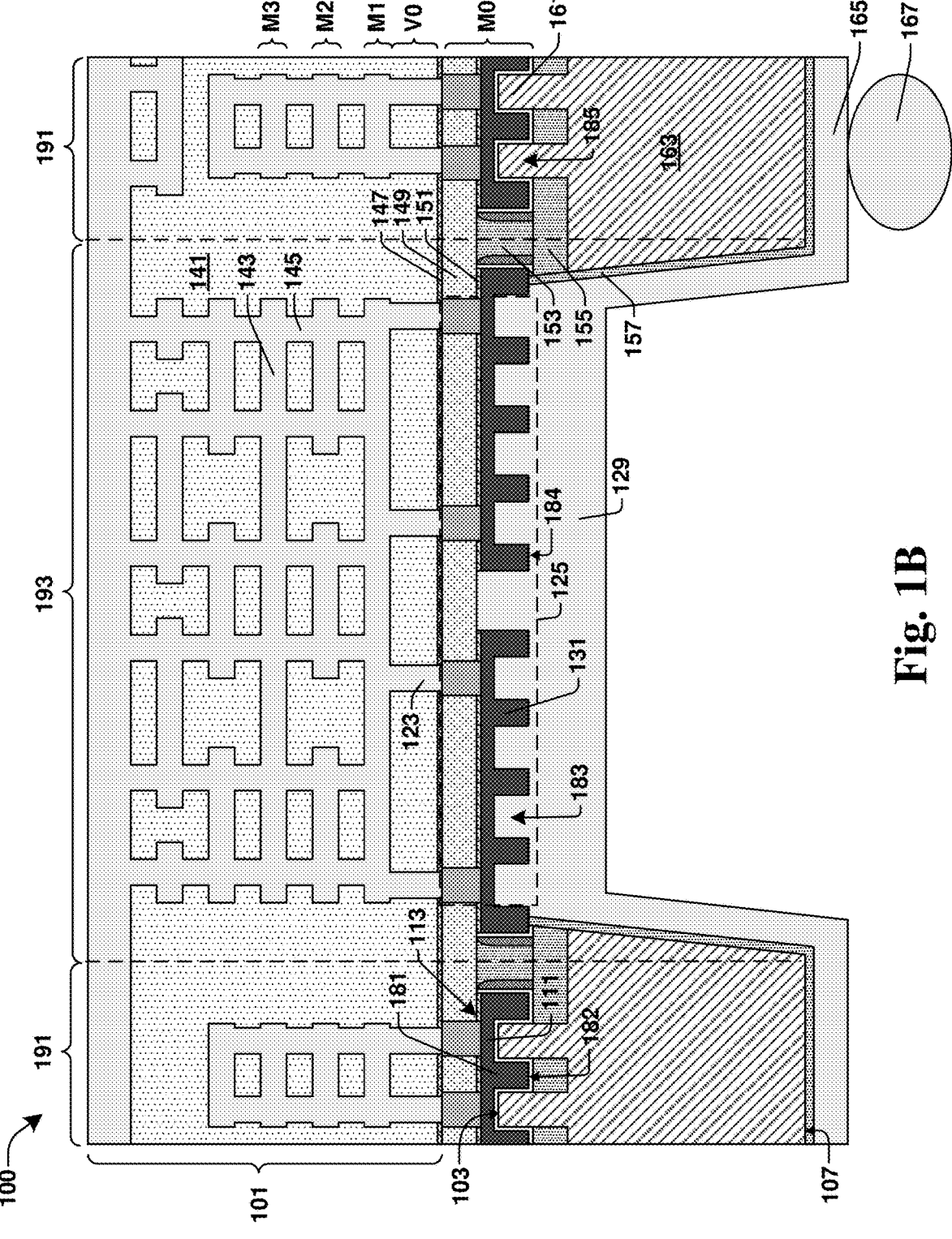

FIG. 1B illustrates another cross-sectional view of the integrated circuit device 100. The TSV landing zone 193 in the cross-section of FIG. 1B corresponds to the line B-B' of FIG. 2. FIG. 1B also include areas 191 which may be displaced from or in a different plane from the line B-B' of FIG. 2 but are shown next to the TSV landing zone 193 in FIG. 1B to emphasize the similarities between the structures in these different regions. As shown in FIG. 1B, the electrode metal substructures 131 are overlapping in height with the fins 161 and have notches 183 that correspond to notches 185 in gate strips 181. The notches 183 and 185 result from the electrode metal substructures 131 and the gate strips 181 both having been formed over fins 161. The bottommost surfaces 184 of the electrode metal substructures 131 may be at the same height relative to the front side 103 as the bottommost surfaces 182 of the gate strips 181 although there may be some variance due to erosion that occurs during a process of etching to form the TSV 129.

Figure 1C:
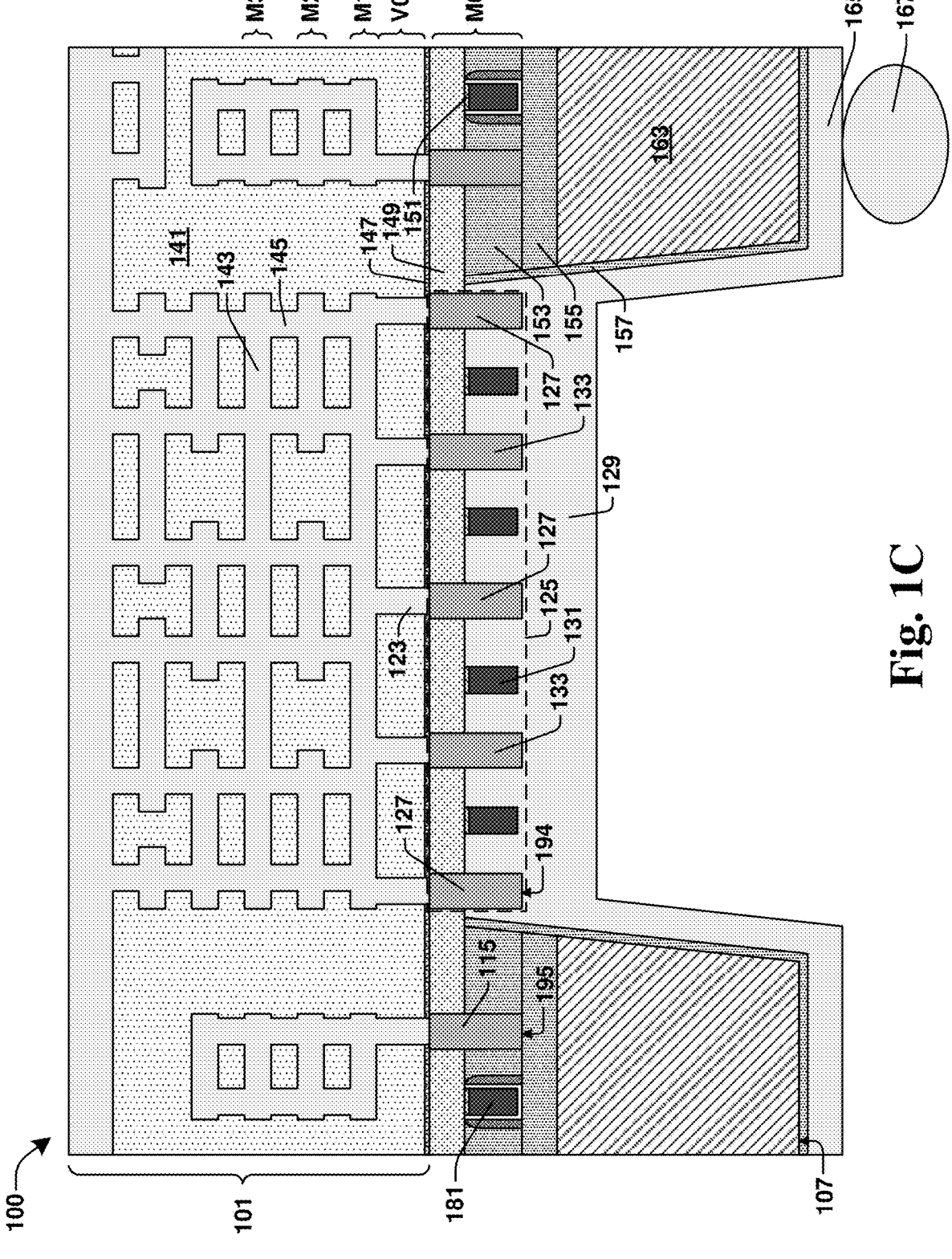

FIG. 1C illustrates another cross-sectional view of the integrated circuit device 100. The cross-section of FIG. 1C corresponds to the line C-C' of FIG. 2. As shown in FIG. 1C, the M0 metal substructures 127 and 133 are overlapping in height with the gate strips 181 and the electrode metal substructures 131 but extend higher than the gate strips 181 and the electrode metal substructures 131. The bottommost surfaces 194 of the M0 metal substructures 127 and 133 may be at the same height relative to the front side 103 as the bottom most surfaces 195 of the wires 115 although there may be some variance due to erosion that occurs during a process of etching to form the TSV 129.

Figure 1D:
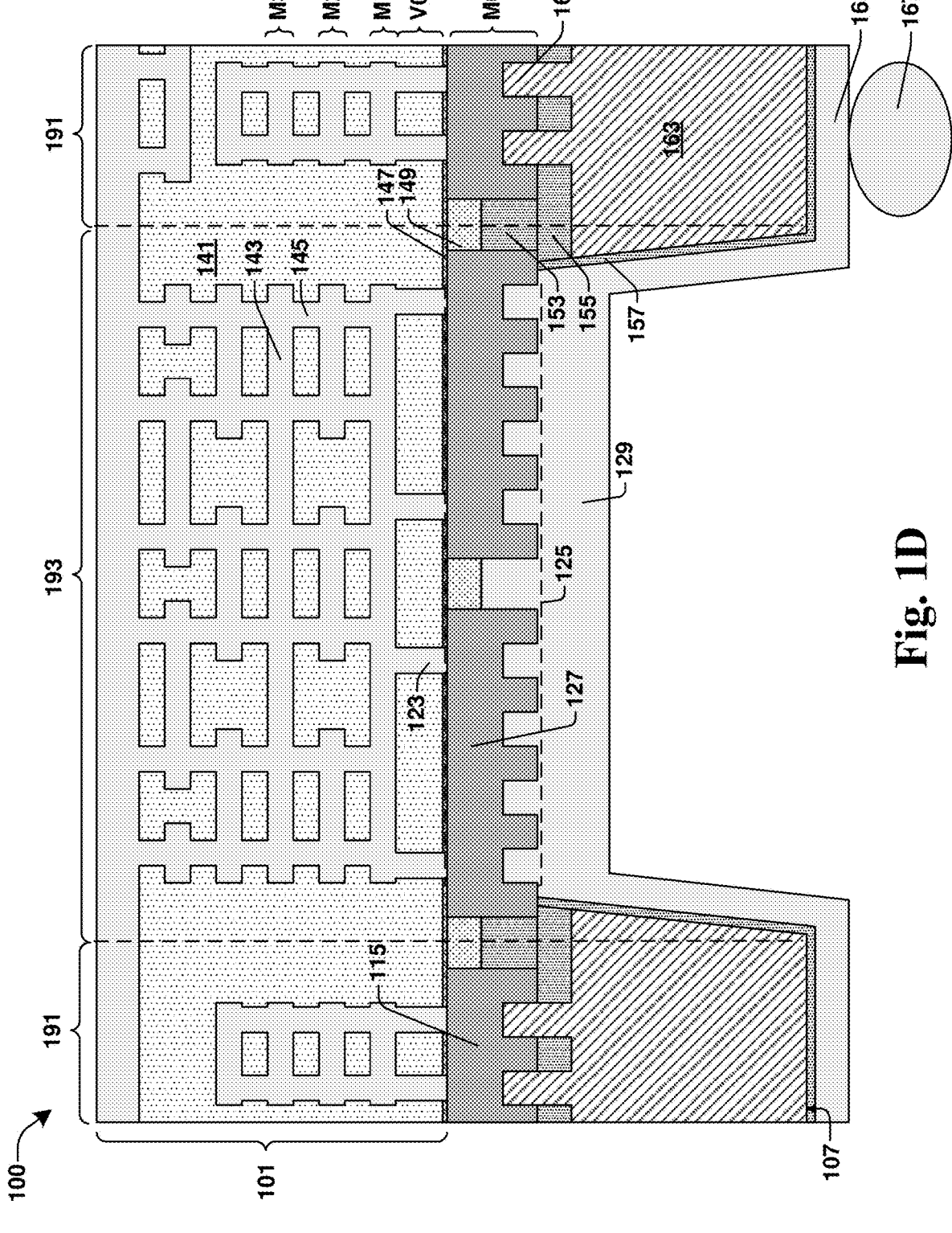
Figure 1E:
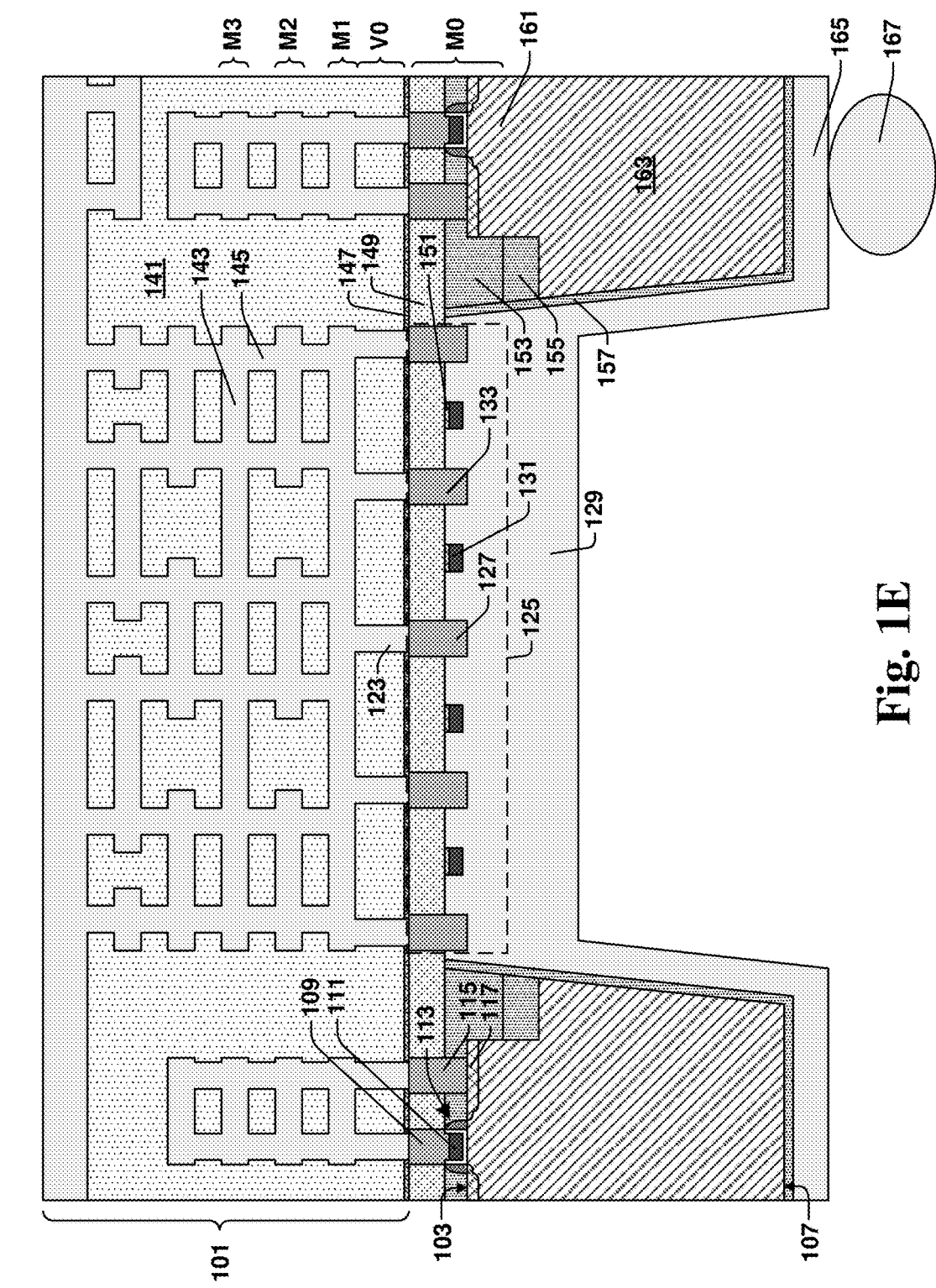

FIGS. 1D and 1E illustrate additional cross-sectional views of the integrated circuit device 100. The cross-section of FIG. 1D corresponds to the line D-D' of FIG. 2. The cross-section of FIG. 1E corresponds to the line E-E' of FIG. 2.

Figure 4:
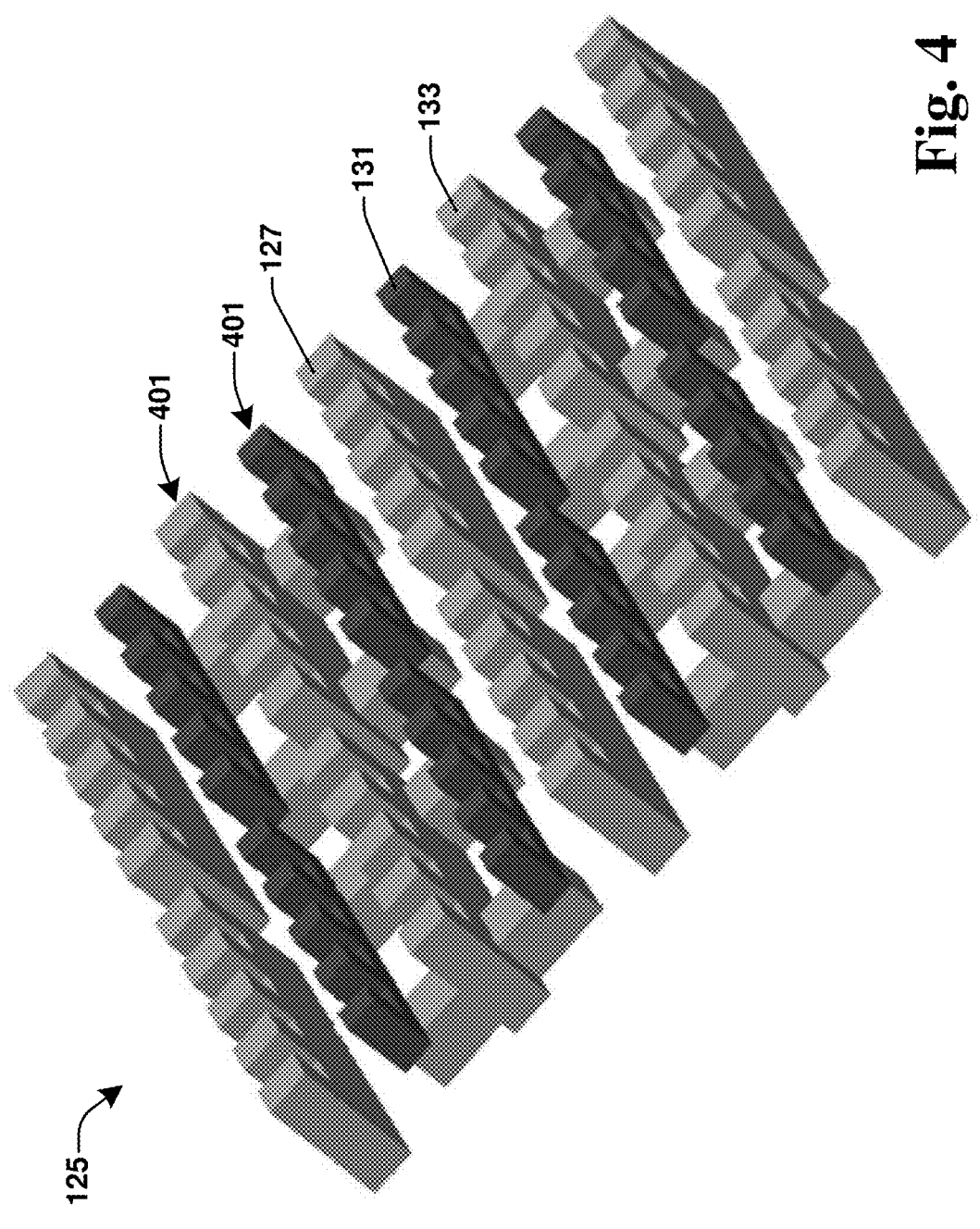
FIG. 4 illustrates another perspective view of the metal coupling structure of FIG. 3.
Figure 5:
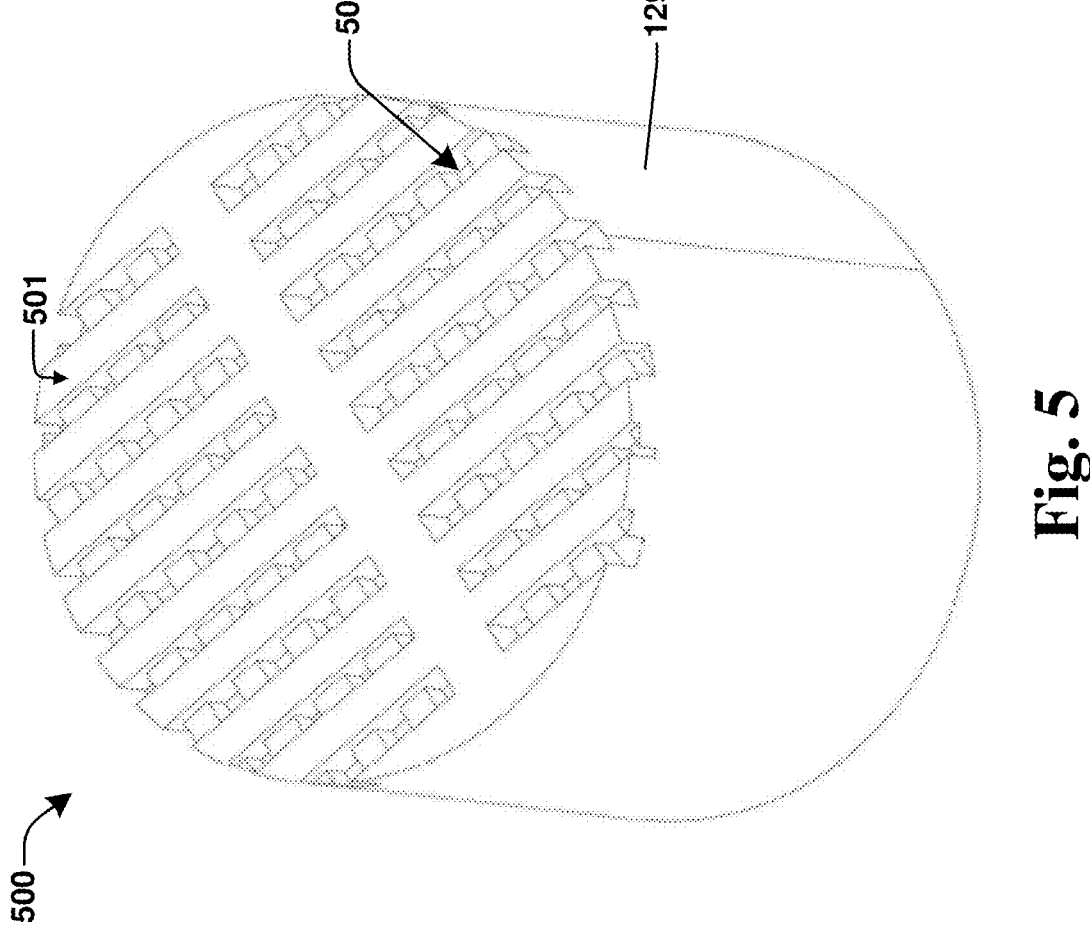
FIG. 5 illustrates a perspective view of the front end of a TSV according to some embodiments.

FIG. 4 illustrates another perspective view of the metal coupling structure 125, this one showing the bottom side. As can be seen in FIG. 4, the metal coupling structure 125 includes protrusions 401. When a hole is etched to form the TSV 129, the protrusions 401 are exposed at the bottom of the hole, which corresponds to the TSV landing area. FIG. 5 provides a perspective view 500 showing an upper portion of the TSV 129. As can be seen in the perspective view 500 of FIG. 5, the TSV 129 has a front end 501 with notches 503 that correspond to the protrusions 401 (see FIG. 4). The notches 503 mesh with the protrusions 401.

Figure 6:
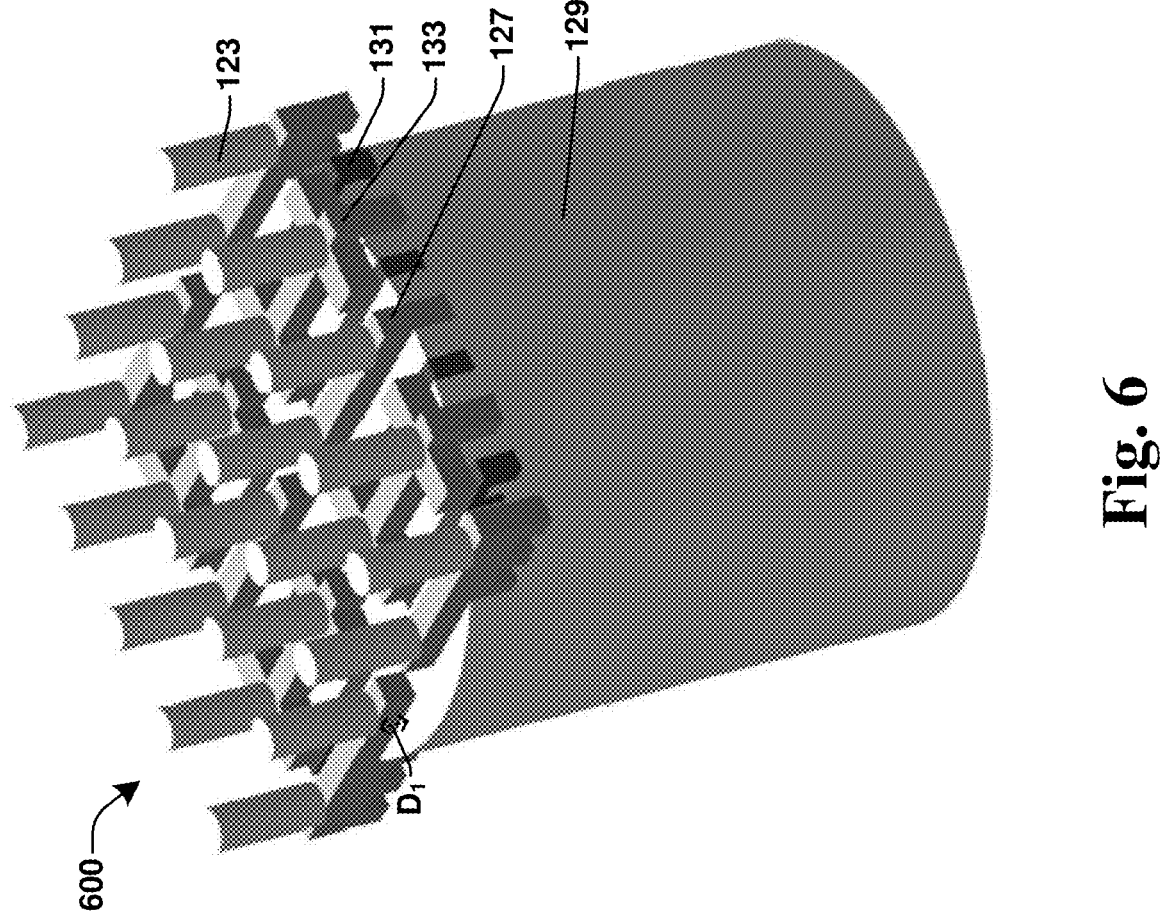
FIG. 6 illustrates a perspective view of a TSV connected to vias of a BEOL metal interconnect through an FEOL metal coupling structure in accordance with some embodiments.

FIG. 6 illustrates a perspective view 600 showing the TSV 129 together with the metal coupling structure 125 and the vias 123. As show by the perspective view 600, the metal coupling structure 125 is embedded within the TSV 129 and couples the TSV 129 to the vias 123. The TSV 129 may be a distance $D_1$ below the vias 123 (see also FIG. 1A). The distance $D_1$ and the degree of embedding may vary according to the depth of the etch used to form the TSV 129. With reference to FIG. 1A, the TSV 129 is shown stopping at the bottom of the interlevel dielectric layer 149 however, the TSV 129 may extend into the interlevel dielectric layer 149 or stop short of the interlevel dielectric layer 149 as long as the TSV 129 reaches the metal coupling structure 125.

Figure 7A:
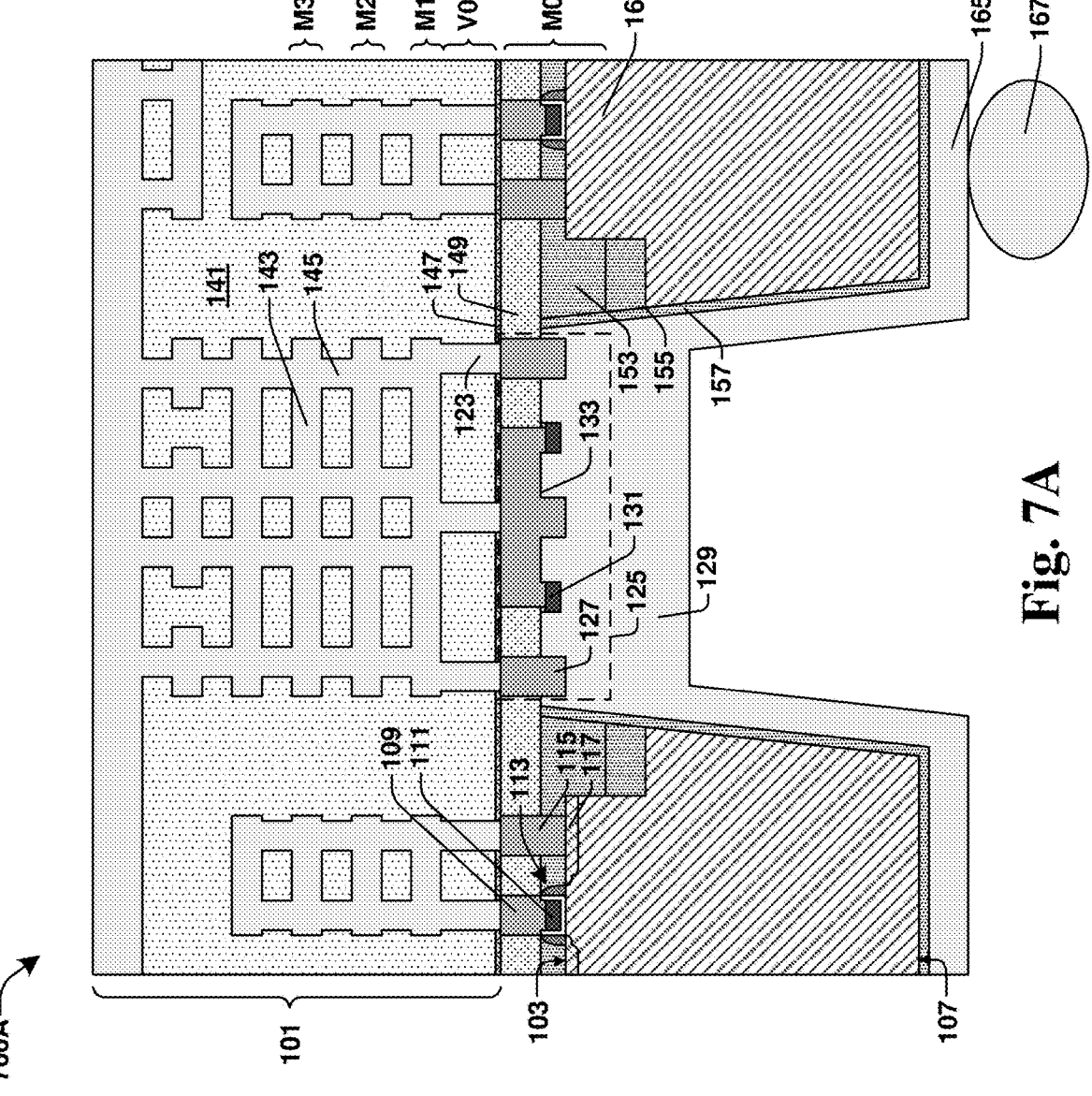
FIGS. 7A-E illustrate cross-sectional views and FIG. 7F illustrates a plan view for an integrated circuit (IC) device according to some other embodiments.
Figure 7B:
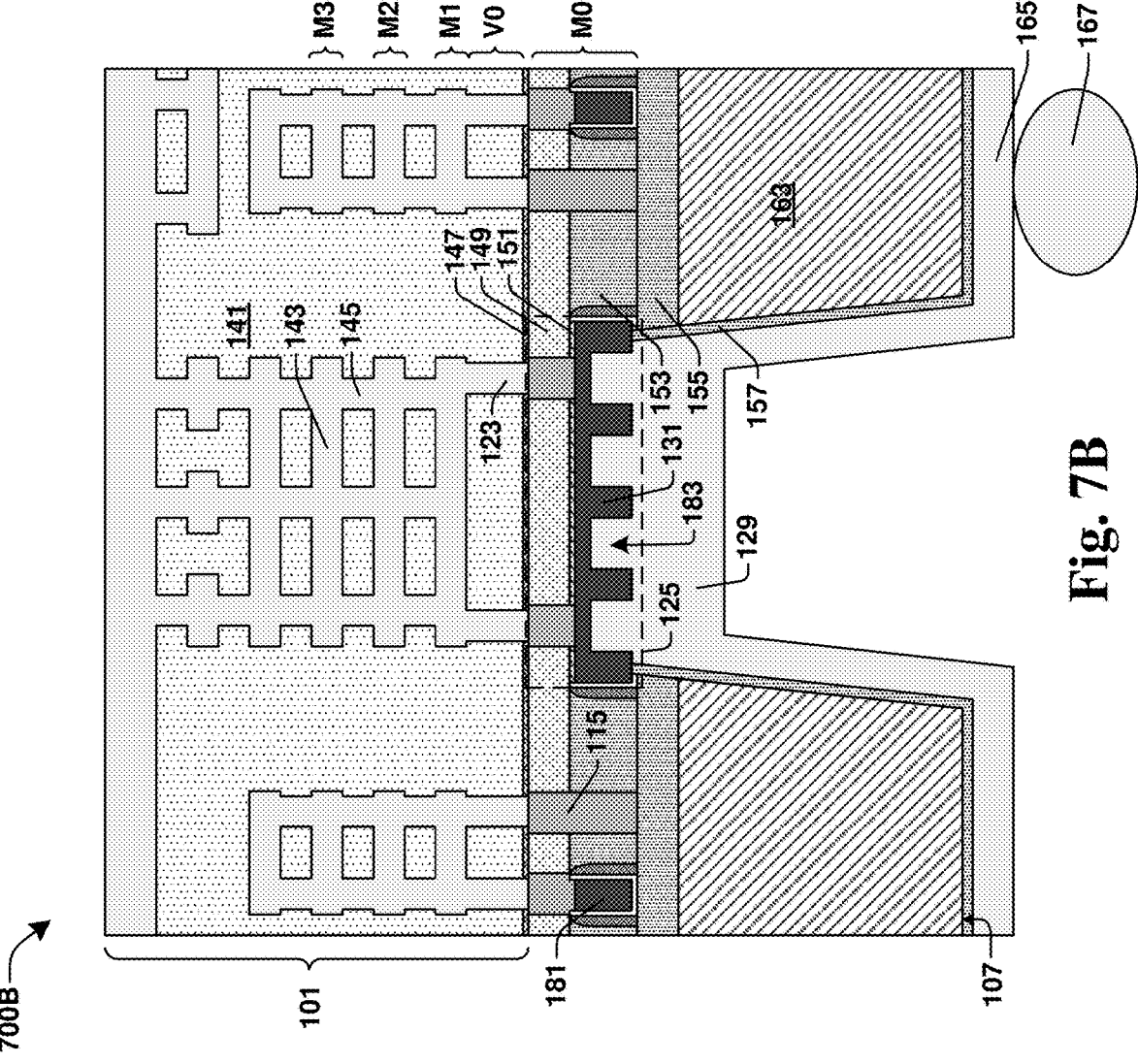
Figure 7C:
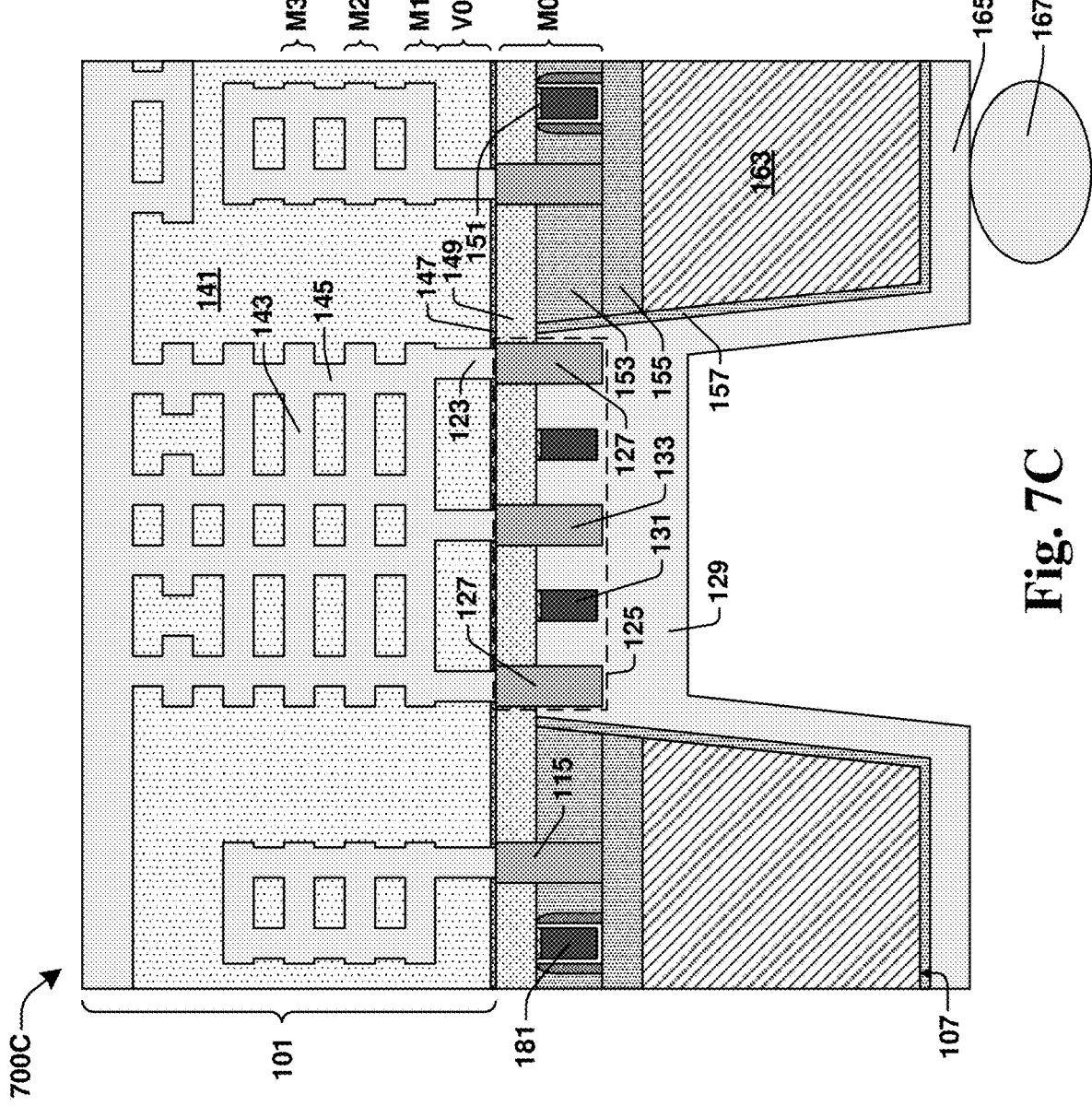
Figure 7D:
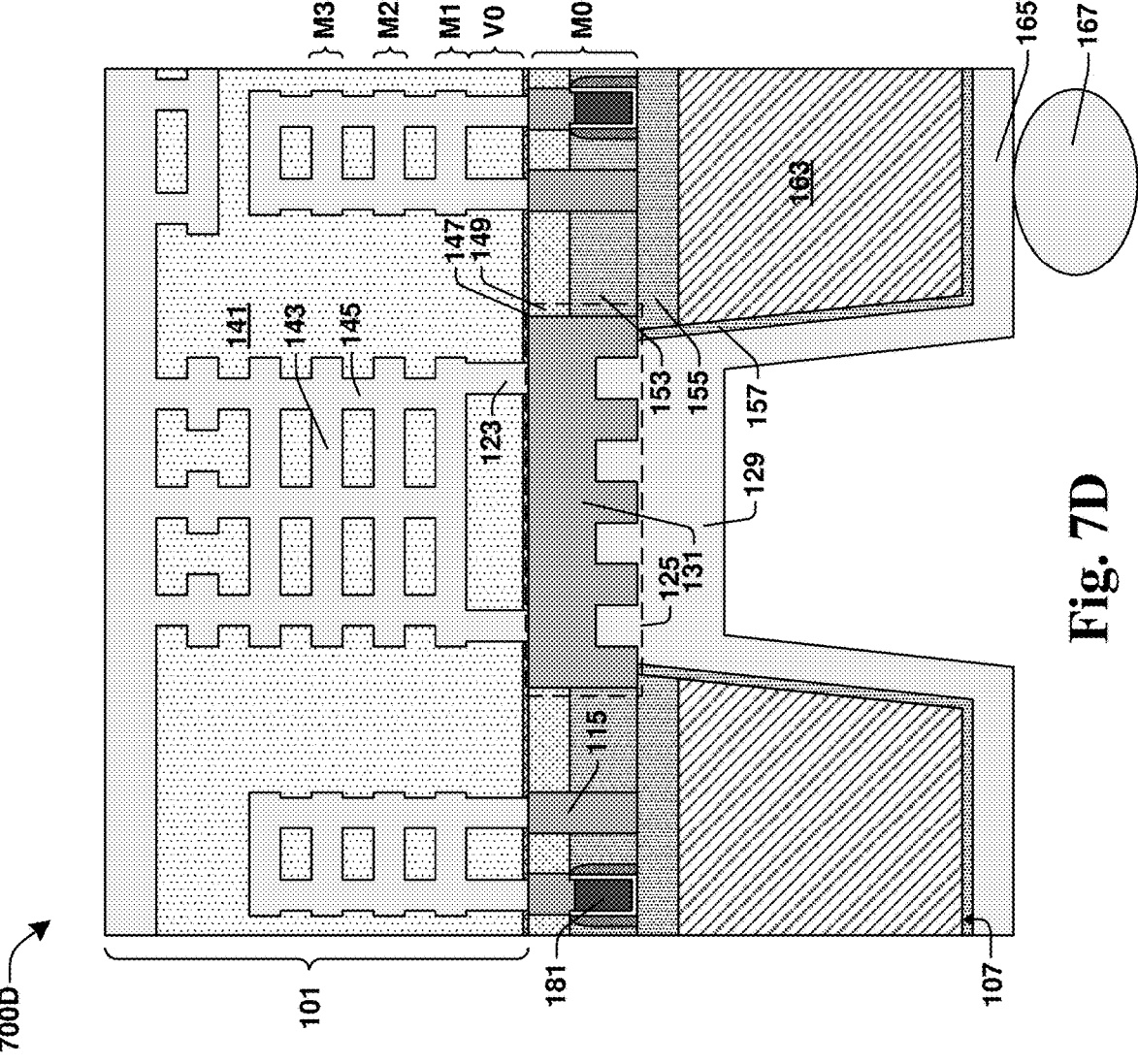
Figure 7E:
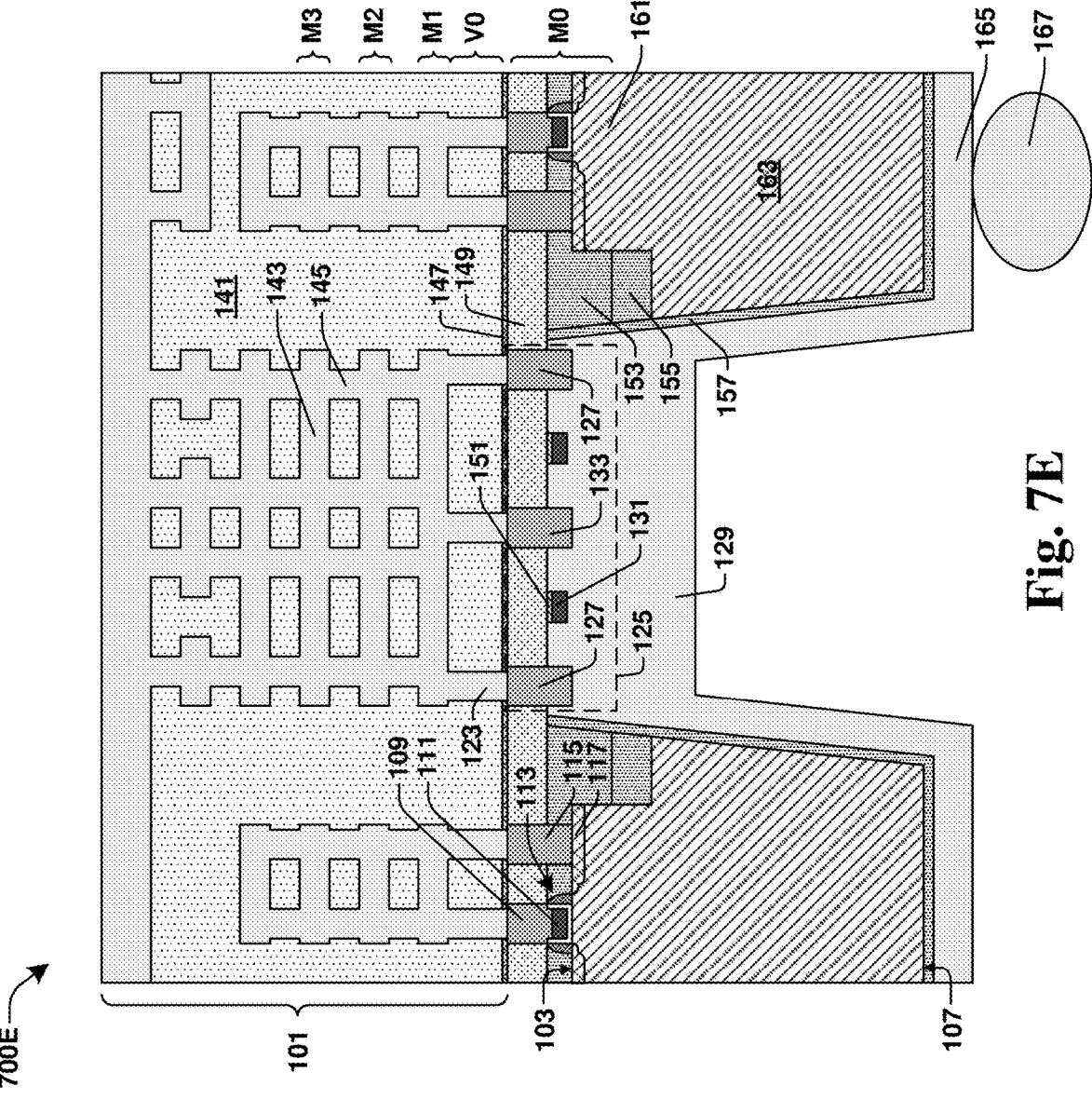
Figure 7F:
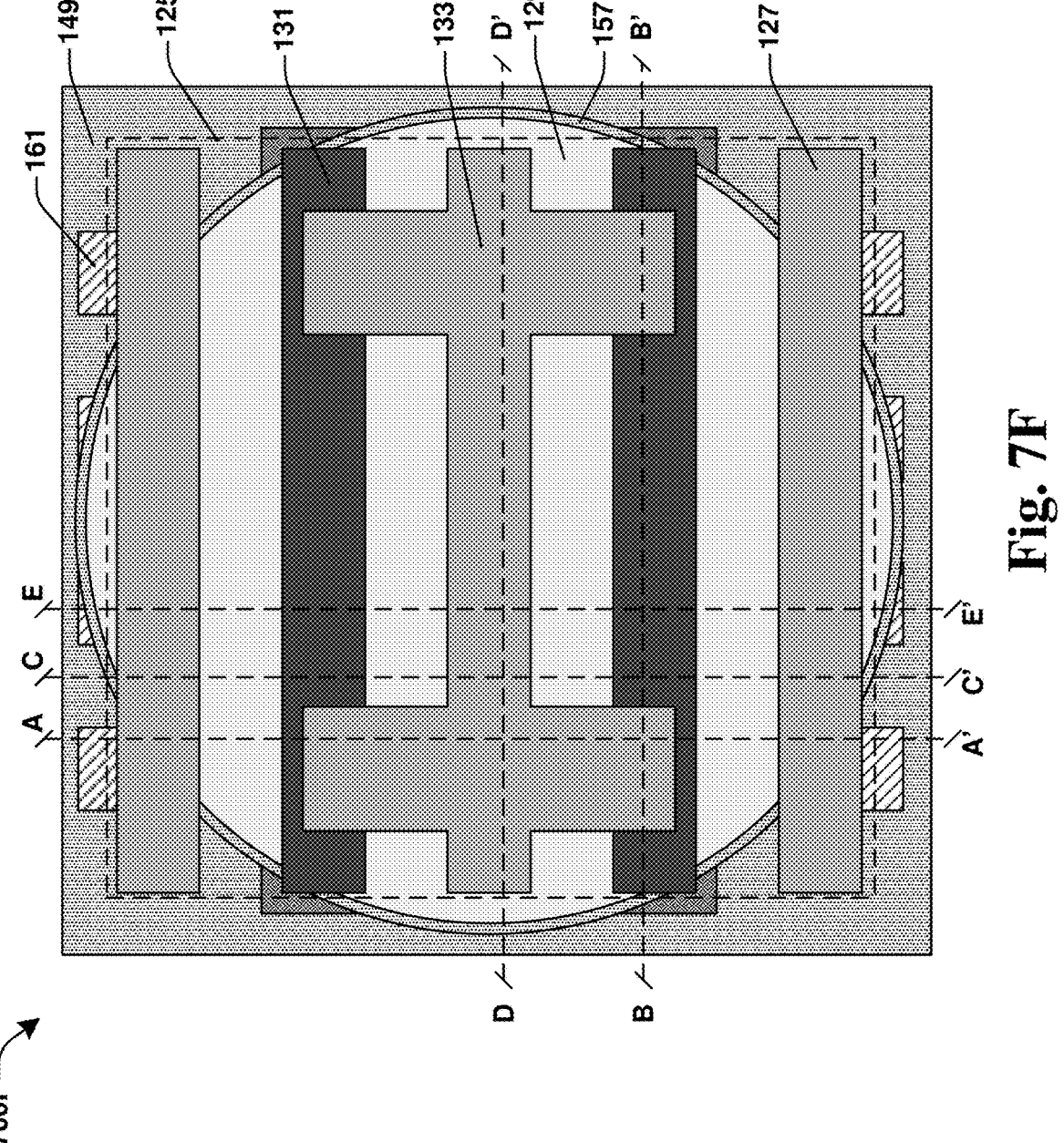

FIGS. 7A-E illustrate cross-sectional views 700A-E and FIG. 7F a plan view 700F of an integrated circuit device according to another embodiment. The cross-sectional view 700A of FIG. 7A corresponds to the line A-A' of FIG. 7F. The cross-sectional view 700B of FIG. 7B corresponds to the line B-B' of FIG. 7F. The cross-sectional view 700C of FIG. 7C corresponds to the line C-C' of FIG. 7F. The cross-sectional view 700D of FIG. 7D corresponds to the line D-D' of FIG. 7F. The cross-sectional view 700E of FIG. 7E corresponds to the line E-E' of FIG. 7F. In this embodiment, a single FEOL layout unit as shown in the plan view 700F of FIG. 7F covers the landing area of TSV 129.

Figure 8:
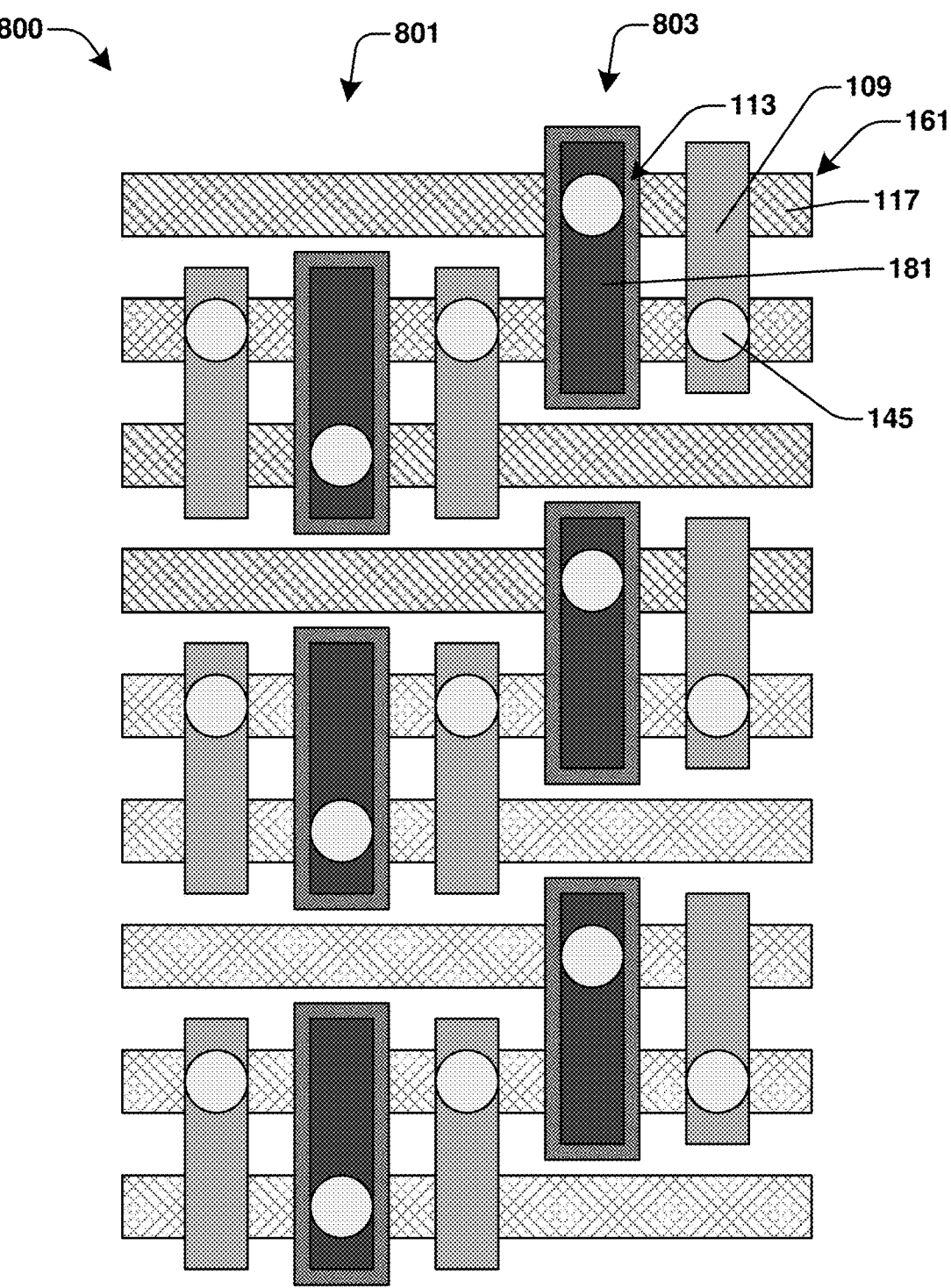
FIG. 8 illustrates a plan view of a guard ring structure according to some embodiments.

FIG. 8 illustrates a plan view showing a portion of a guard ring structure 800 that may surround the TSV landing area. The guard ring structure 800 includes an inner ring 801 and an outer ring 803 of transistors 113 that surround the TSV landing area. The transistors 113 in the guard ring structure 800 are diode connected. The transistors 113 in the inner ring 801 may be biased in an opposite direction from the transistors 113 in the outer ring 803.

Figure 9:
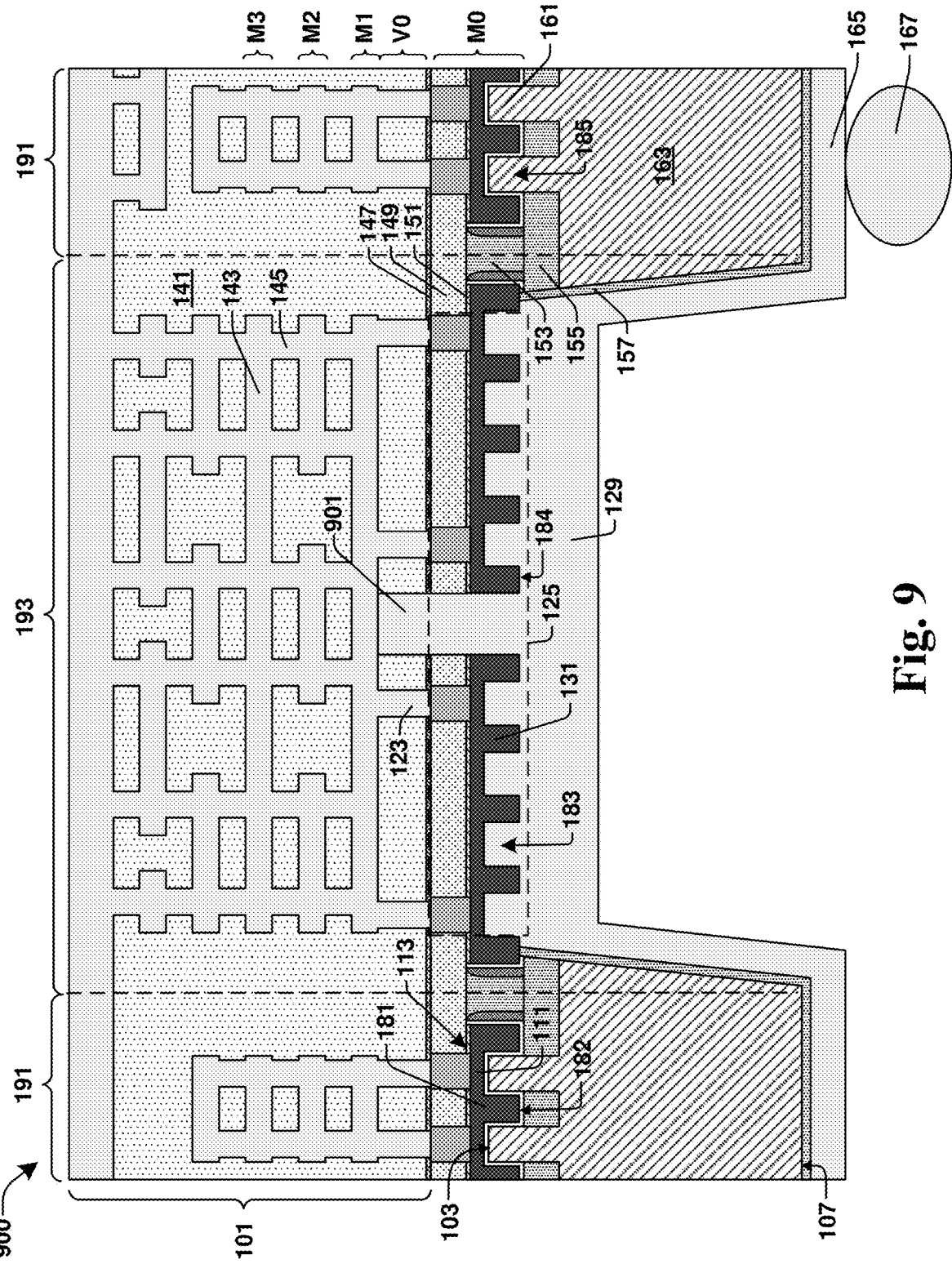
FIG. 9 illustrates a cross-sectional view of an integrated circuit (IC) device according to some other embodiments.

FIG. 9 illustrates a cross-sectional view 900 showing an alternate embodiment of the integrated circuit device 100. As shown by the cross-sectional view 900, the etch that forms that TSV 129 may extend past the metal coupling structure 125 to the point of exposing a wire 143 in the BEOL metal interconnect 101. The TSV 129 then forms with a protrusion 901 that directly contacts one of the wires 143. Thus, the TSV 129 may be coupled to the BEOL metal interconnect 101 both directly and through the metal coupling structure 125. The BEOL metal interconnect 101 may provide a back stop for the metal coupling structure 125.

Figure 10:
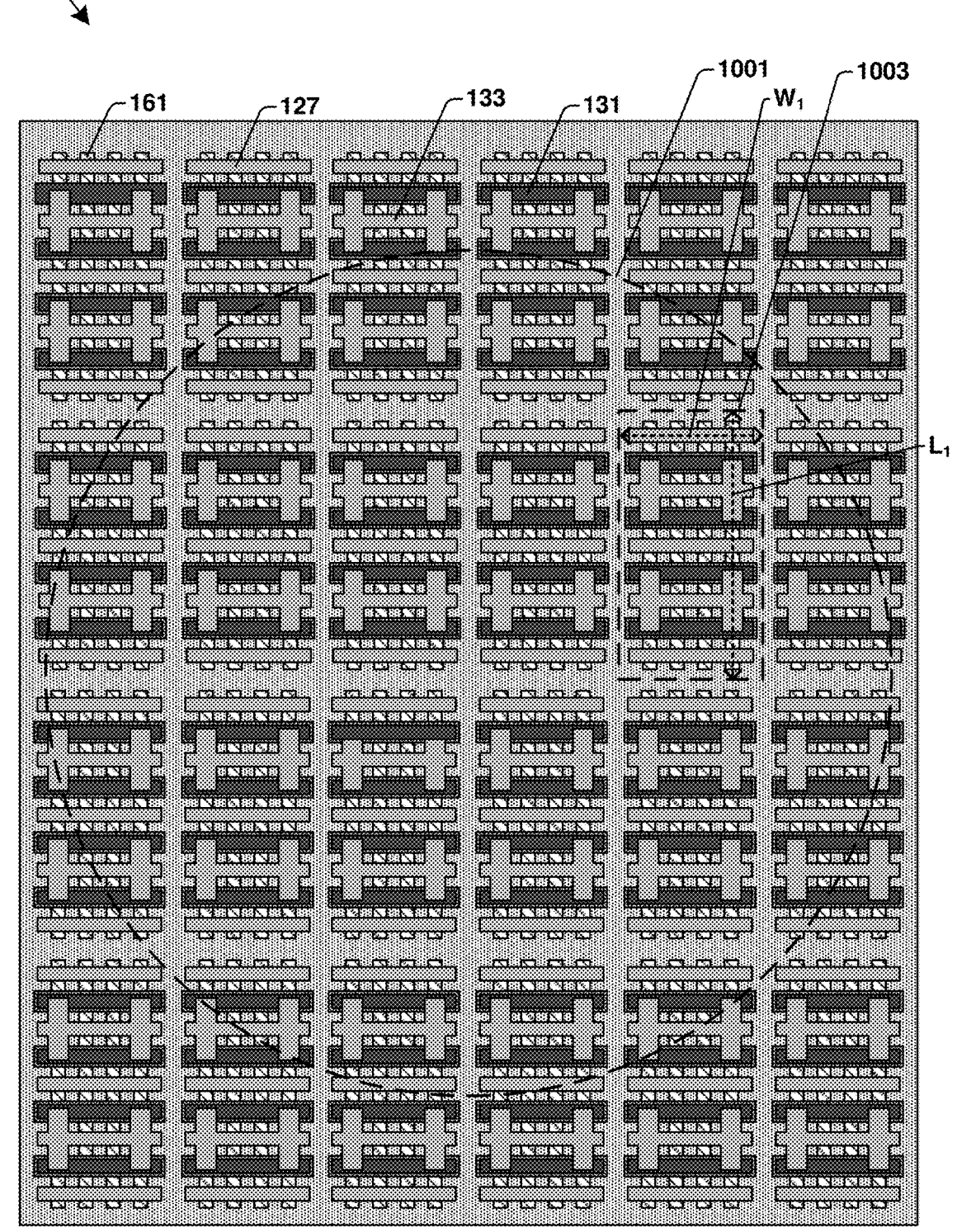
FIG. 10 illustrates a plan view of a TSV landing area in accordance with some embodiments.

FIG. 10 illustrates a plan view 1000 of a TSV landing area 1001 for the TSV 129 according to some embodiments. The TSV landing area 1001 is illustrated at the endpoint of FEOL processing. As shown in FIG. 10, the TSV landing area 1001 may be tiled with layout units 1003. In some embodiments, the TSV landing area 1001 has a width in the range from about 500 nm to about 5 μm. In some embodiments, the TSV landing area 1001 has a width in the range from about 1 μm to about 10 μm. In some embodiments, the TSV landing area 1001 has a width in the range from about 10 μm to about 100 μm. In some embodiments, the layout units 1003 have a length $L_1$ and a width $W_1$ each in the range from about 20 nm to about 5 μm. In some embodiments, the length $L_1$ and the width $W_1$ are each in the range from about 50 nm to about 500 nm. In some embodiments, one layout unit 1003 covers the TSV landing area 1001. In some embodiments, two to about 9 layout units 1003 cover the TSV landing area 1001. In some embodiments, there are greater than 9 layout units 1003 covering the TSV landing area 1001.

In some embodiments, the layout units 1003 each span four or more fins 161 or like structures. A like structure could include active device areas in strips separated by shallow trench isolation structures. In some embodiments, the layout units 1003 each span four or more electrode metal substructures 131 that have the form of gate strips. In some embodiments, the layout units 1003 each span eight or more fins 161 or like structures. In some embodiments, the layout units 1003 each span eight or more electrode metal substructures 131. In some embodiments, the layout units 1003 each span sixteen or more fins 161 or like structures. In some embodiments, the layout units 1003 each span sixteen or more electrode metal substructures 131. Having the layout units span many electrode metal substructures 131 or many fins 161 facilitates providing a high area density of metal while remaining within the constraints of FEOL process design rules.

The metal portions of the layout units 1003 which provide the metal coupling structure 125 (see, e.g., FIG. 1A) provide incomplete areal coverage of the TSV landing area 1001. As a consequence, the etch that forms the TSV 129, which is selective for removing non-metals, may create openings for the TSV 129 that extend past the metal coupling structure 125 as shown by the cross-sectional view 900 of FIG. 9. In some embodiments, the wires 143 of the M1 metallization layer are arranged so as to provide a back stop.

Figure 11:
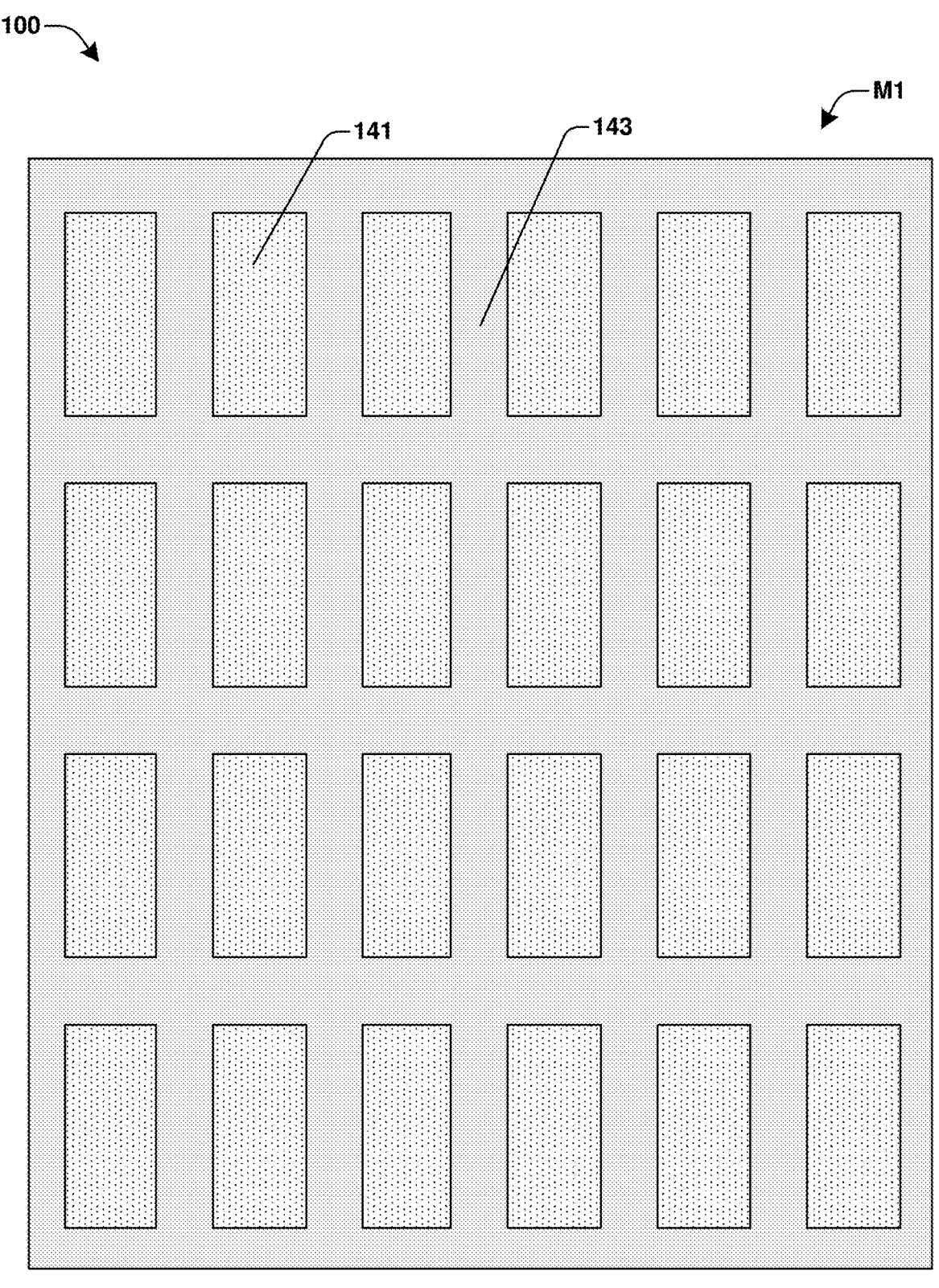
FIG. 11 illustrates a plan view of an M1 metallization layer in accordance with some embodiments.
Figure 12:
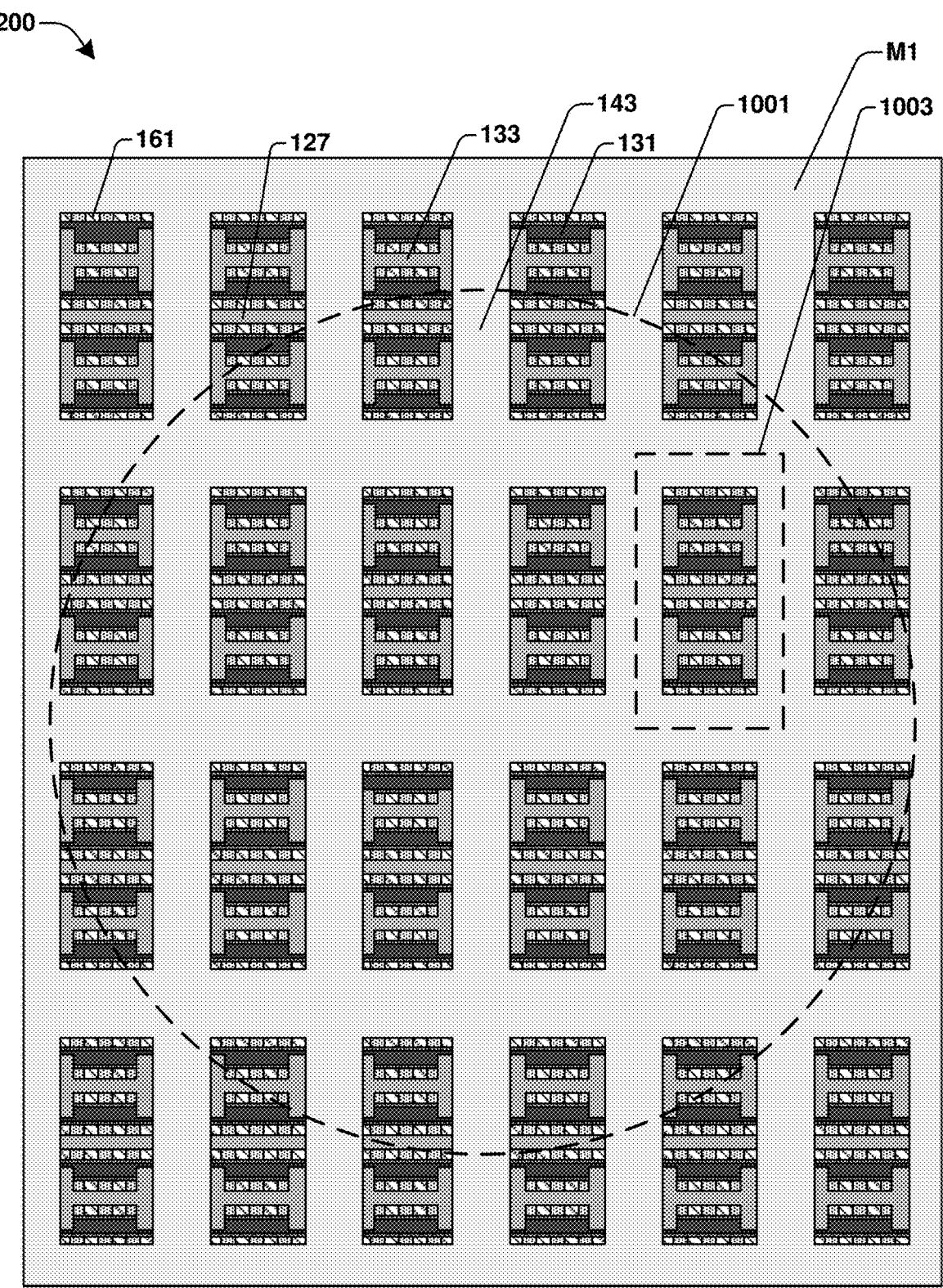
FIG. 12 illustrates the positioning of the M1 metallization layer of FIG. 11 over the TSV landing area of FIG. 10.
Figure 13A:
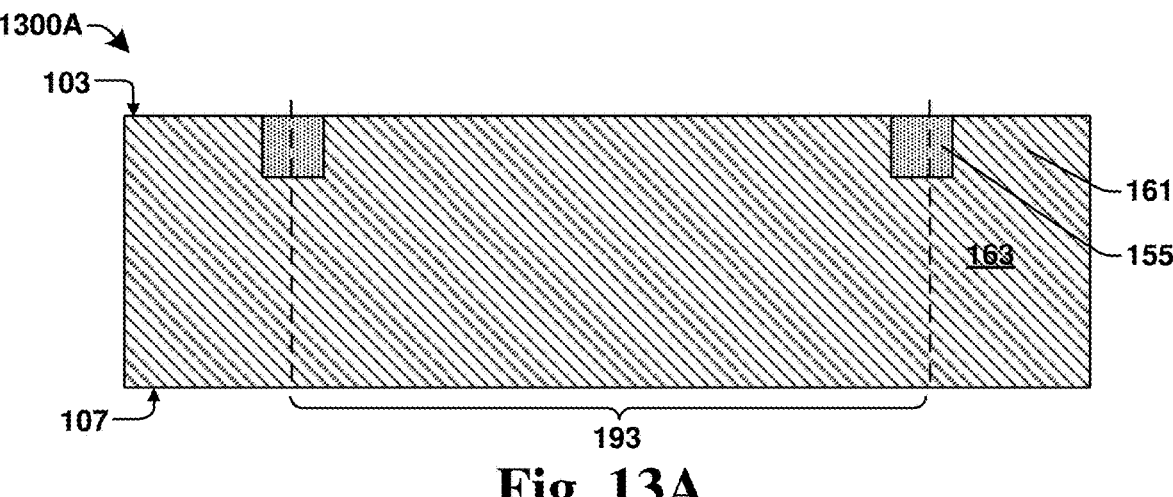
Figure 13B:
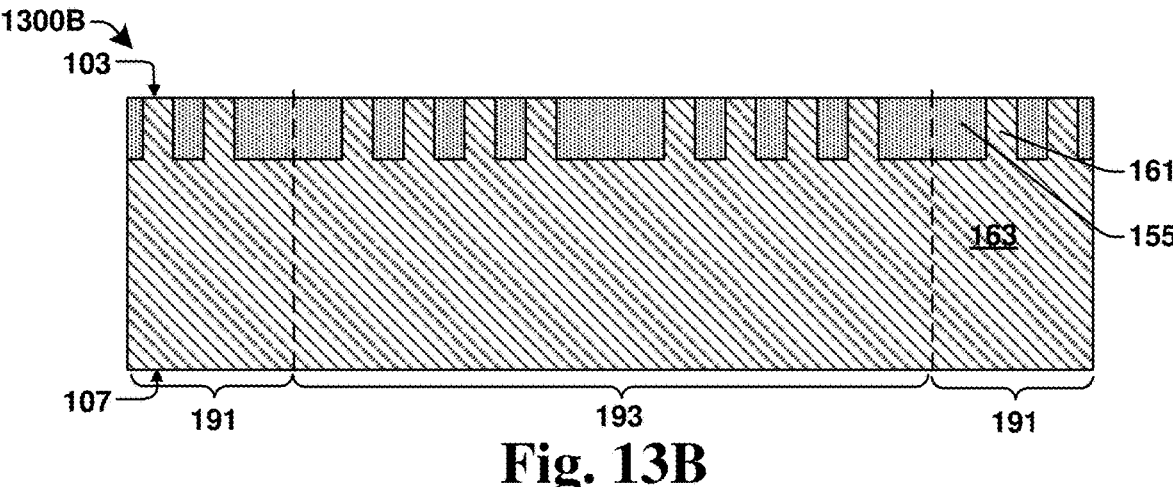
Figure 13C:
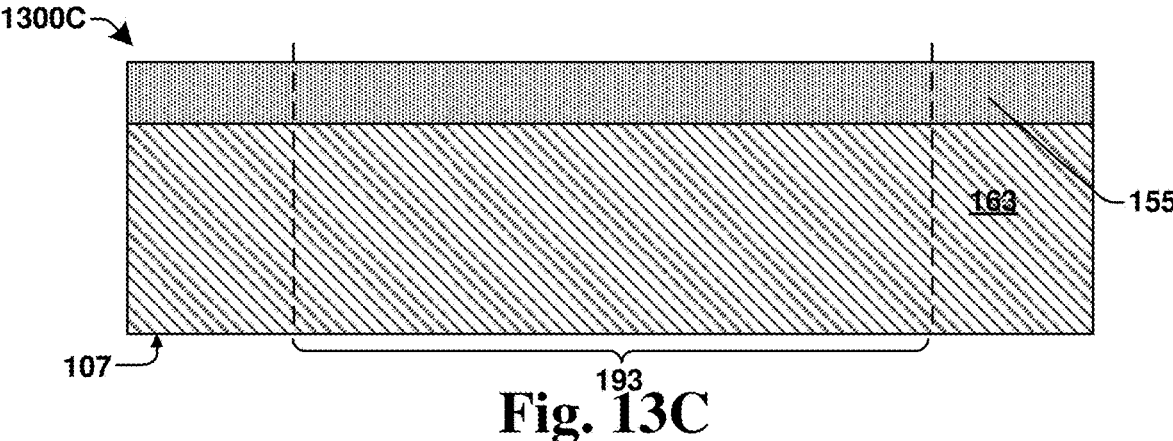
Figure 13D:
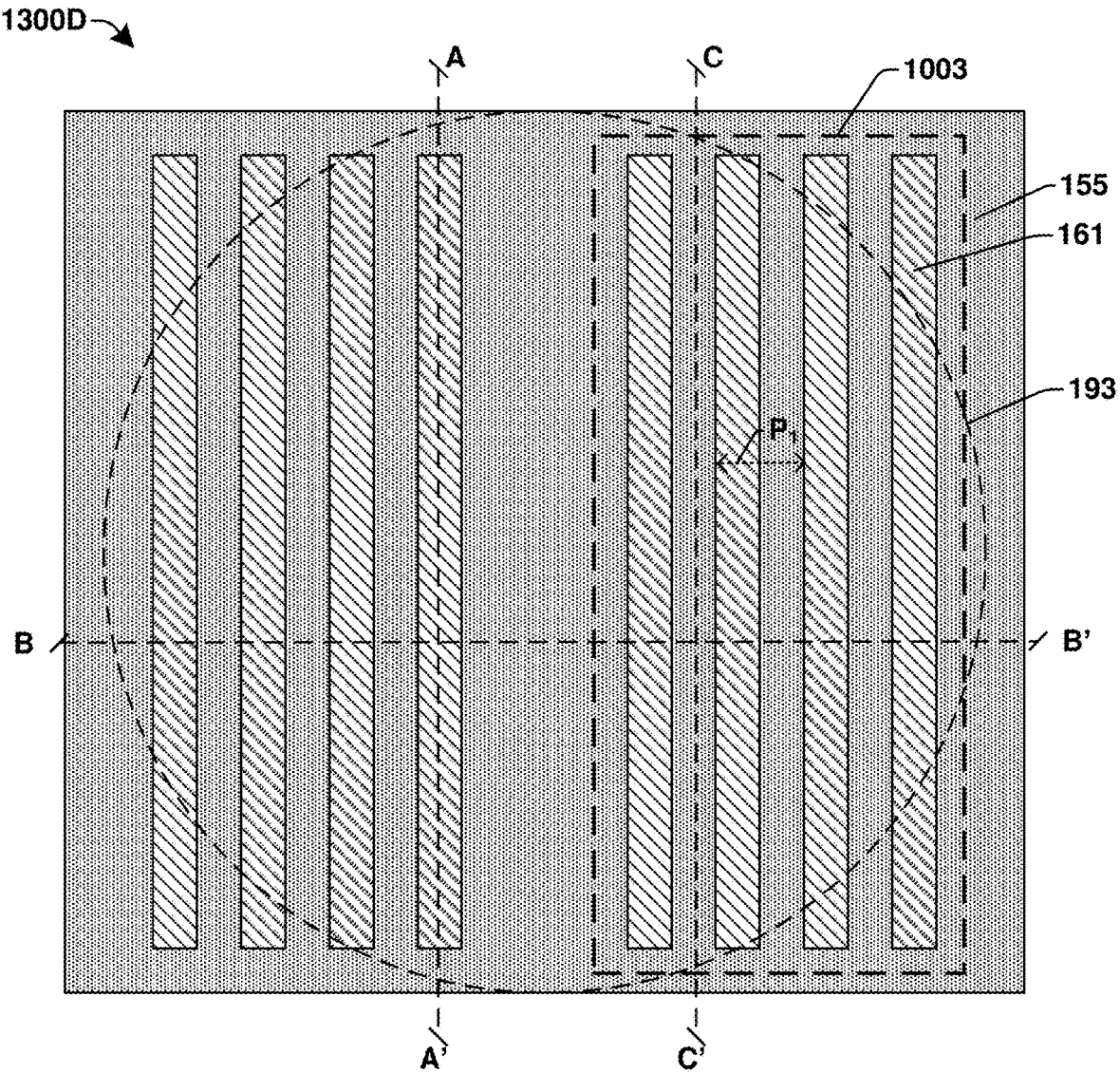

FIG. 11 illustrates a plan view 1100 of the M1 metallization layer in accordance with some embodiments. As shown by the plan view 1100, the M1 metallization layer may include a grid of wires 143. The grid structure may provide a high density of wires 143. The locations of the wires 143 in the grid may be selected to correspond with portions of the TSV landing area 1001 (see FIG. 10) in which the layout units 1003 provide the lowest areal density of metal. The plan view 1200 of FIG. 12 provides an example. As shown in the plan view 1200, in some embodiments the lowest areal density of metal corresponds to the areas between layout units 1003 and the wires 143 may be horizontally aligned to the areas between layout units 1003. The wires 143 of the M2 and M3 metallization layers may be arranged to supplement the metal coupling structure 125 and the wires 143 of the M1 metallization layer so as to provide as much as 100% areal coverage with metal of the TSV landing area 1001.

In some embodiments, the areal coverage with metal of the TSV landing area 1001 provided by the metal coupling structure 125 is in the range from about 5% to about 95%. In some embodiments, the areal coverage with metal of the TSV landing area 1001 provided by the metal coupling structure 125 is in the range from about 25% to about 90%. In some embodiments, the areal coverage with metal of the TSV landing area 1001 provided by the metal coupling structure 125 is in the range from about 40% to about 75%. A higher areal coverage is desirable, but the actual areal coverage may be limited by FEOL design rules.

FIGS. 13A-32C provide a series of cross-sectional and plan views that illustrate an integrated circuit device according to the present disclosure at various stages of manufacture according to a process of the present disclosure. Although FIGS. 13A-32C are described in relation to a series of acts, it will be appreciated that the order of the acts may in some cases be altered and that this series of acts are applicable to structures other than the ones illustrated. In some embodiments, some of these acts may be omitted in whole or in part. Furthermore, while FIGS. 13A-32C are described in relation to a series of acts, it will be appreciated that the structures shown in FIGS. 13A-32C are not limited to a method of manufacture but rather may stand alone as structures separate from the method.

As shown by the cross-sectional views 1300A-C and the plan view 1300D of FIGS. 13A-13D, the method begins by providing a semiconductor substrate 163 having fins 161 at the front side 103. An isolation dielectric 155 fill gaps between and around the fins 161. The semiconductor substrate 163 may be a semiconductor body of a semiconductor on insulator (SOI) substrate. At least an upper portion of the semiconductor substrate 163 including the fins 161 is a semiconductor body. The semiconductor body may include one or more semiconductors such as silicon (Si), a group III-V (e.g., GaAs) or some other binary semiconductor, a tertiary semiconductor (e.g., AlGaAs), a higher order semiconductor, the like, or any other suitable semiconductor. In some embodiments, the semiconductor body comprises silicon (Si) or the like. The isolation dielectric 155 may be any suitable dielectric. In some embodiments, the isolation dielectric 155 is or comprises an oxide. In some embodiments, the isolation dielectric 155 is or comprises silicon dioxide ($SiO_2$).

The fins 161 may be epitaxially grown on the semiconductor body. In some embodiments, the fins 161 have widths in the range from about 2 nm to about 100 nm. In some embodiments, the fins 161 have widths in the range from about 3 nm to about 20 nm. The pitch P1 of the fins 161 in each layout unit 1003 may be about two times the width.

The plan view 1300D, and similar plan views in subsequent illustrations, focus on the TSV landing zone 193. The cross-sectional view 1300A, and similar cross-sectional views in subsequent illustrations, goes through a fin 161 in the TSV landing zone 193 as indicated by the line A-A' in FIG. 13D. The cross-sectional view 1300B runs crossways to the fins 161 in the TSV landing zone 193 as indicated by the line B-B'. The cross-sectional view 1300B runs between the fins 161 in the TSV landing zone 193 as indicated by the line C-C'.

Figure 14A:
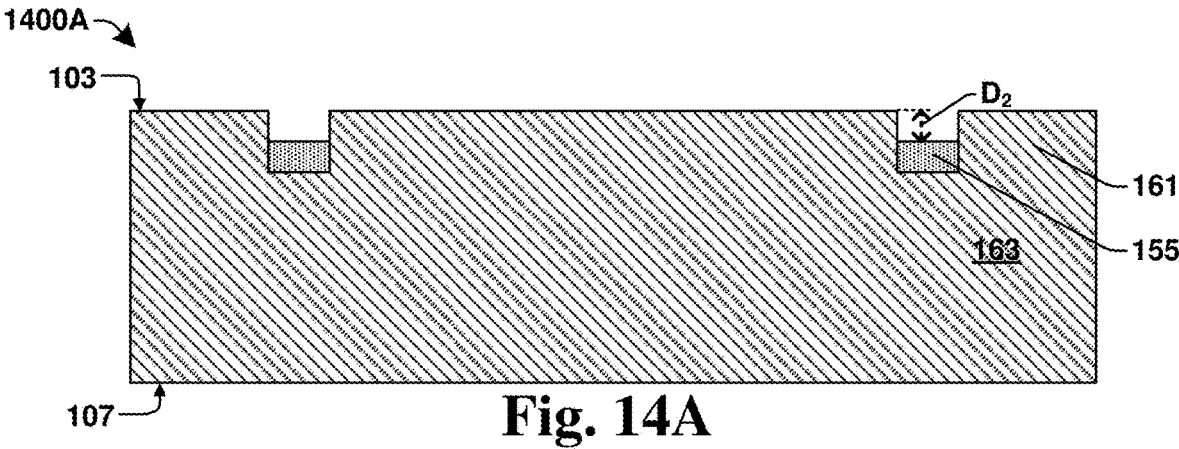
Figure 14B:
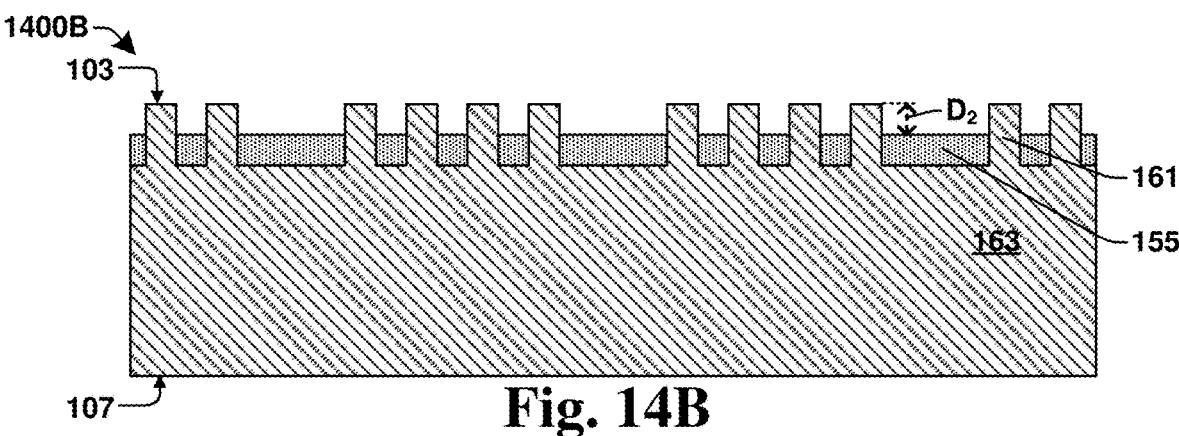
Figure 14C:
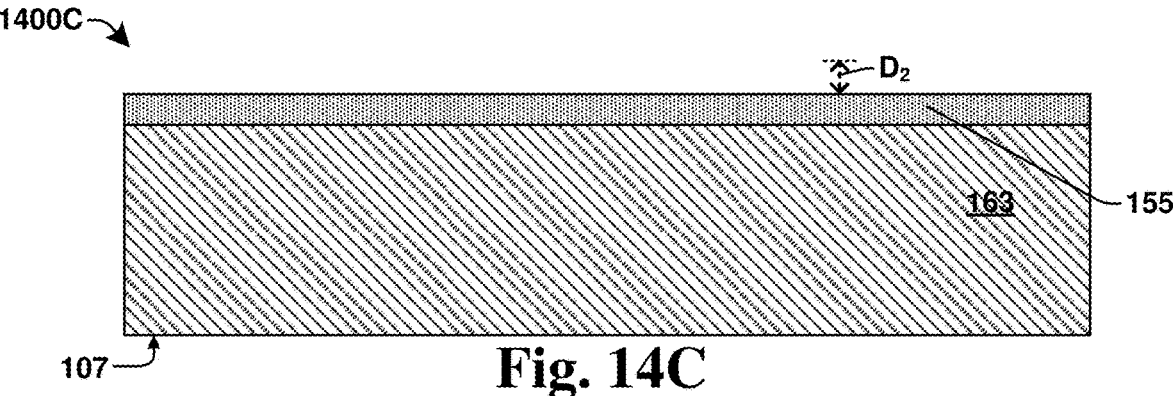

As shown by the cross-sectional views 1400A-C of FIGS. 14A-14C, an etch may be performed to recess the isolation dielectric 155 so that the fins 161 protrude. The etch may be a wet etch or a dry etch. In some embodiments, the recess depth $D_2$, which is the height of the fins above the isolation dielectric 155, is from about 1 to about 5 times the width of the fins 161. In some embodiments, the recess depth $D_2$ is from about 2 to about 4 times the width of the fins 161.

Figure 15A:
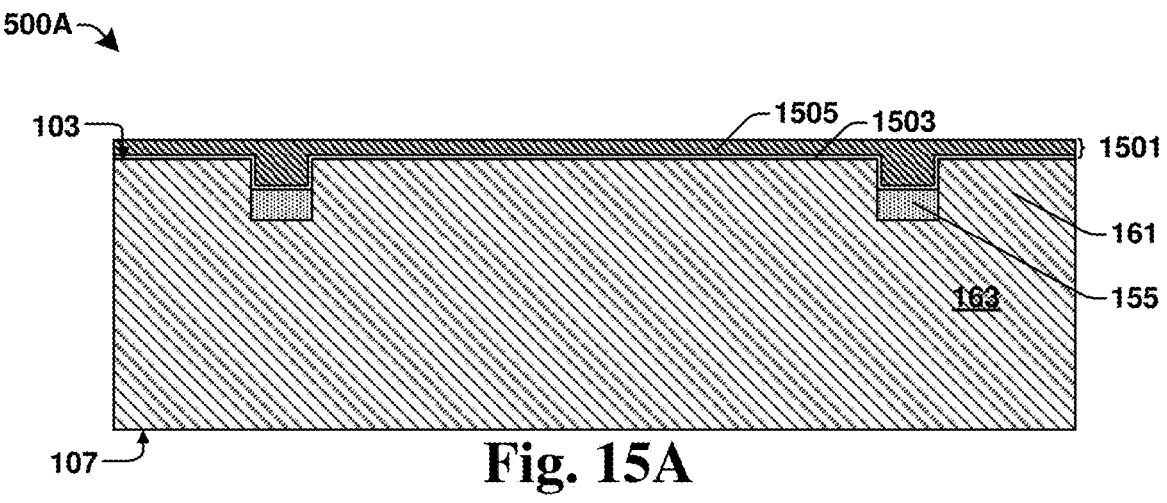
Figure 15B:
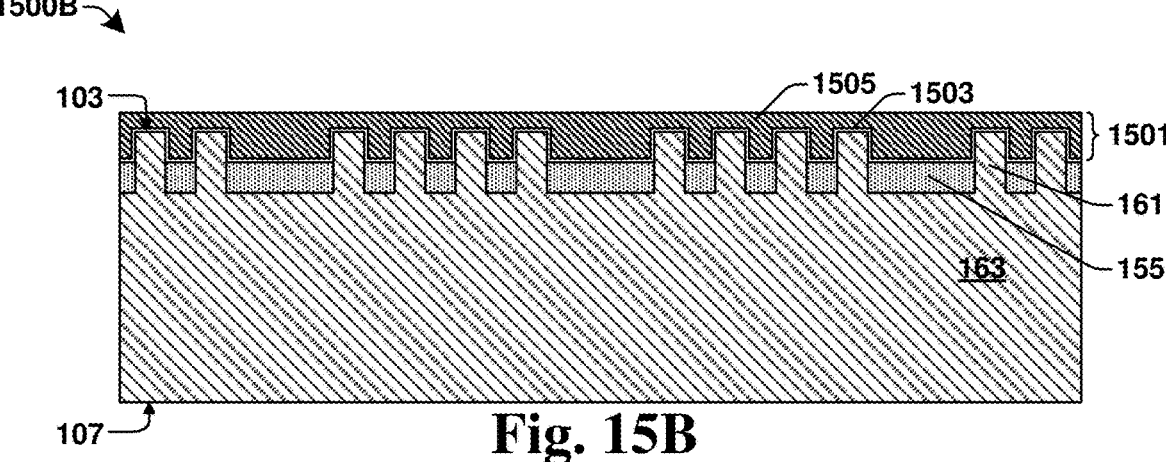
Figure 15C:
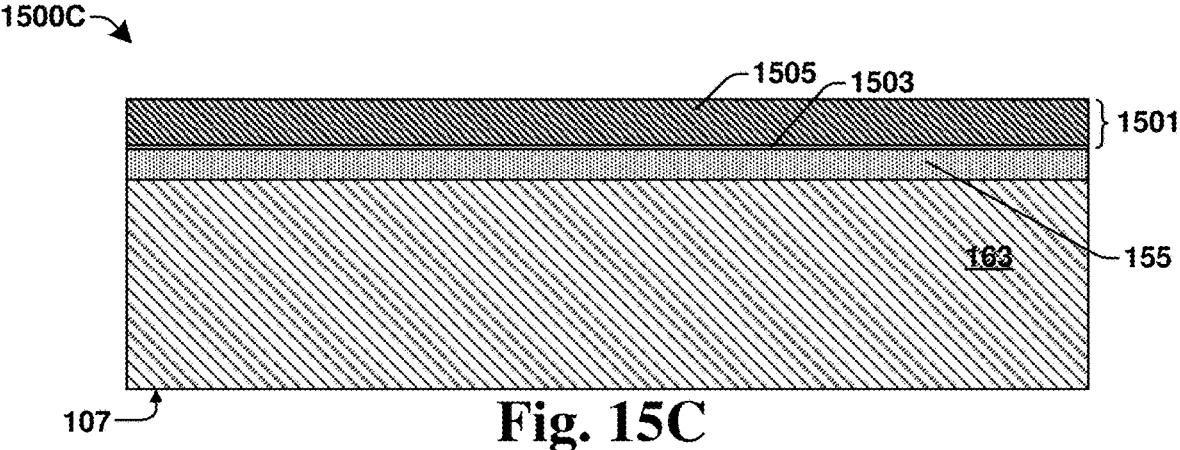
Figure 16A:
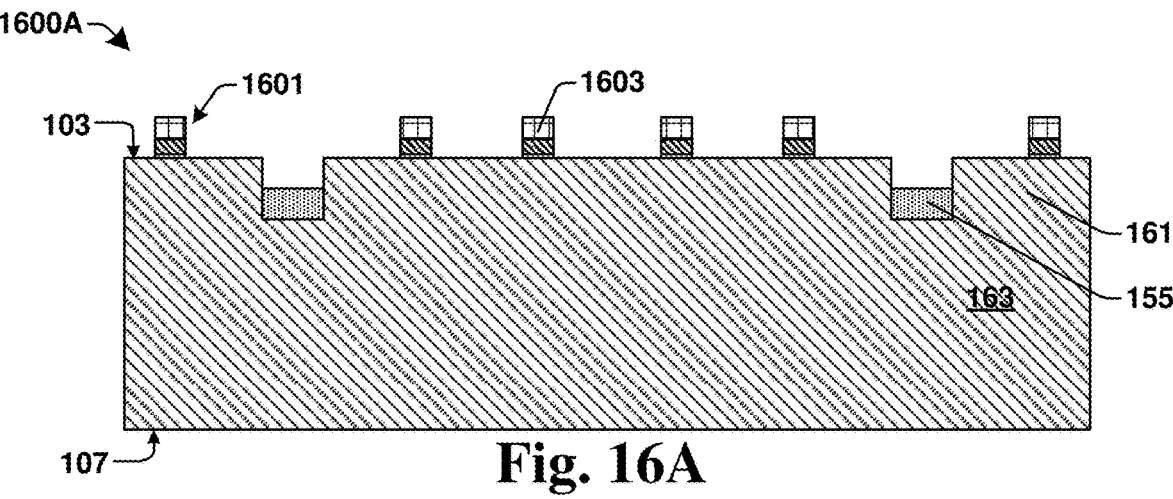
Figure 16B:
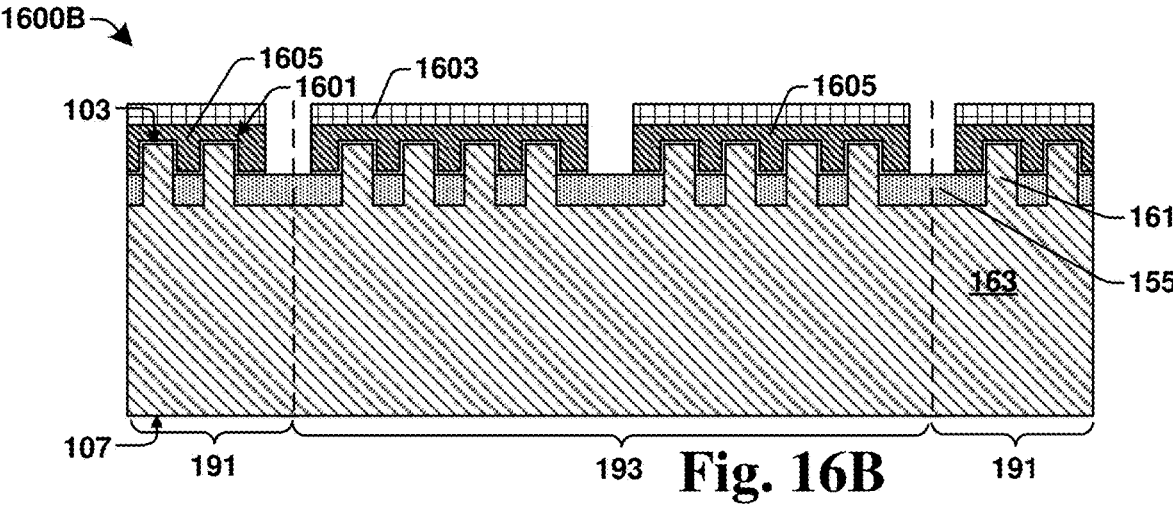
Figure 16C:
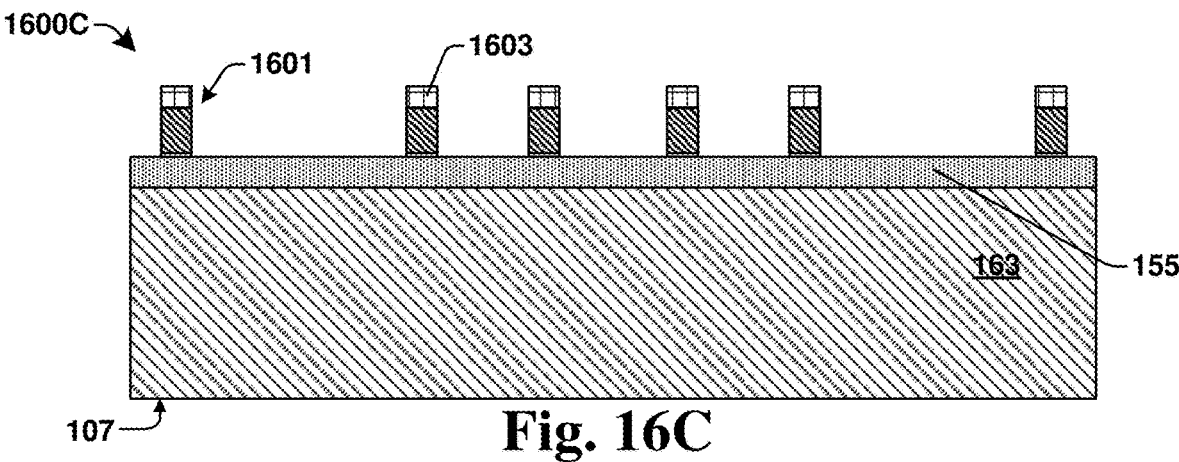
Figure 16D:
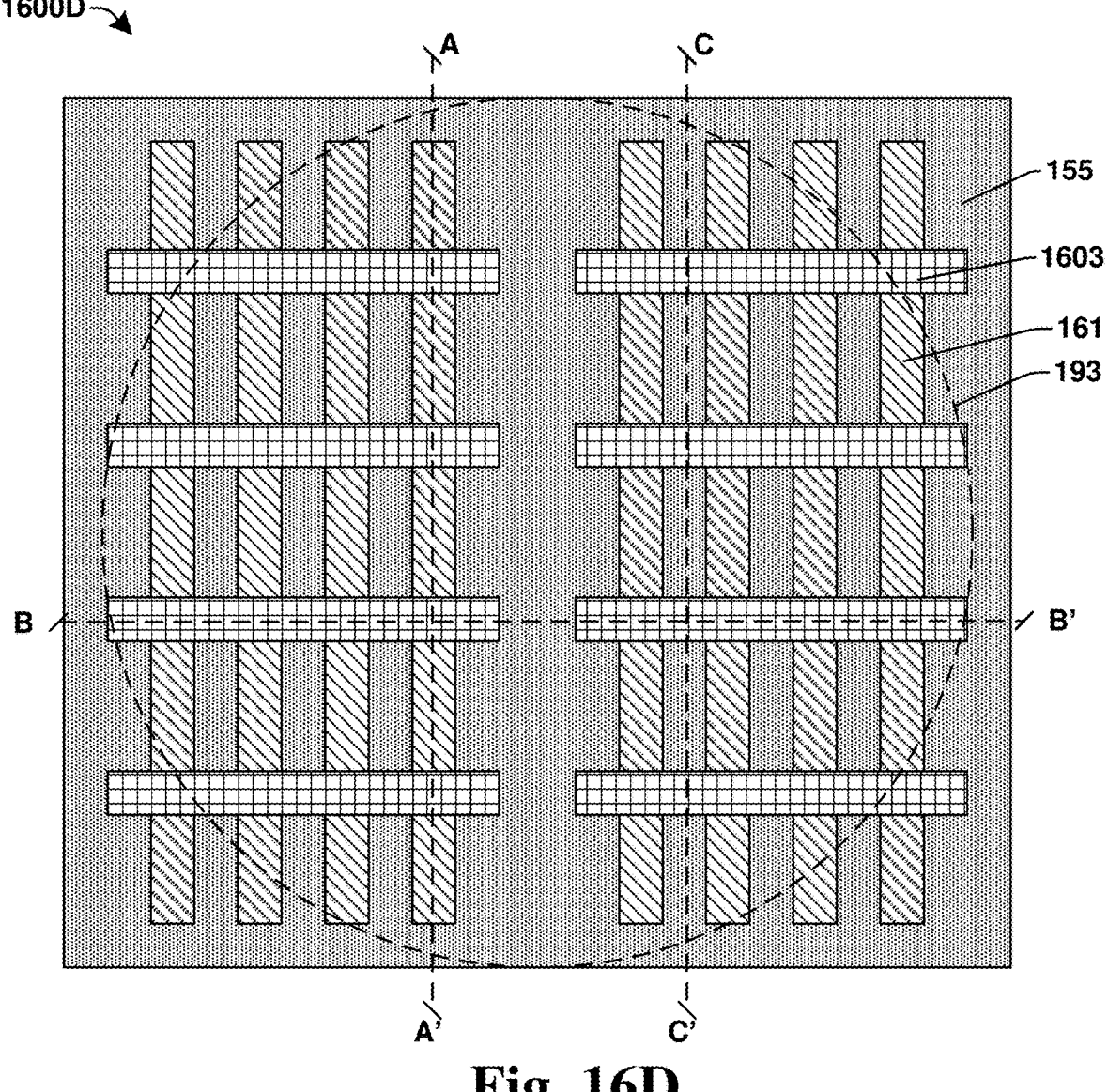
Figure 17A:
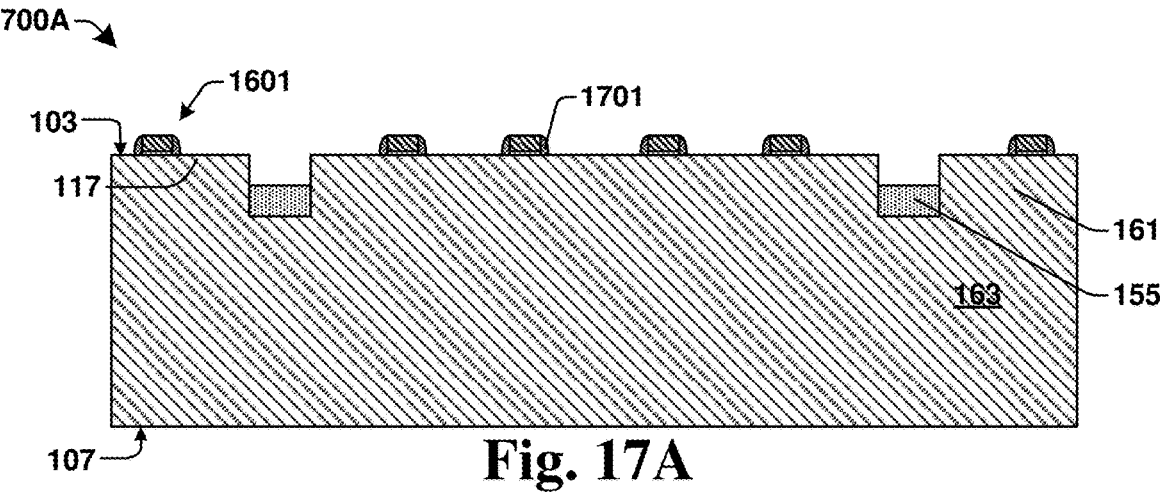
Figure 17B:
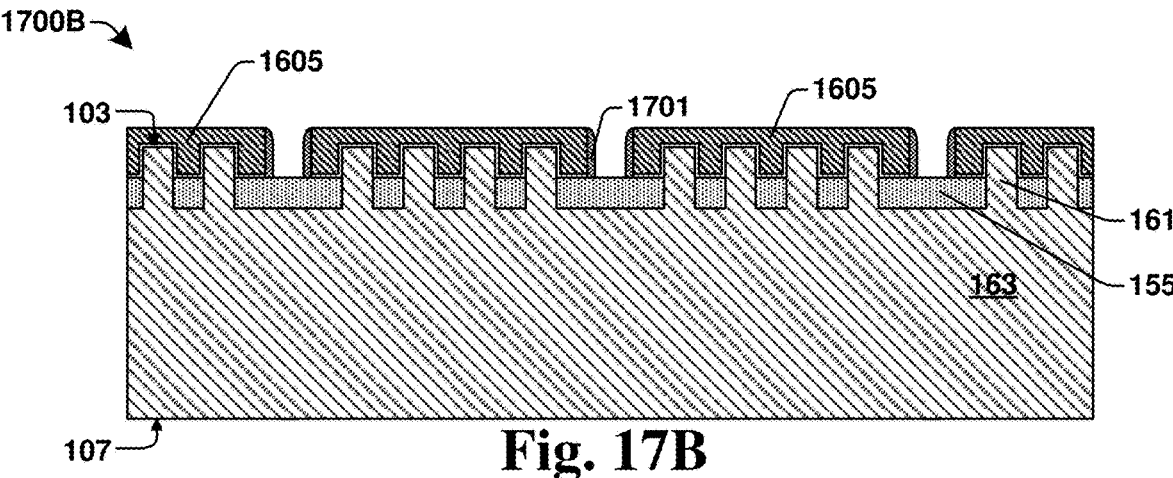
Figure 17C:
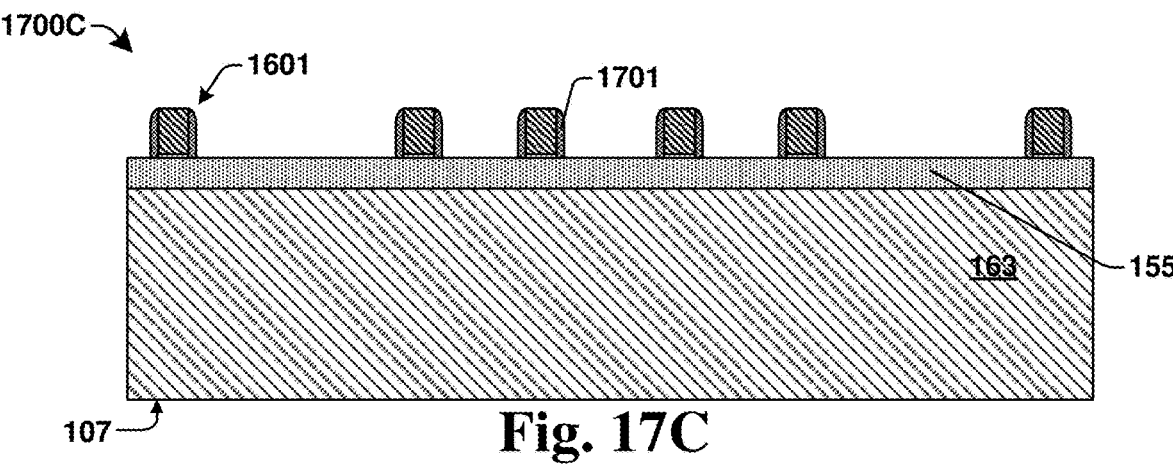
Figure 17D:
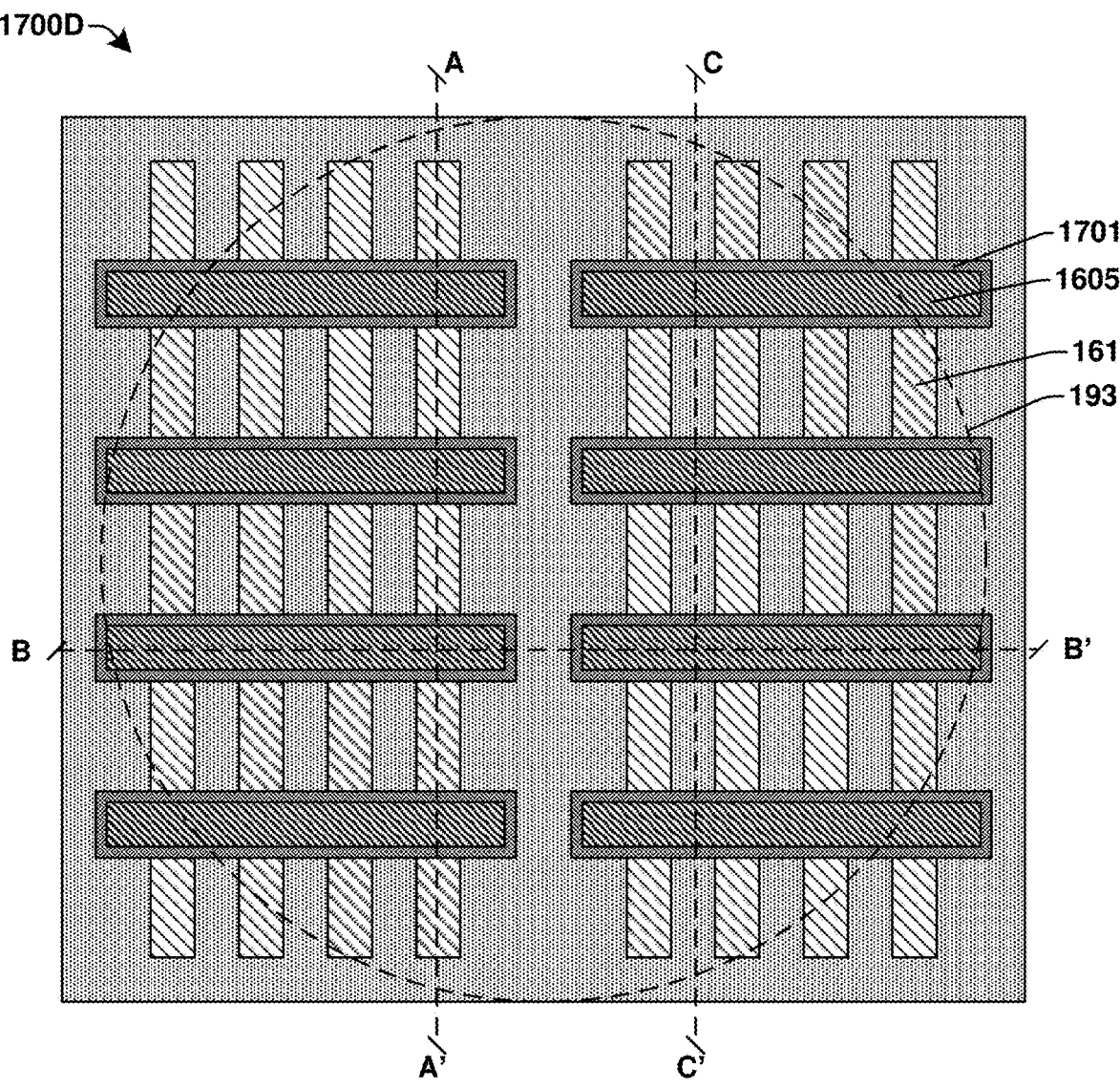

As shown by the cross-sectional views 1500A-C of FIGS. 15A-15C, a dummy gate stack 1501 may be formed over the fins 161. The dummy gate stack 1501 may include a dummy gate dielectric layer 1503 and a dummy gate electrode layer 1505. These layers may comprise any suitable materials and may be formed by any suitable methods. The dummy gate dielectric layer 1503 may be, for example, an oxide or the like. The dummy gate electrode layer 1505 may be, for example, polysilicon or the like. These layers may be deposited by atomic layer deposition (ALD), chemical vapor deposition (CVD), or physical vapor deposition (PVD). After depositing the dummy gate electrode layer 1505 the surface may be planarized by chemical mechanical polishing (CMP) or the like.

As shown by the cross-sectional views 1600A-C and the plan view 1600D of FIGS. 16A-16D, a mask 1603 may be formed and used to pattern the dummy gate stack 1501. The mask 1603 (and other masks used in this process) may be a photoresist mask, a hard mask, or the like, and may be formed using photolithography, e-beam lithography, or the like. The patterning process may be dry etching, the like, or any other suitable process. Patterning defines dummy gates 1601 and dummy gate strips 1605. After patterning, the mask 1603 may be stripped.

As shown by the cross-sectional views 1700A-C and the plan view 1700D of FIGS. 17A-17D, spacers 1701 may be formed around the dummy gate strips 1605. The spacer 1701 may be formed by depositing a spacer material followed by anisotropic etching. The spacer material may include one or more layers of any suitable dielectrics. The spacer material may be or comprise, for example, silicon nitride (SiN), silicon oxynitride (SiON), silicon dioxide ($SiO_2$), a high-κ dielectric, or the like. The spacer material may be deposited by ALD, CVD, PVD, the like, or any other suitable process.

Figure 18A:
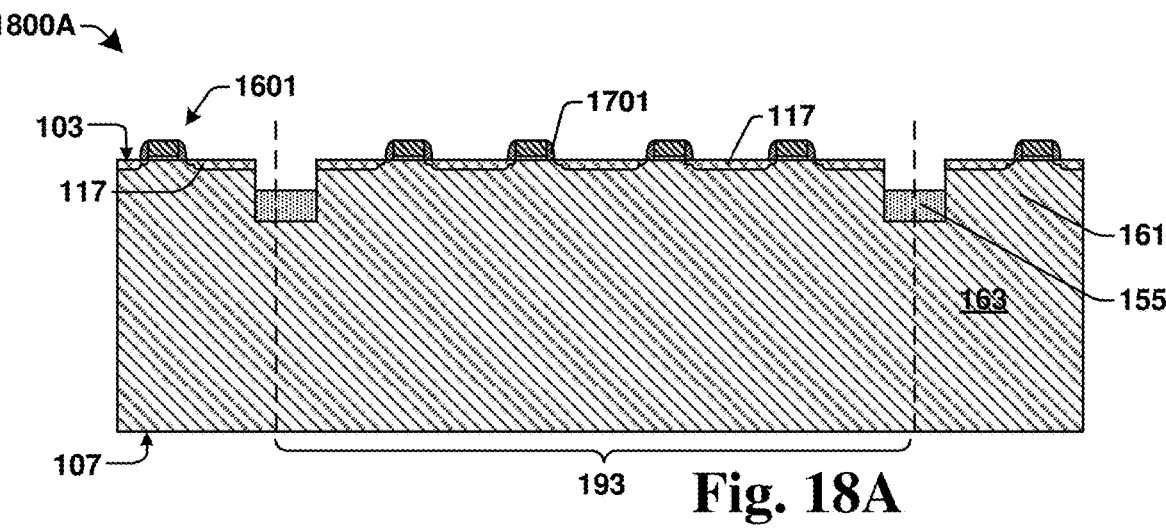
Figure 18B:
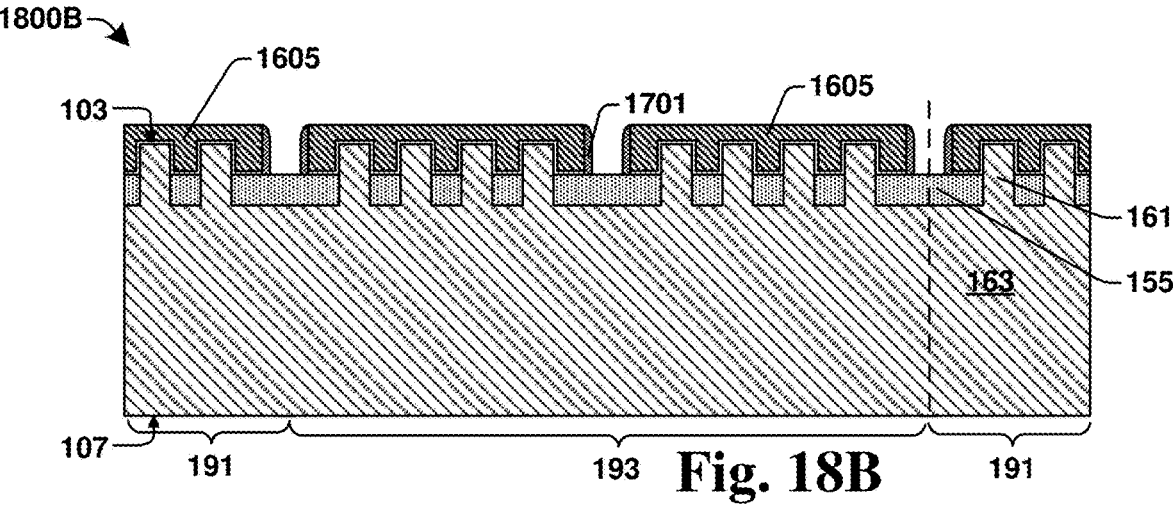
Figure 18C:
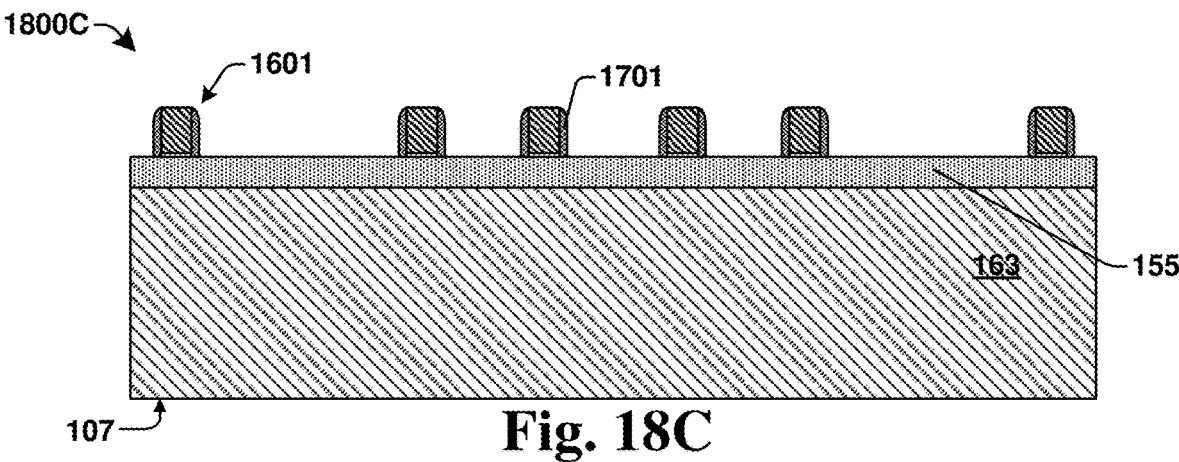

As shown by the cross-sectional views 1800A-C of FIGS. 18A-18C, ion implantation may be carried out to dope source/drain regions 117 in alignment with the spacer 1701. This doping is optional within the TSV landing zone 193. Accordingly, the TSV landing zone 193 may be masked during this ion implantation process.

Figure 19A:
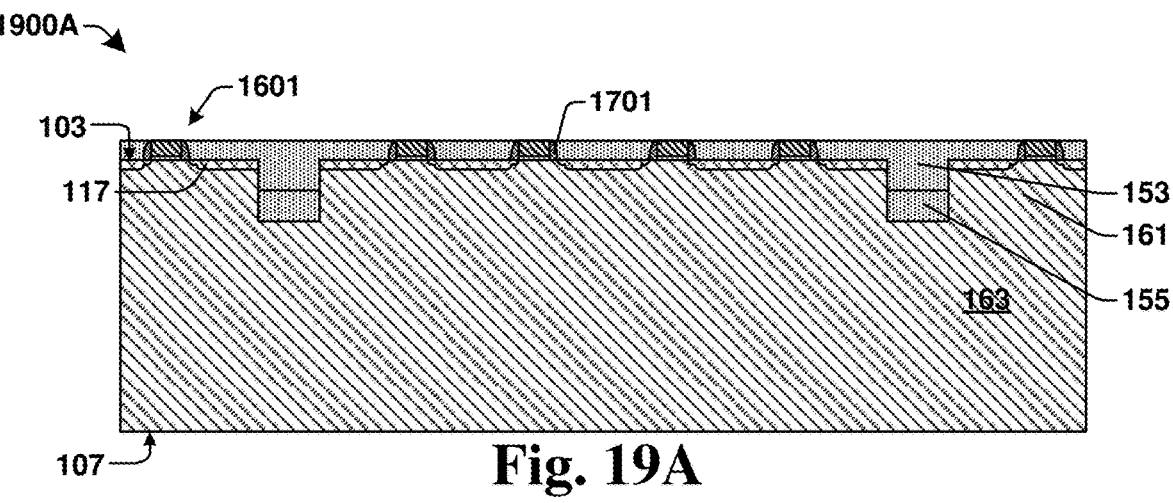
Figure 19B:
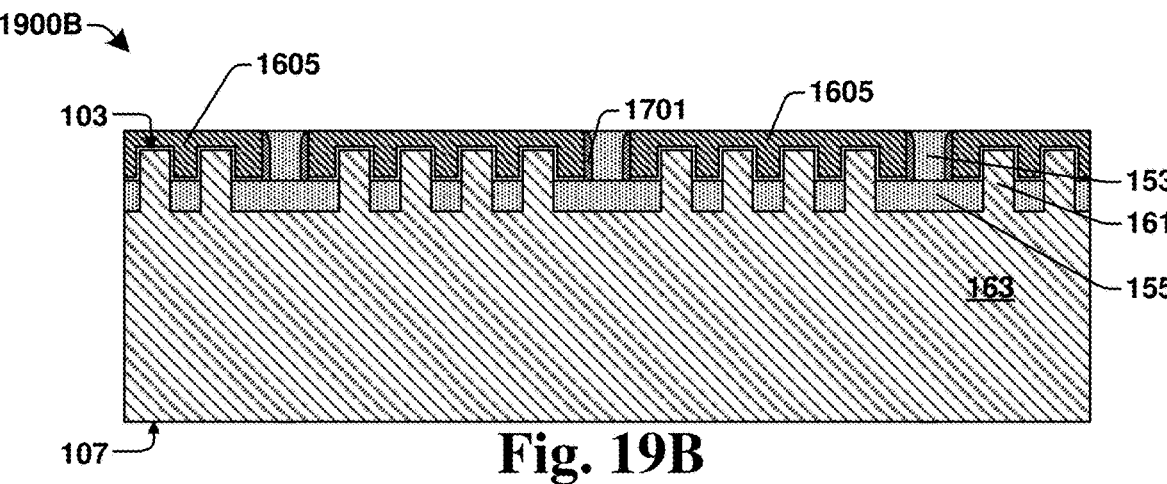
Figure 19C:
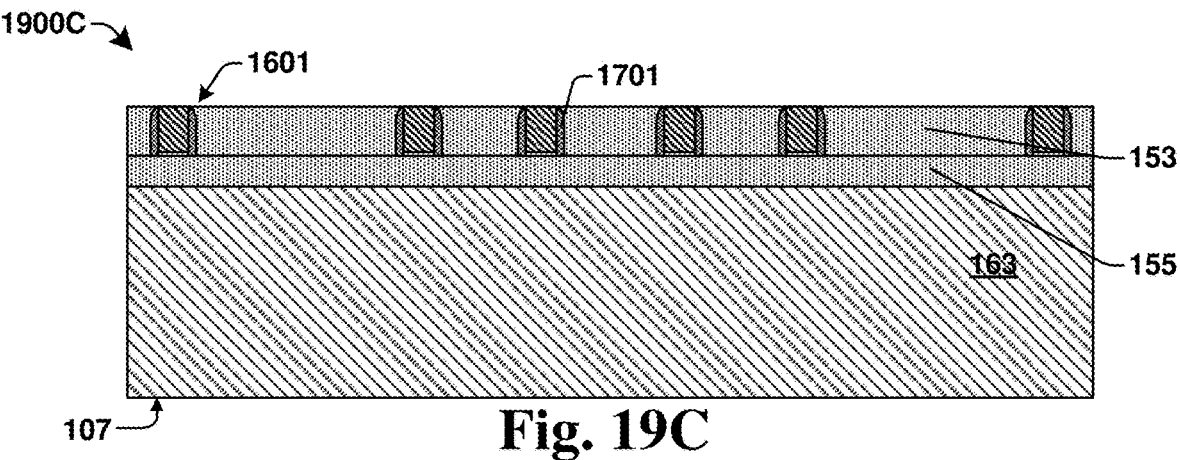

As shown by the cross-sectional views 1900A-C of FIGS. 19A-19C, the isolation dielectric layer 153 may be deposited to fill gaps between the spacers 1701. The isolation dielectric layer 153 may be silicon dioxide ($SiO_2$), a low-κ dielectric, or the like. The isolation dielectric layer 153 may be deposited by ALD, CVD, PVD, the like, or any other suitable process. After deposition the surface may be planarized by chemical mechanical polishing (CMP) or the like.

Figure 20A:
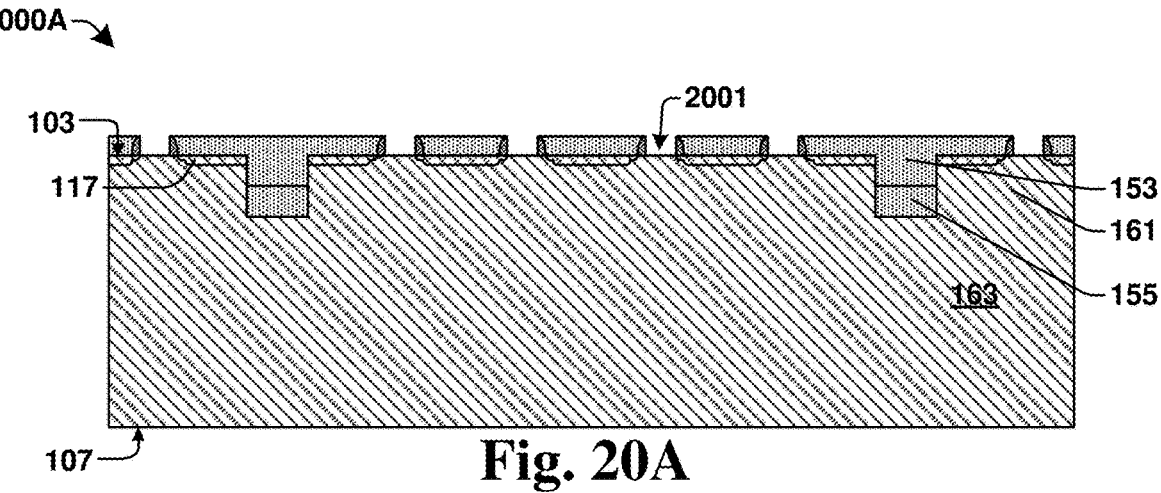
Figure 20B:
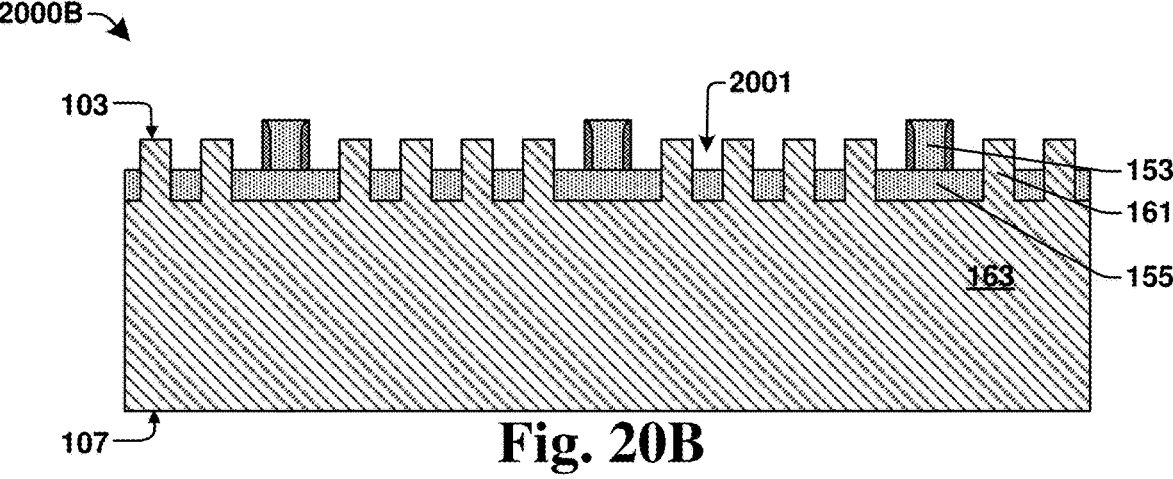
Figure 20C:
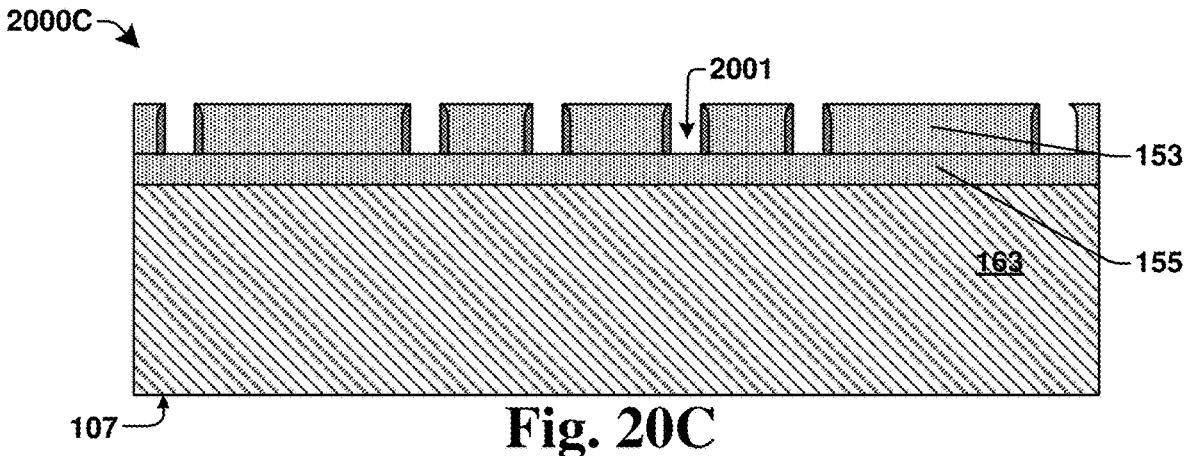

As shown by the cross-sectional views 2000A-C of FIGS. 20A-20C, an etch may be performed to remove the dummy gates 1601 and the dummy gate strips 1605 leaving trenches 2001. The etch may be a wet etch, a dry etch, the like, or any other suitable process.

Figures 1A, 21:
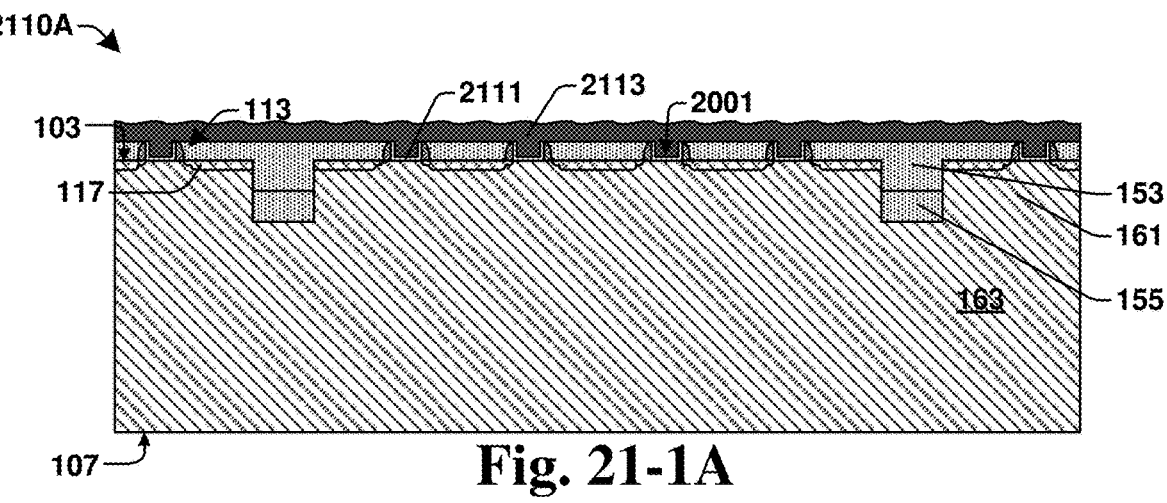
Figures 1B, 21:
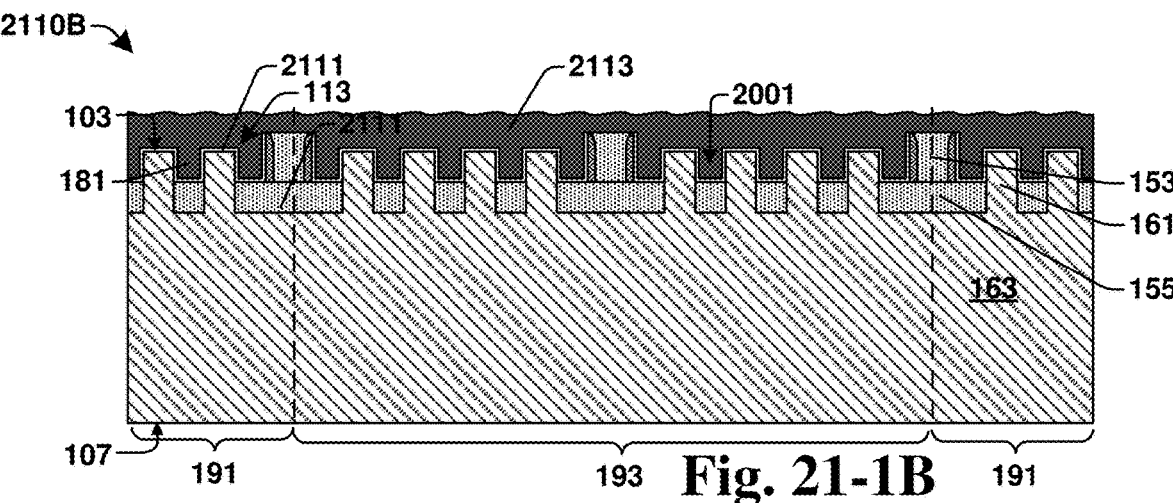
Figures 1C, 21:
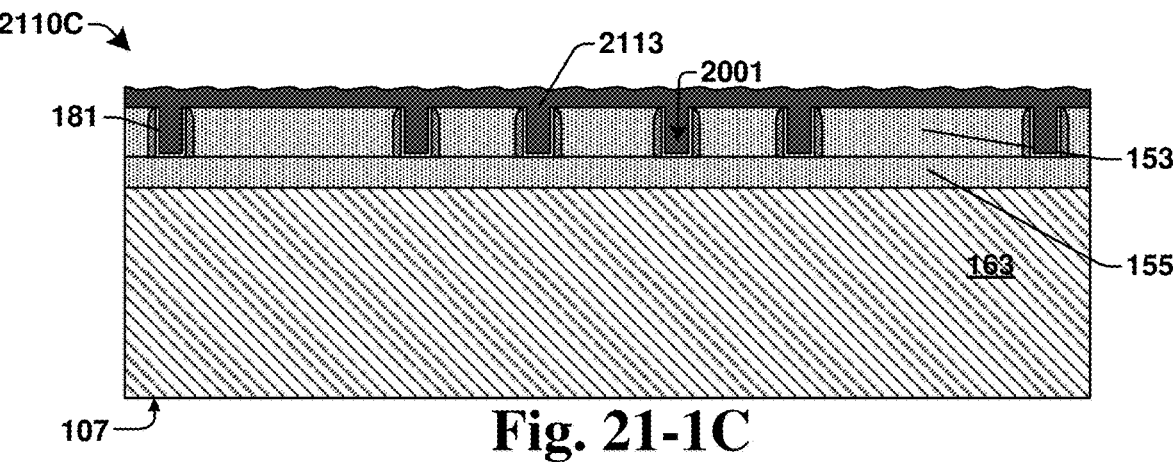

As shown by the cross-sectional views 2110A-C of FIGS. 21-1A through 21-1C, a high-κ dielectric layer 2111 and a gate electrode layer 2113 may be deposited so as to fill the trenches 2001. The high-κ dielectric layer 2111 may be any suitable high-κ dielectric. Examples of high-κ dielectrics include hafnium-based materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium oxide aluminum oxide ($HfO_2$—$Al_2O_3$) alloy, and the like. Additional examples of high-κ dielectrics include, without limitation, zirconium oxide ($ZrO_2$), tantalum oxide ($Ta_2O_5$), aluminum oxide ($Al_2O_3$), yttrium oxide ($Y_2O_3$), lanthanum oxide ($La_2O_3$), strontium titanium oxide ($SrTiO_3$), and the like. The high-κ dielectric layer 2111 may have a thickness in the range from 5 to 50 Angstroms, for example. The high-κ dielectric layer may be formed by ALD, CVD, PVD, the like, or any suitable process.

The gate electrode layer 2113 may include one layer having one composition, or multiple layers having differing compositions. One or more of the layers may be a work function metal. Examples of work function metals include, without limitation, titanium (Ti), titanium nitride (TiN), tantalum nitride (TaN), tantalum (Ta), tantalum carbide (TaC), tantalum nitride (TaN), tantalum silicon nitride (TaSiN), tungsten nitride (WN), molybdenum nitride (MoN), molybdenum oxynitride (MoON), and the like. Additional metal layers may include, without limitation, tungsten (W), ruthenium (Ru), palladium (Pd), platinum (Pt), cobalt (Co), nickel (Ni), zirconium (Zi), titanium (Ti), tantalum (Ta), aluminum (Al), conductive carbides, oxides, or alloys of these metals, or the like. In some embodiments, the gate electrode layer comprises tungsten (W) or the like. The metal layers may be formed by any suitable process or combination of processes. The processes may be, for example, electroplating, electroless plating, ALD, CVD, PVD, or the like.

Figures 2A, 21:
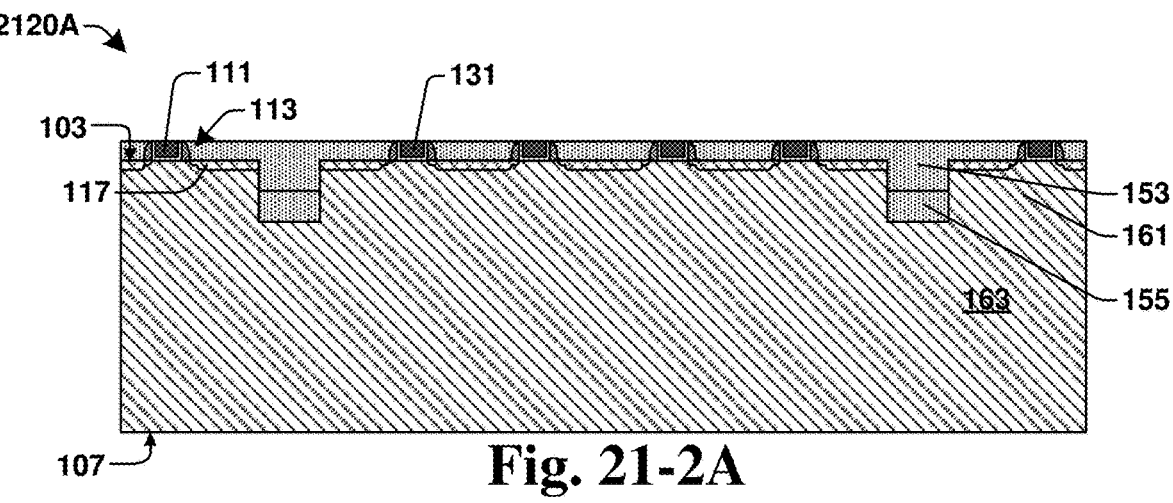
Figures 2B, 21:
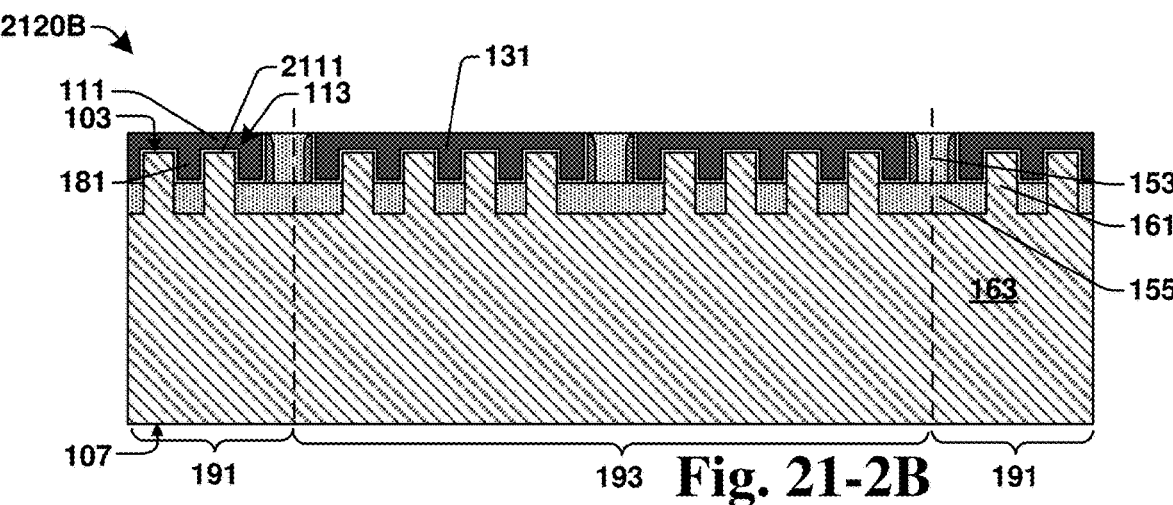
Figures 2C, 21:
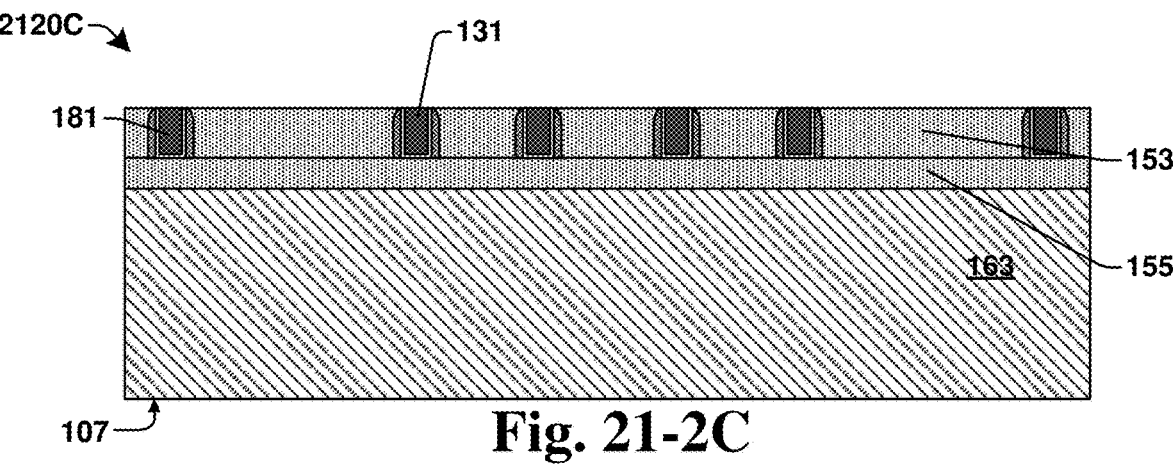
Figures 2D, 21:
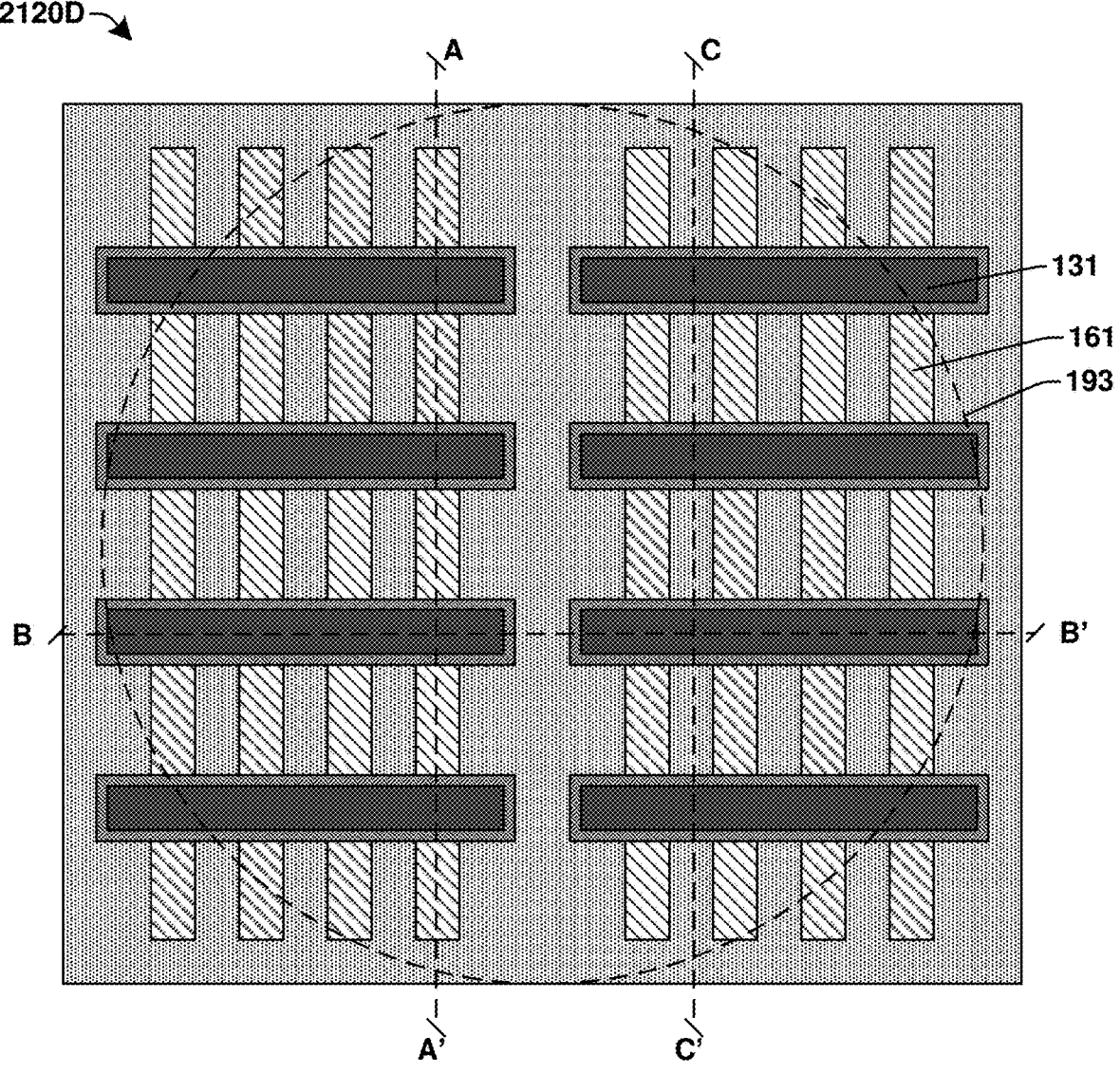

As shown by the cross-sectional views 2120A-C and the plan view 2120D of FIGS. 21-2A through 21-2D, a planarization process may be carried so as to define the electrode metal substructures 131 in the TSV landing zone 193 and the gate strips 181 outside the TSV landing zone 193 from the gate electrode layer 2113. The gate strips 181 including the metal electrodes 111 of the transistors 113. The planarization process may be CMP, the like, or any other suitable process. FEOL processing rules limit the areal density variation of the gate electrode metal across the front side 103 so that localized dishing does not occur to any problematic extent during this process. After planarization, the thickness of the gate electrode metal over the fins 161 may be in the range from about 2 nm to about 30 nm, for example.

Figures 1A, 22:
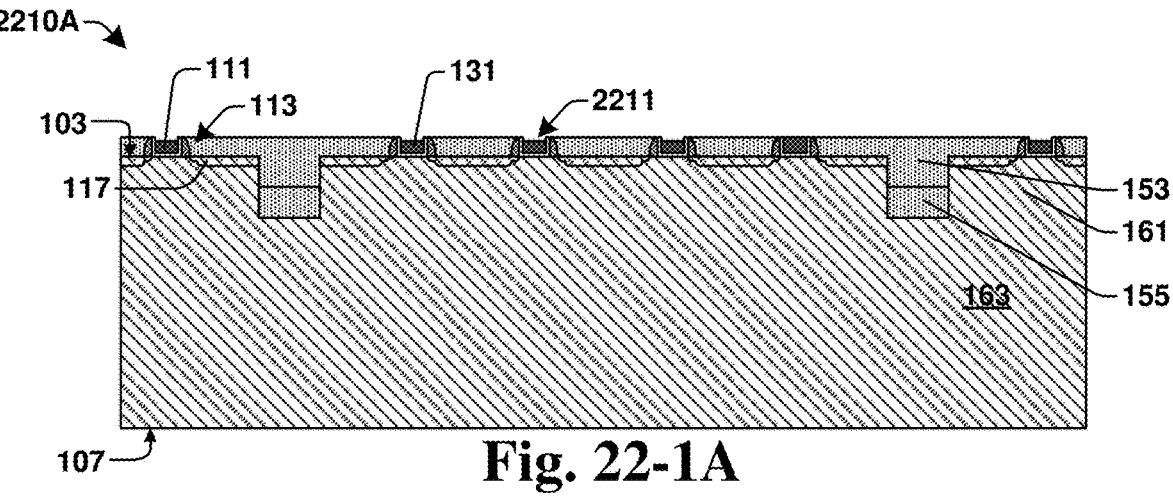
Figures 1B, 22:
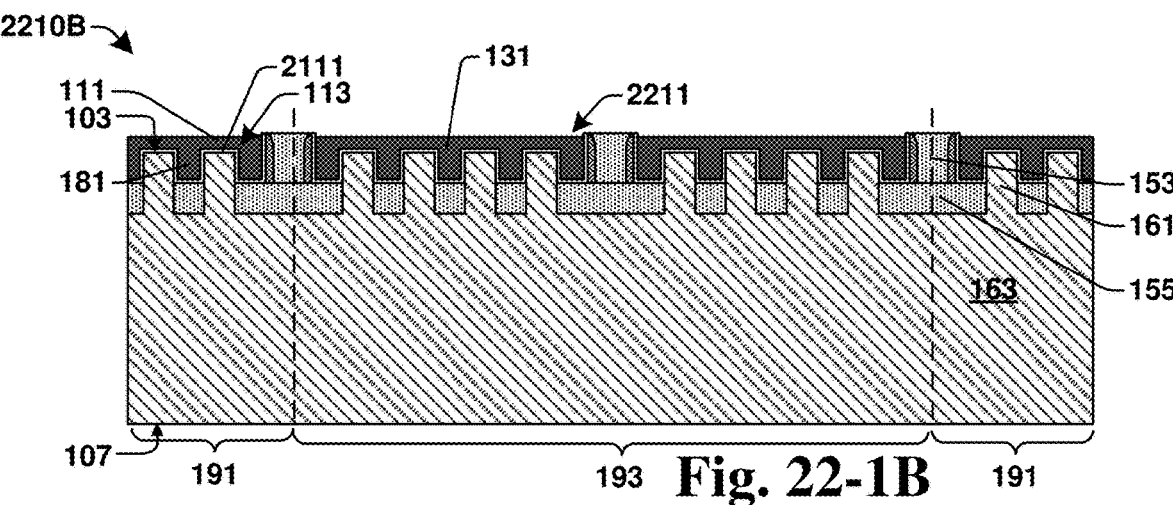
Figures 1C, 22:
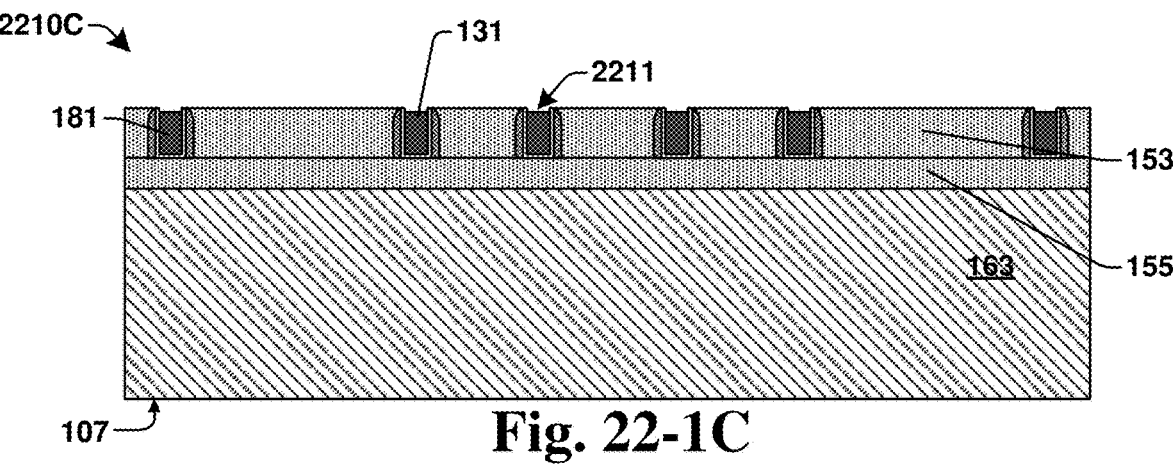
Figures 2A, 22:
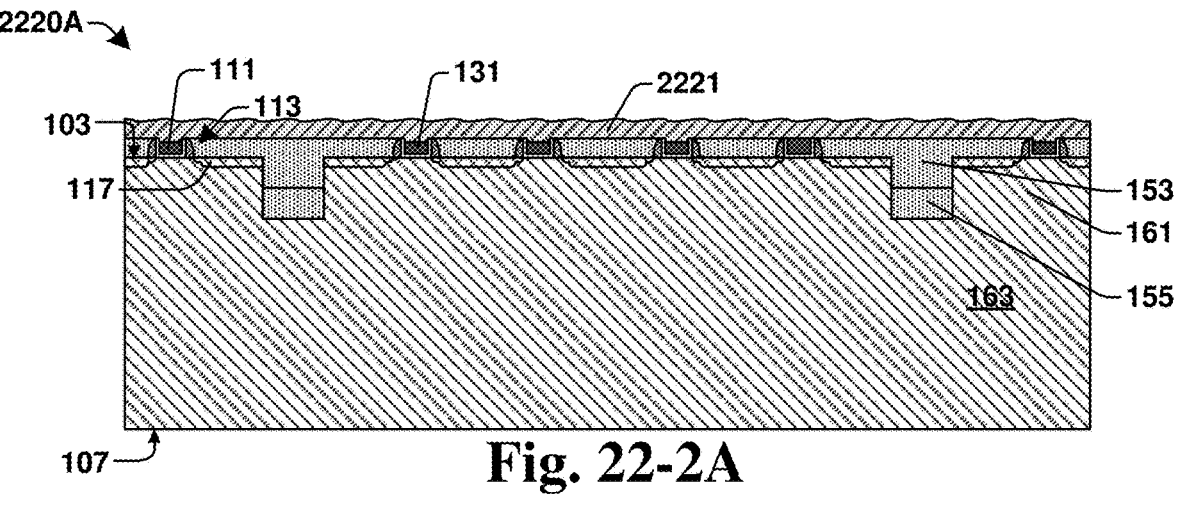
Figures 2B, 22:
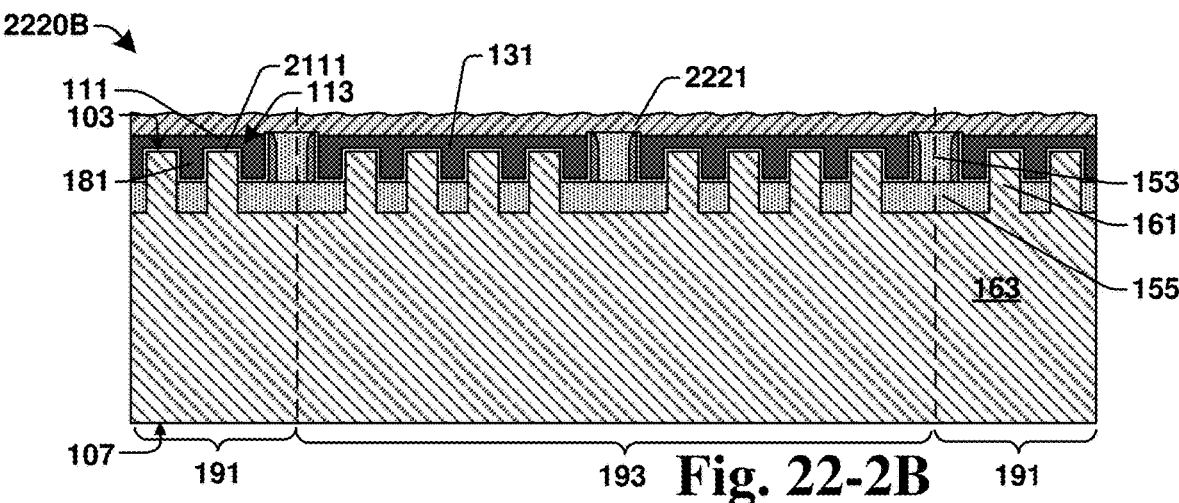
Figures 2C, 22:
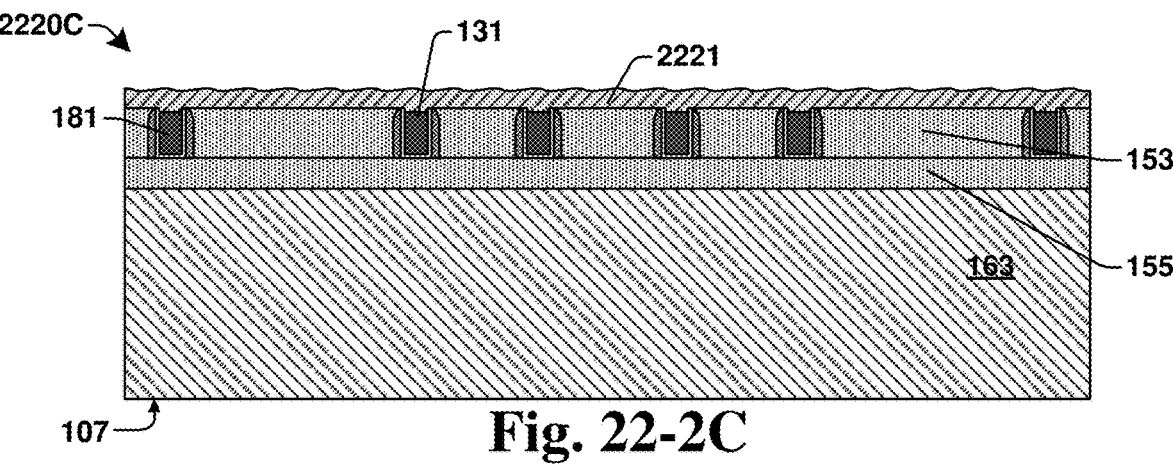

As shown by the cross-sectional views 2210A-C of FIGS. 22-1A through 22-2C, a process may be carried out to that selectively etch the gate electrode metal so as to create recesses 2211 directly over the gate strips 181 and the electrode metal substructures 131. The etch process may be a wet etch, a dry etch, the like, or any other suitable process.

As shown by the cross-sectional views 2220A-C of FIGS. 22-2A-C, an etch stop material 2221 may be deposited so as to fill the recesses 2211. The etch stop material 2221 may be silicon nitride (SiN), silicon carbide (SiC), silicon carbonitride (SiCN), silicon oxycarbide (SiOC), silicon oxycarbonitiride (SiOCN), the like, or any other suitable material. In some embodiments, the etch stop material 2221 is silicon nitride (SiN) or the like. The etch stop layer 151 may be deposited by ALD, CVD, PVD, the like, or any other suitable processes.

Figures 3A, 22:
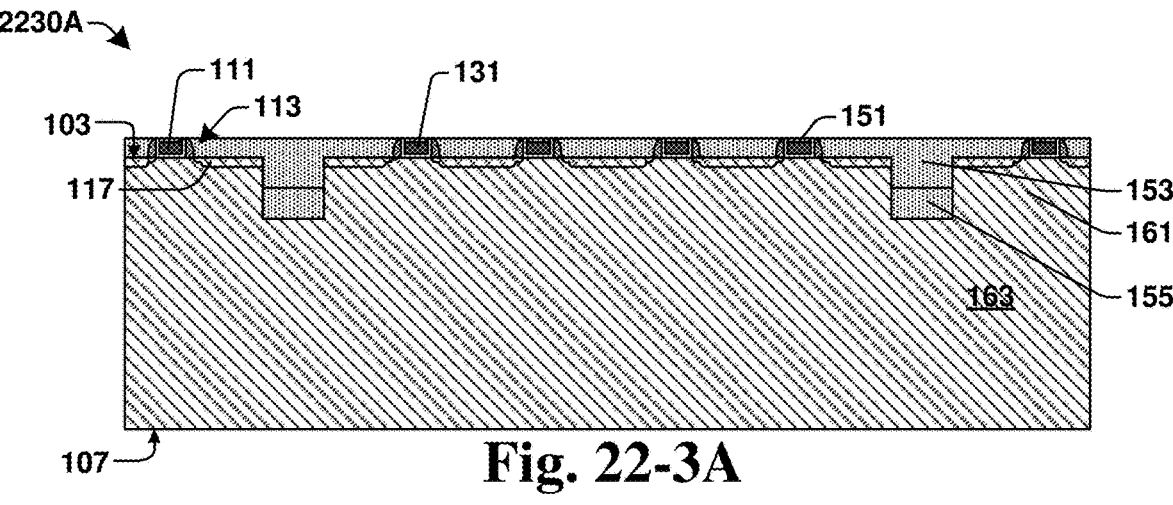
Figures 3B, 22:
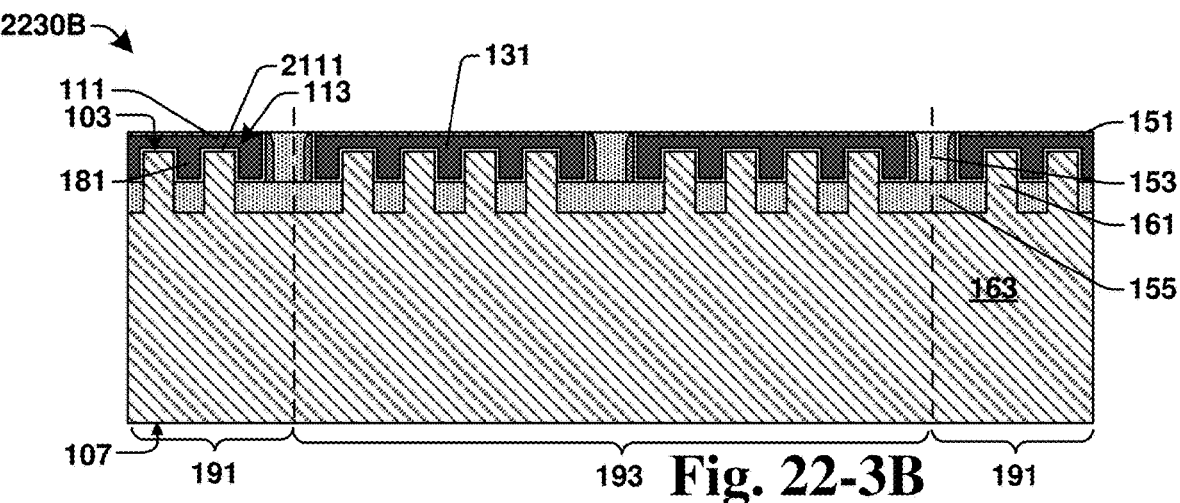
Figures 3C, 22:
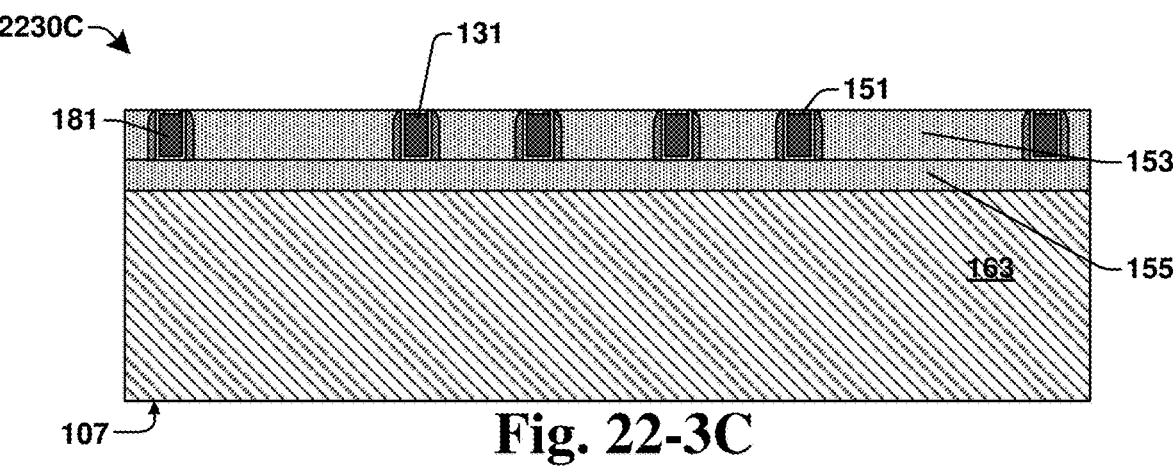

As shown by the cross-sectional views 2230A-C of FIGS. 22-3A through 22-3C, a planarization process may be carried out so at to remove the etch stop material 2221 that is outside the recesses 2211. The remaining etch stop material 2221 forms an etch stop layer 151 over the gate strips 181 and the electrode metal substructures 131. The planarization process may be CMP, the like, or any other suitable process.

Figures 1A, 23:
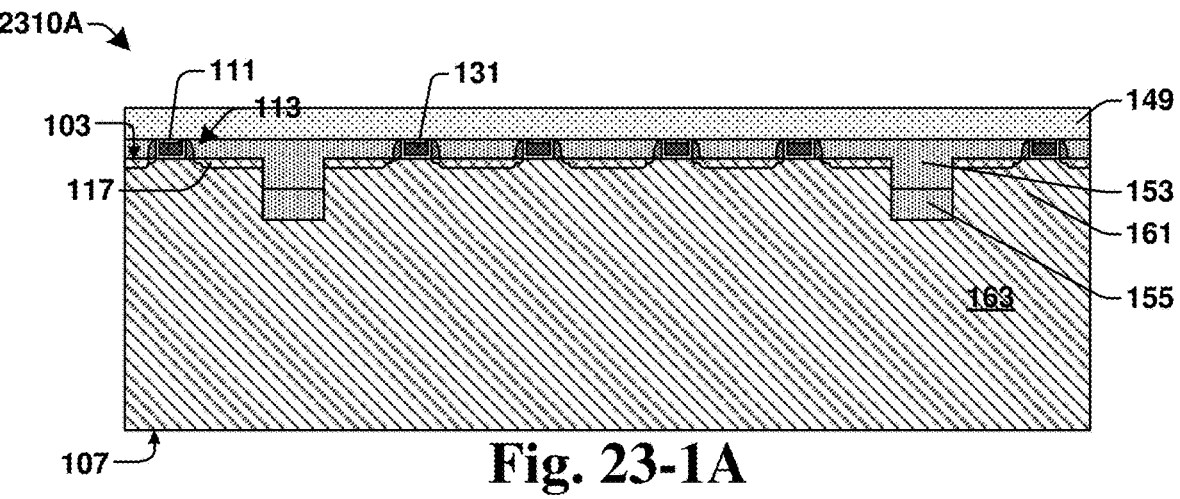
Figures 1B, 23:
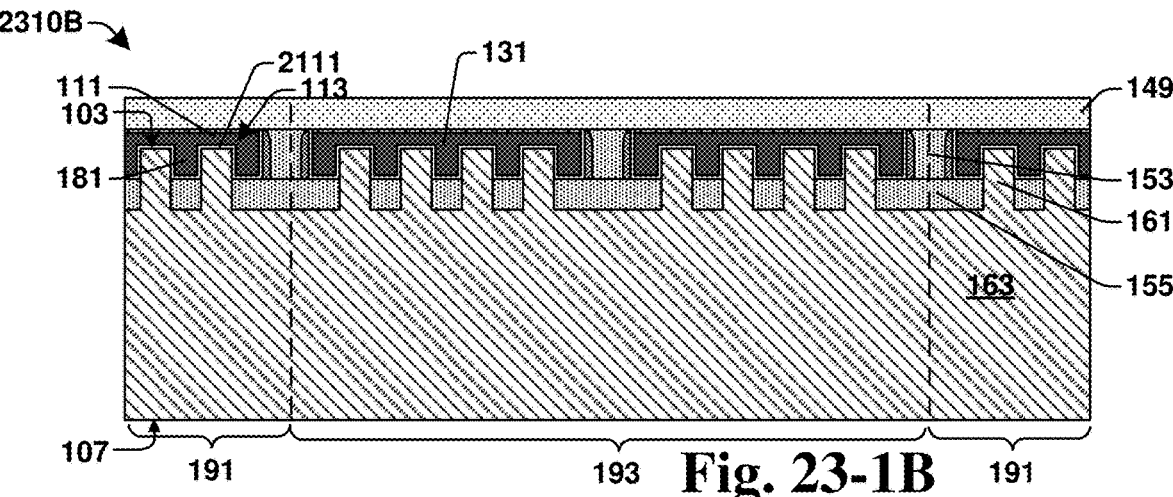
Figures 1C, 23:
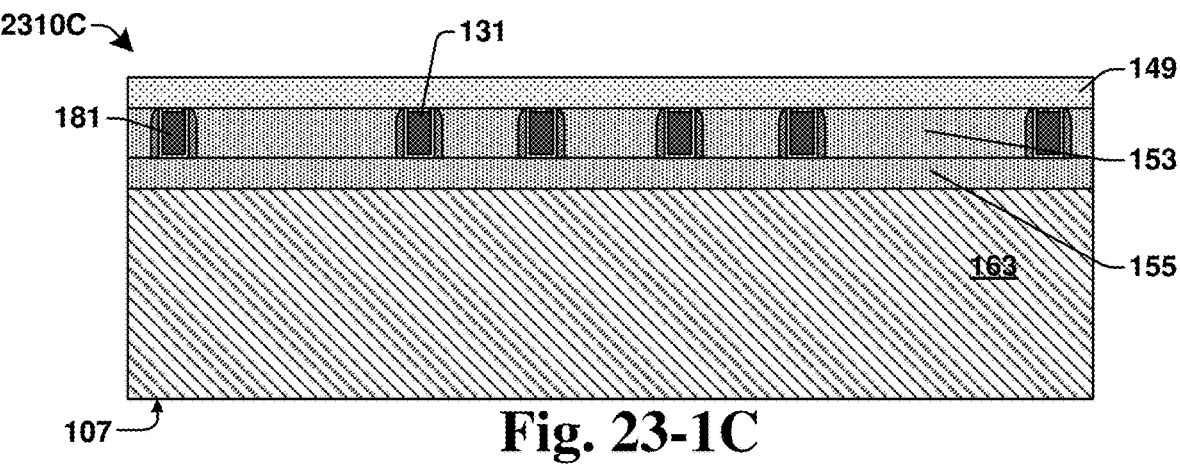
Figures 2A, 23:
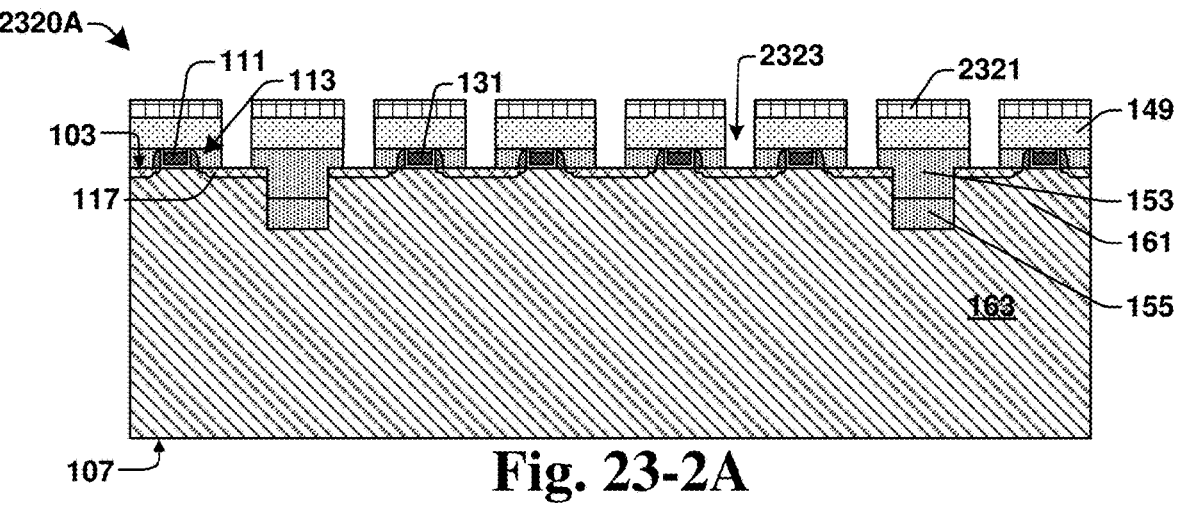
Figures 2B, 23:
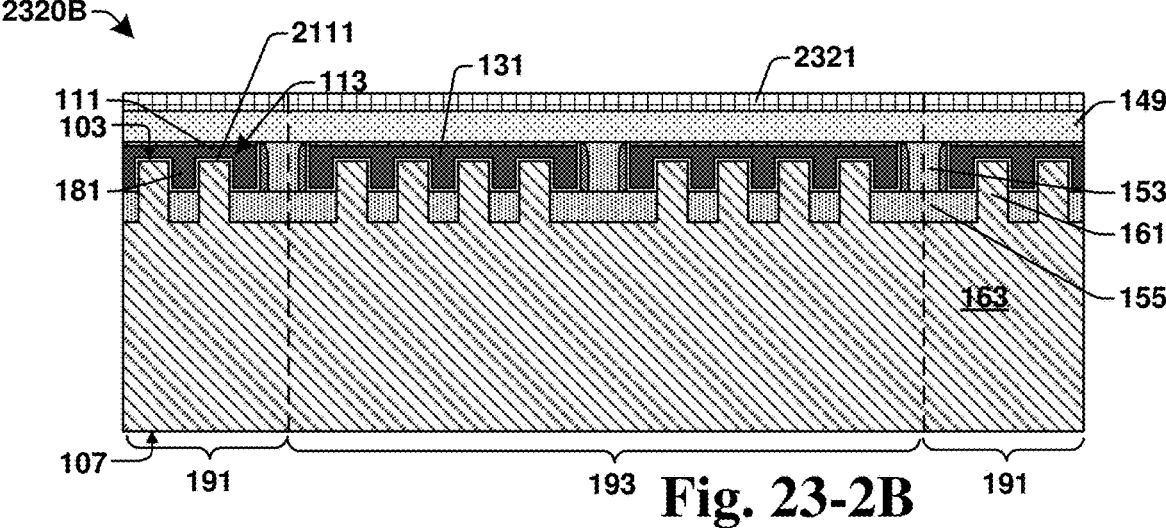
Figures 2C, 23:
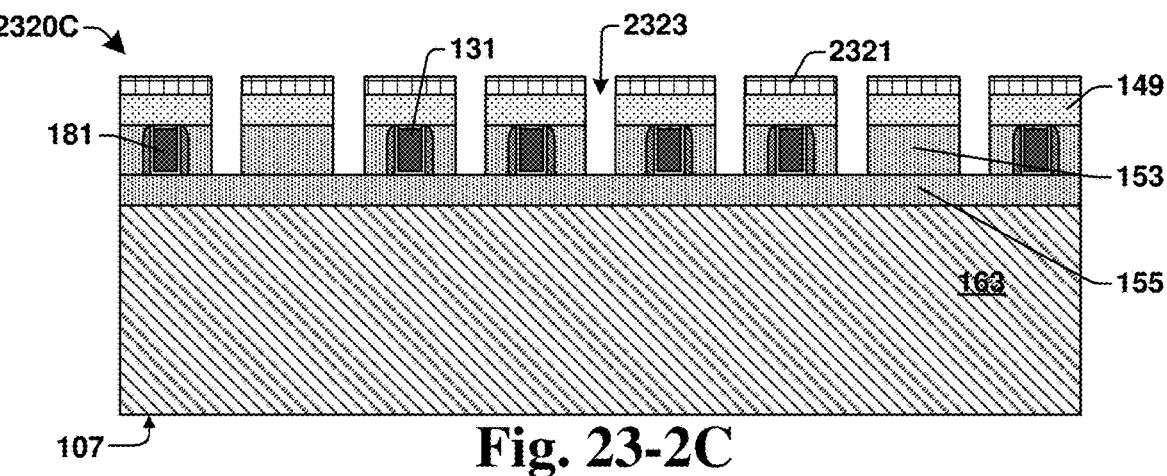
Figures 2D, 23:
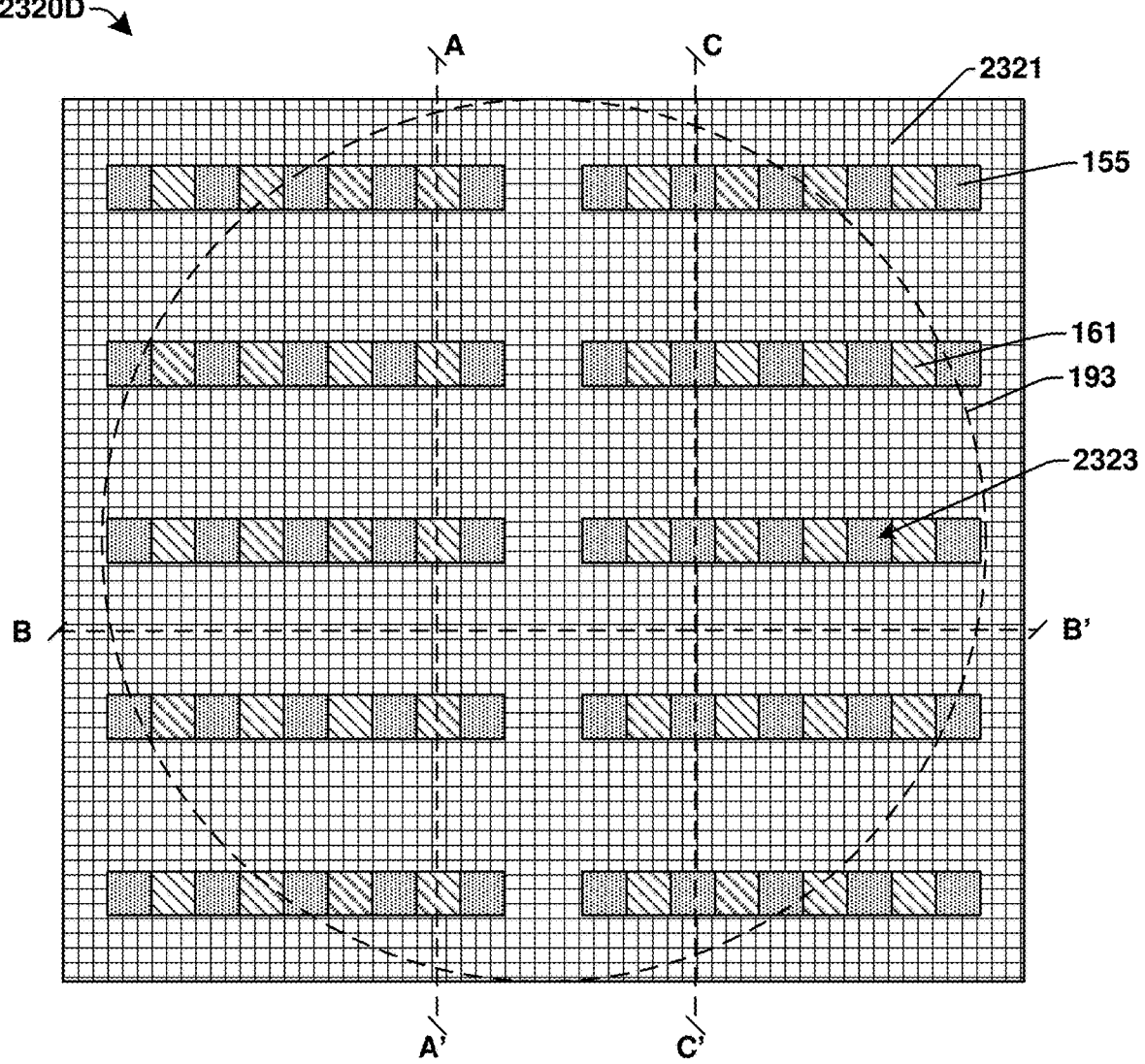

As shown by the cross-sectional views 2310A-C of FIGS. 23-1A through 23-1C, the interlevel dielectric layer 149 may then be deposited. The interlevel dielectric layer 149 may be silicon dioxide ($SiO_2$), a low-κ dielectric, or the like. The interlevel dielectric layer 149 may be deposited by ALD, CVD, PVD, the like, or any other suitable processes.

As shown by the cross-sectional views 2320A-C and the plan view 2320D of FIGS. 23-2A through 23-2D, a mask 2321 may be formed and used to etch through the interlevel dielectric layer 149 and the isolation dielectric layer 153 so as to form trenches 2323 that run across the fins 161. After etching, the mask 2321 may be stripped.

Figures 1A, 24:
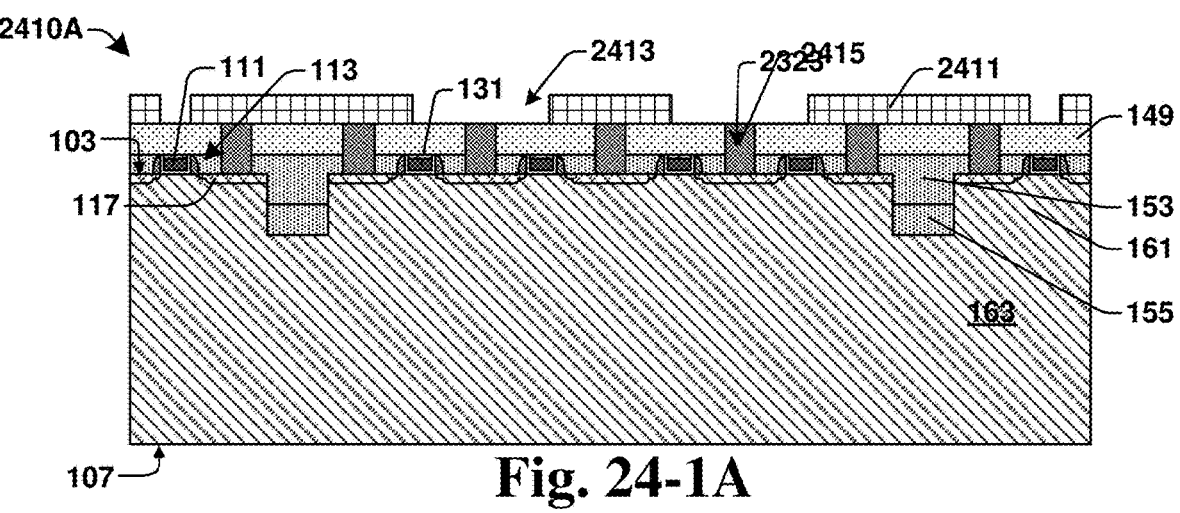
Figures 1B, 24:
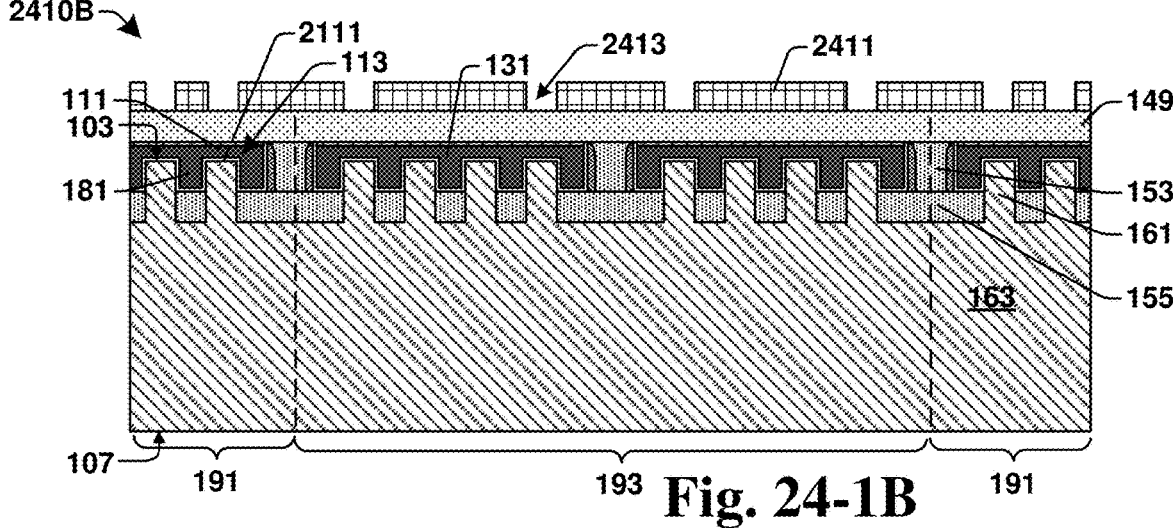
Figures 1C, 24:
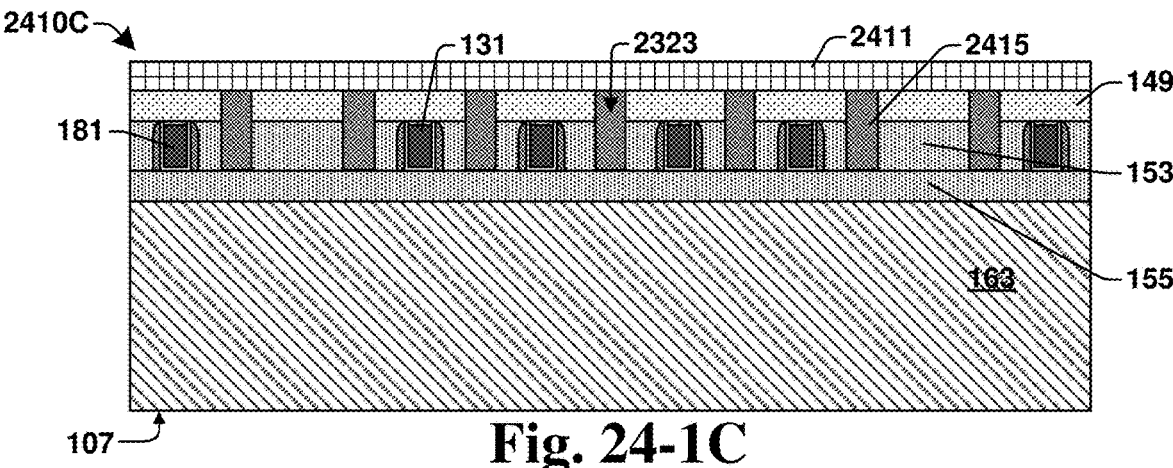
Figures 1D, 24:
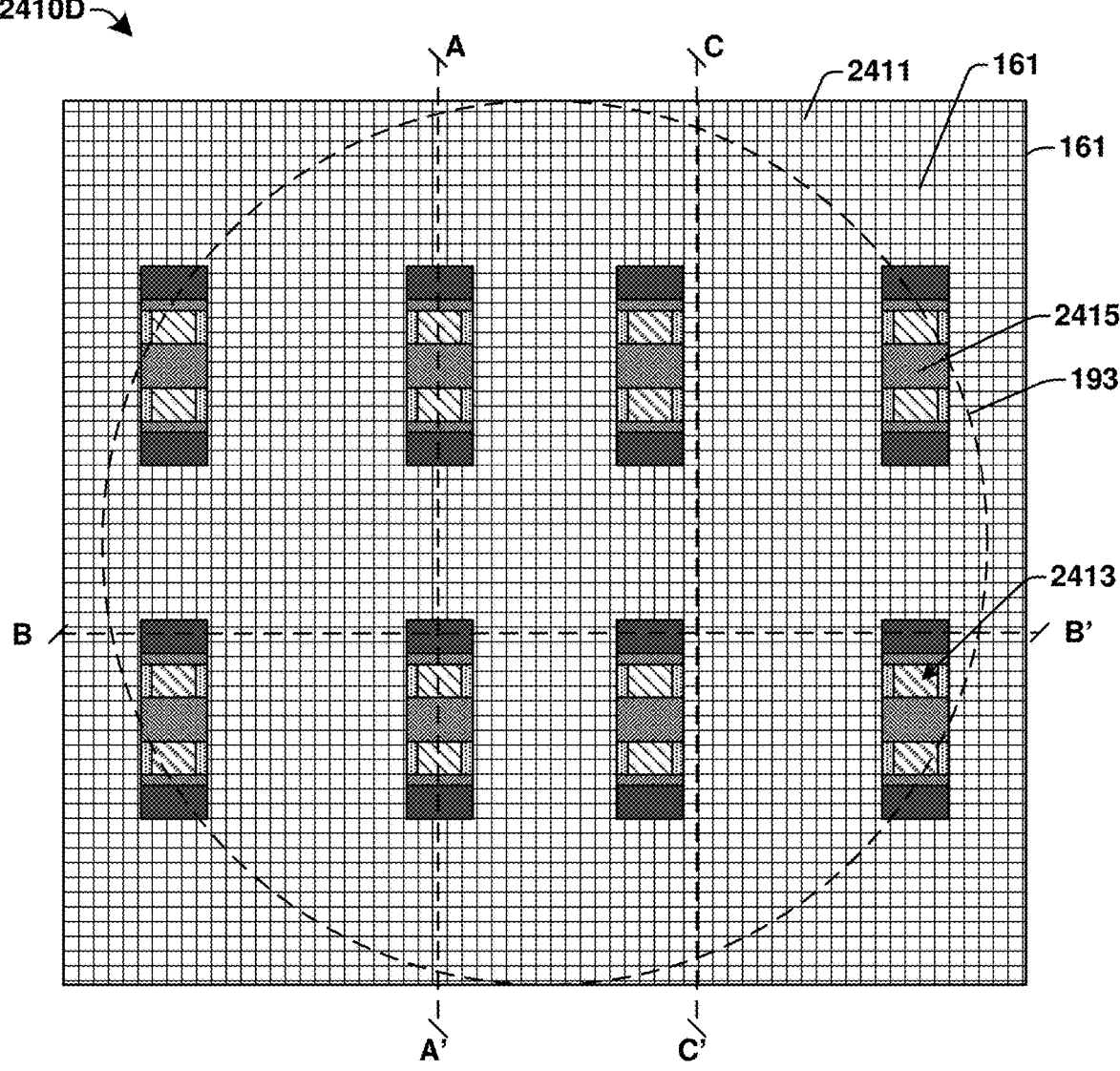
Figures 2A, 24:
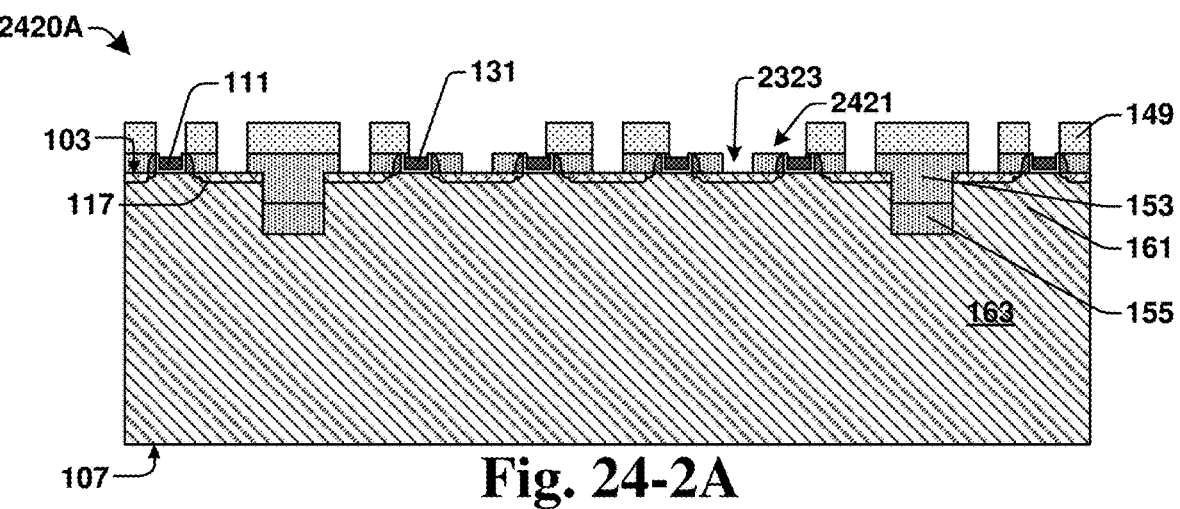
Figures 2B, 24:
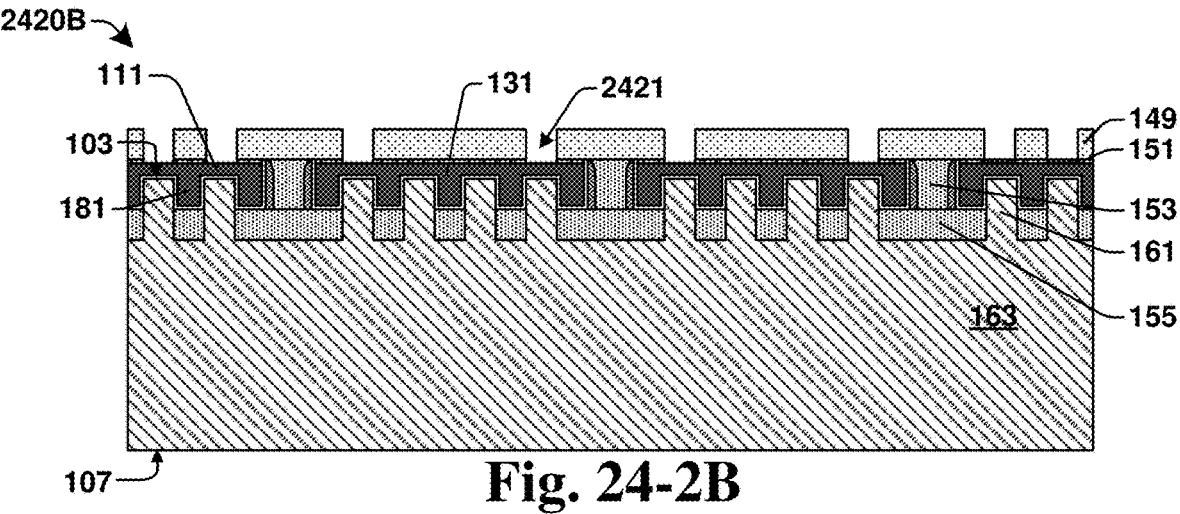
Figures 2C, 24:
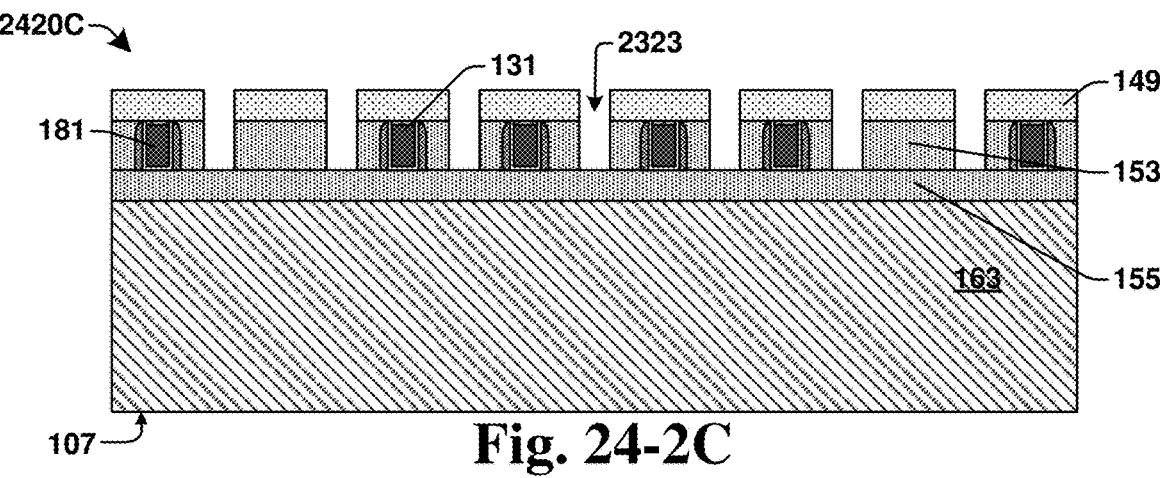

As shown by the cross-sectional views 2410A-C and the plan view 2410D of FIGS. 24-1A through 24-1D, a mask 2415 and a mask 2411 may then be formed. The mask 2415 fills the trenches 2323. The mask 2411 is patterned with openings 2413. As shown by the cross-sectional views 2420A-C of FIGS. 24-2A through 24-2C, the interlevel dielectric layer 149 is etched through the openings 2413 to produce trenches 2421 after which the mask 2415 and the mask 2411 are stripped. The trenches 2421 intersect the trenches 2323 and run parallel to the fins 161. The etch breaks through the etch stop layer 151 to expose the gate strips 181 and the electrode metal substructures 131. At least a later part of the etch process may be selective for removing the material of the etch stop layer 151 over the material of the isolation dielectric layer 153. This selectivity helps ensure that the gate strips 181 and the electrode metal substructures 131 are exposed for contact with the M0 metallization layer without over etching that could cause leakage currents. 2210

Figures 1A, 25:
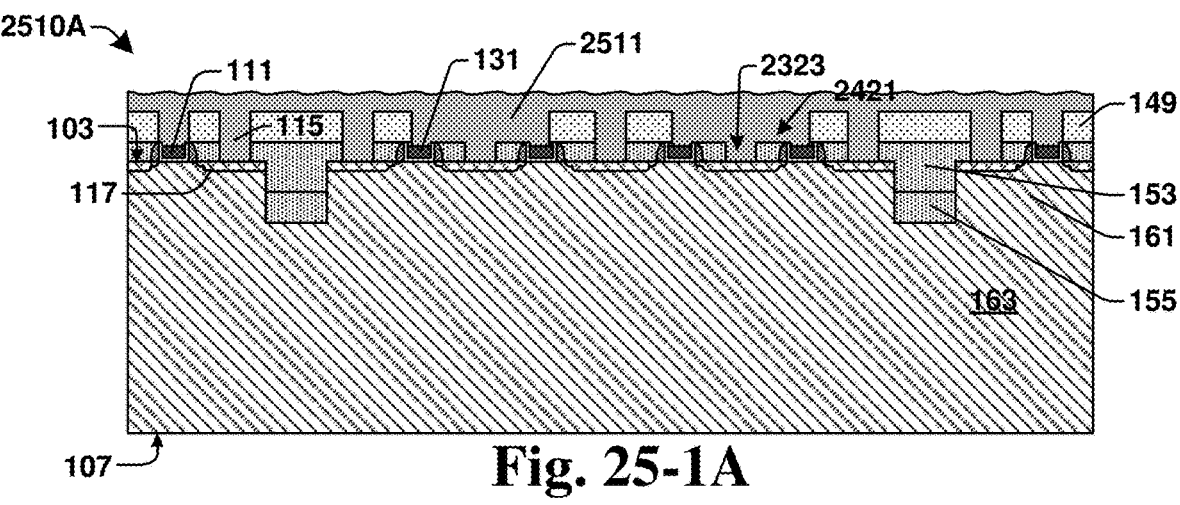
Figures 1B, 25:
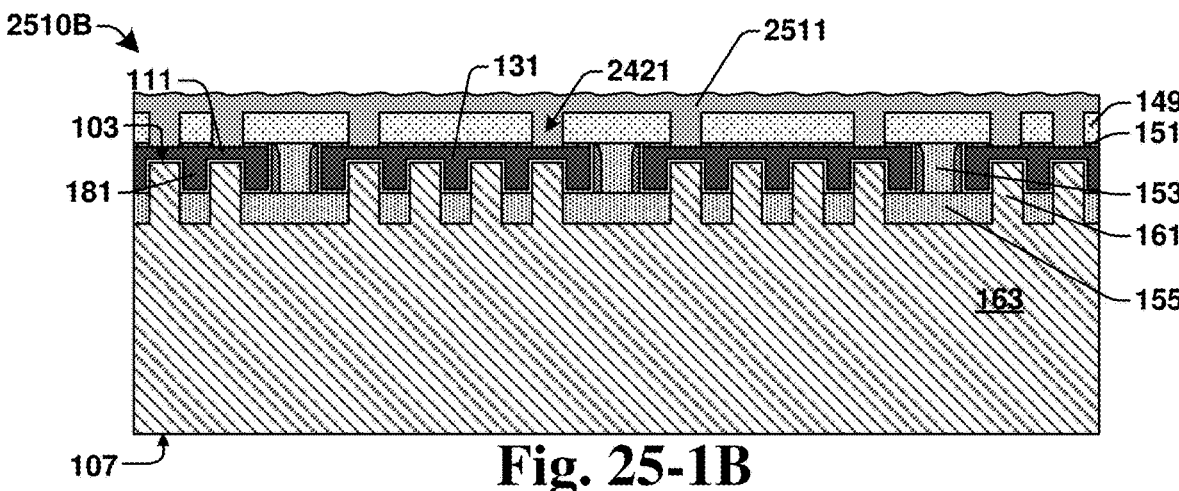
Figures 1C, 25:
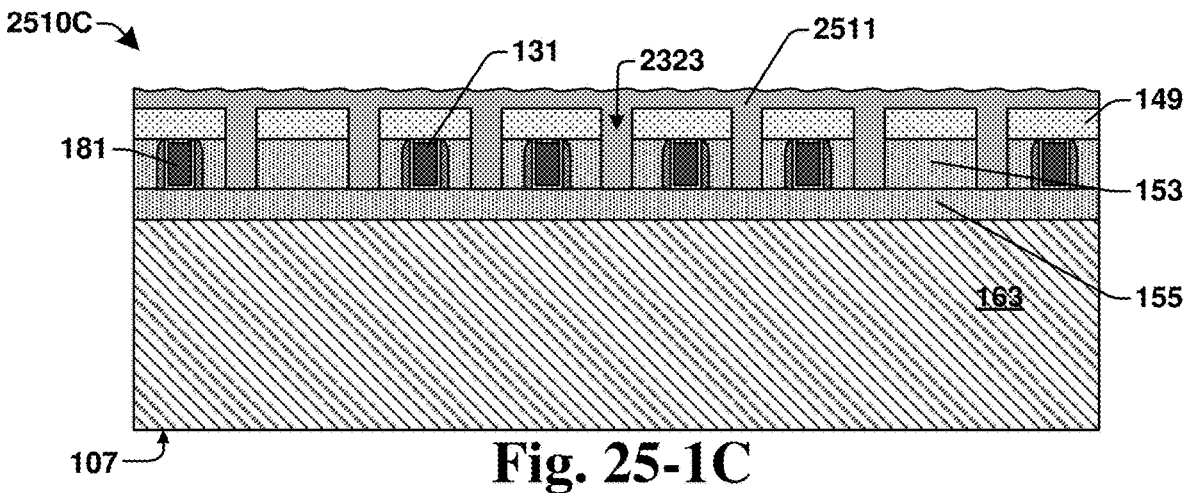
Figures 2A, 25:
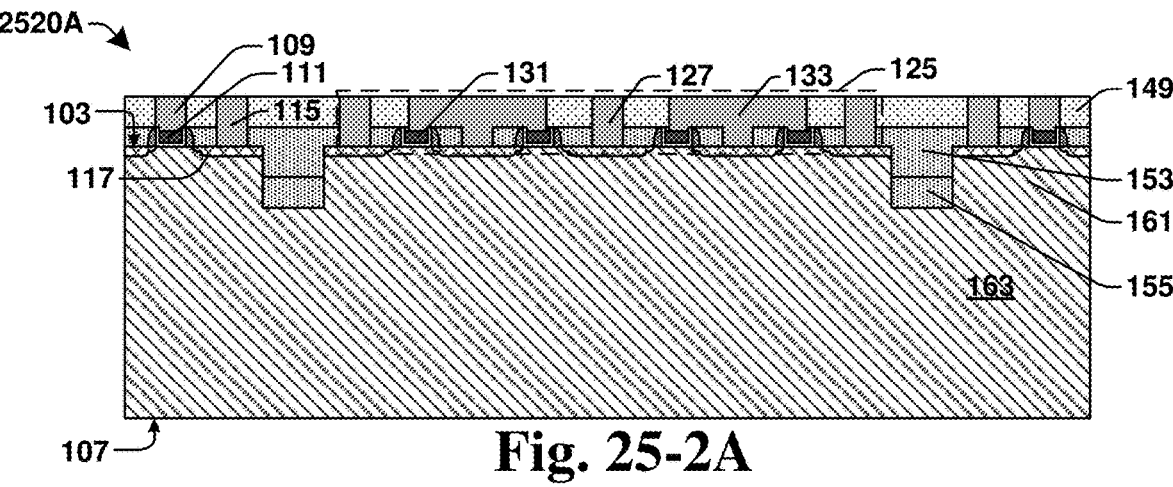
Figures 2B, 25:
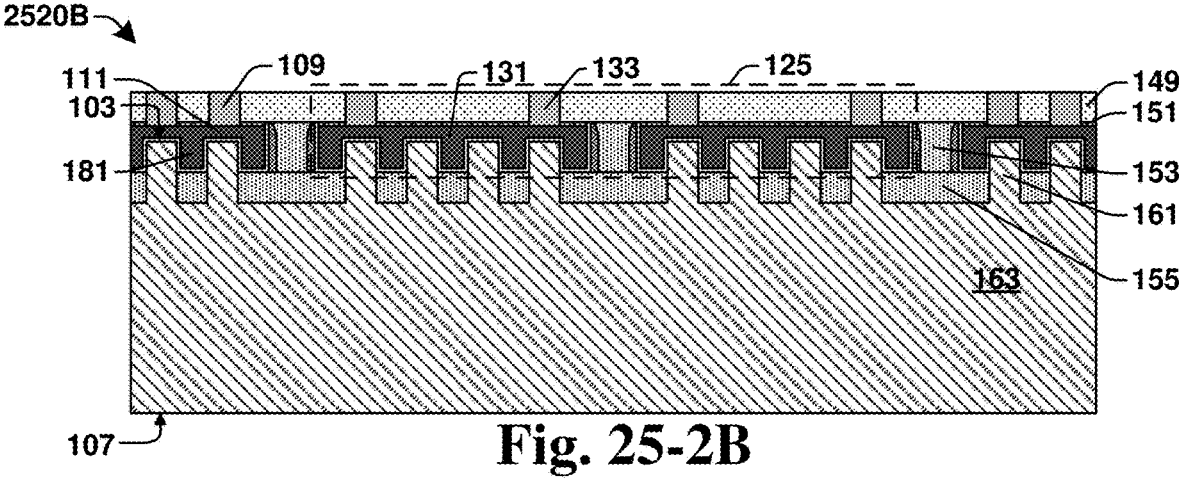
Figures 2C, 25:
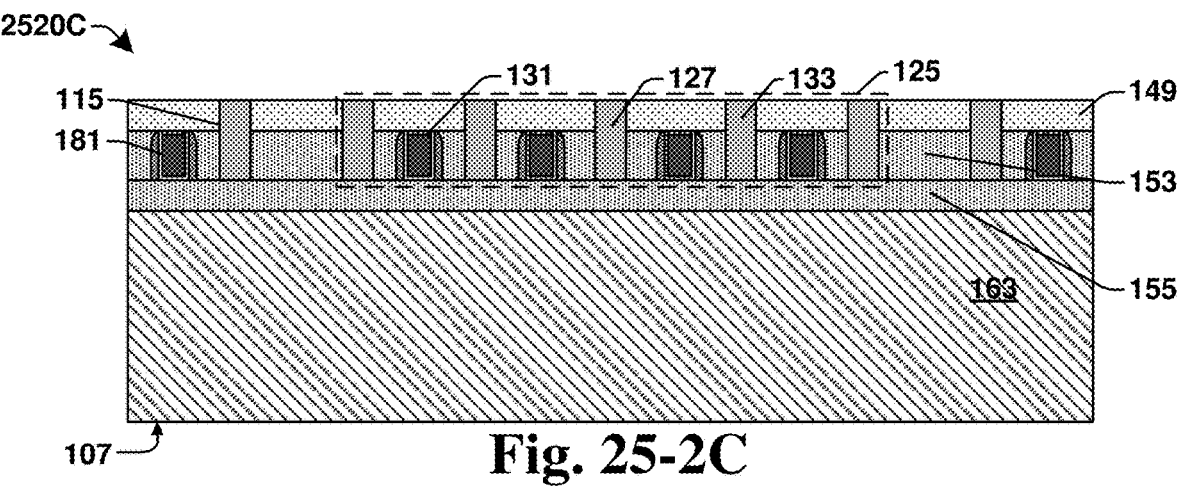
Figures 2D, 25:
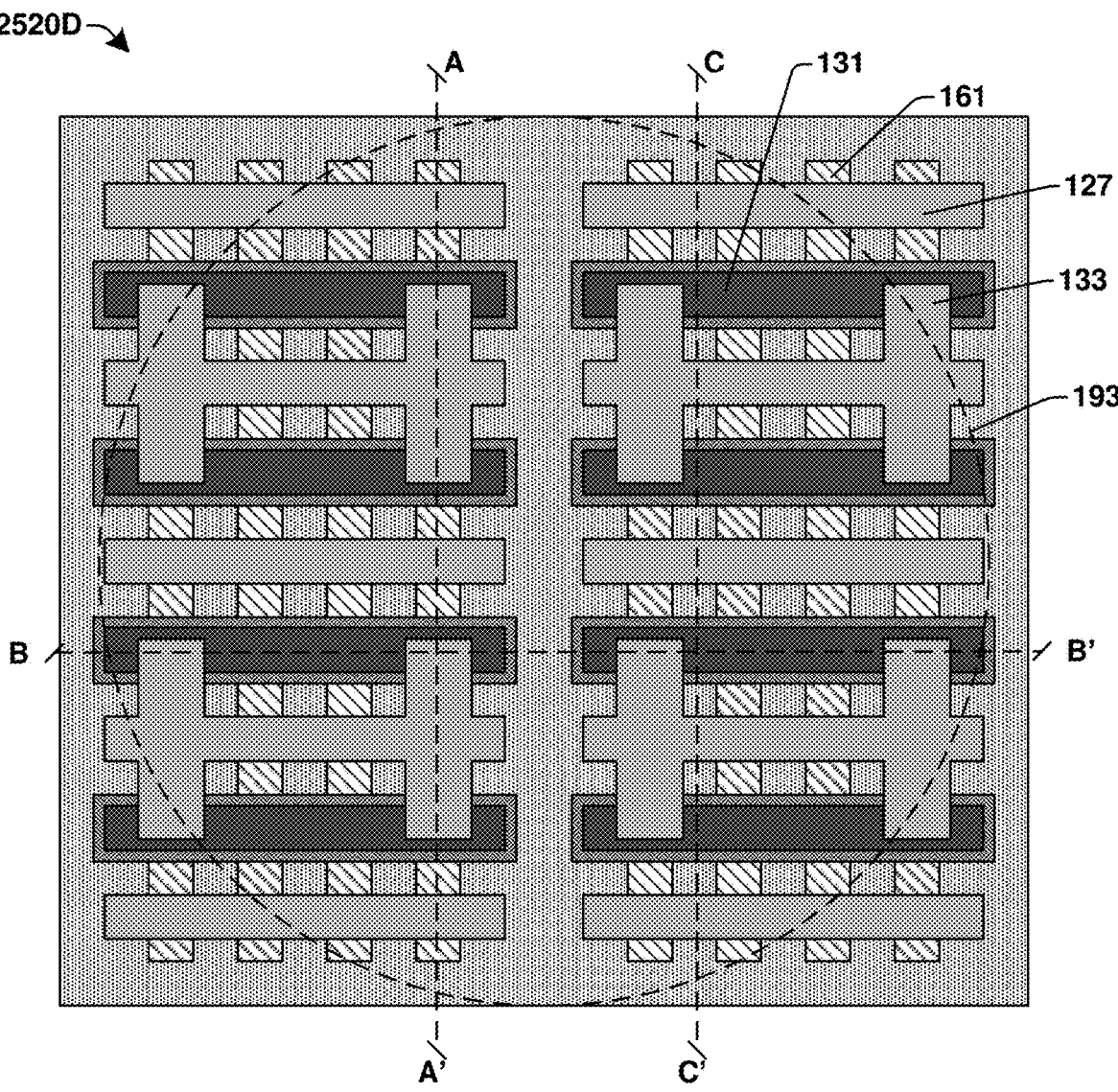

As shown by the cross-sectional views 2510A-C of FIGS. 25-1A through 25-1C, an M0 metal 2511 may be deposited so as to fill the trenches 2323 and 2421 and contact the gate strips 181 and the electrode metal substructures 131. The M0 metal 2511 may include one layer having one composition, or multiple layers having differing compositions. One of the layers may be a diffusion barrier layer such as titanium (Ti), tantalum (Ta), titanium nitride (TiN), tantalum nitride (TaN), or the like. Examples of metals that may be suitable include copper (Cu), tungsten (W), ruthenium (Ru), palladium (Pd), platinum (Pt), cobalt (Co), nickel (Ni), zirconium (Zi), aluminum (Al), conductive carbides, nitride, oxides, silicides, alloys of these metals, or the like. In some embodiments, the M0 metal is harder than copper (Cu). In some embodiments, the M0 metal comprises tungsten (W), cobalt (Co), cobalt silicide ($CoSi_2$), nickel (Ni), nickel silicide (NiSi), an alloy thereof, or the like. The M0 metal 2511 may be deposited by electroplating, electroless plating, ALD, CVD, PVD, the like, or any other suitable process.

As shown by the cross-sectional views 2520A-C and the plan view 2520D of FIG. 25-2A through 25-2D, a planarization process may be carried out to remove the M0 metal 2511 that is outside the trenches 2323 and 2421 so as to define the M0 metallization layer from the M0 metal 2511. The M0 metallization layer includes the wires 109 and 115, and the M0 metal substructures 127 and 133. The planarization process may be CMP, the like, or any other suitable process. FEOL processing rules limit the areal density variation of the M0 metal across the front side 103 so that excessive localized dishing does not occur during this process.

Figures 26A, 26B, 26C:
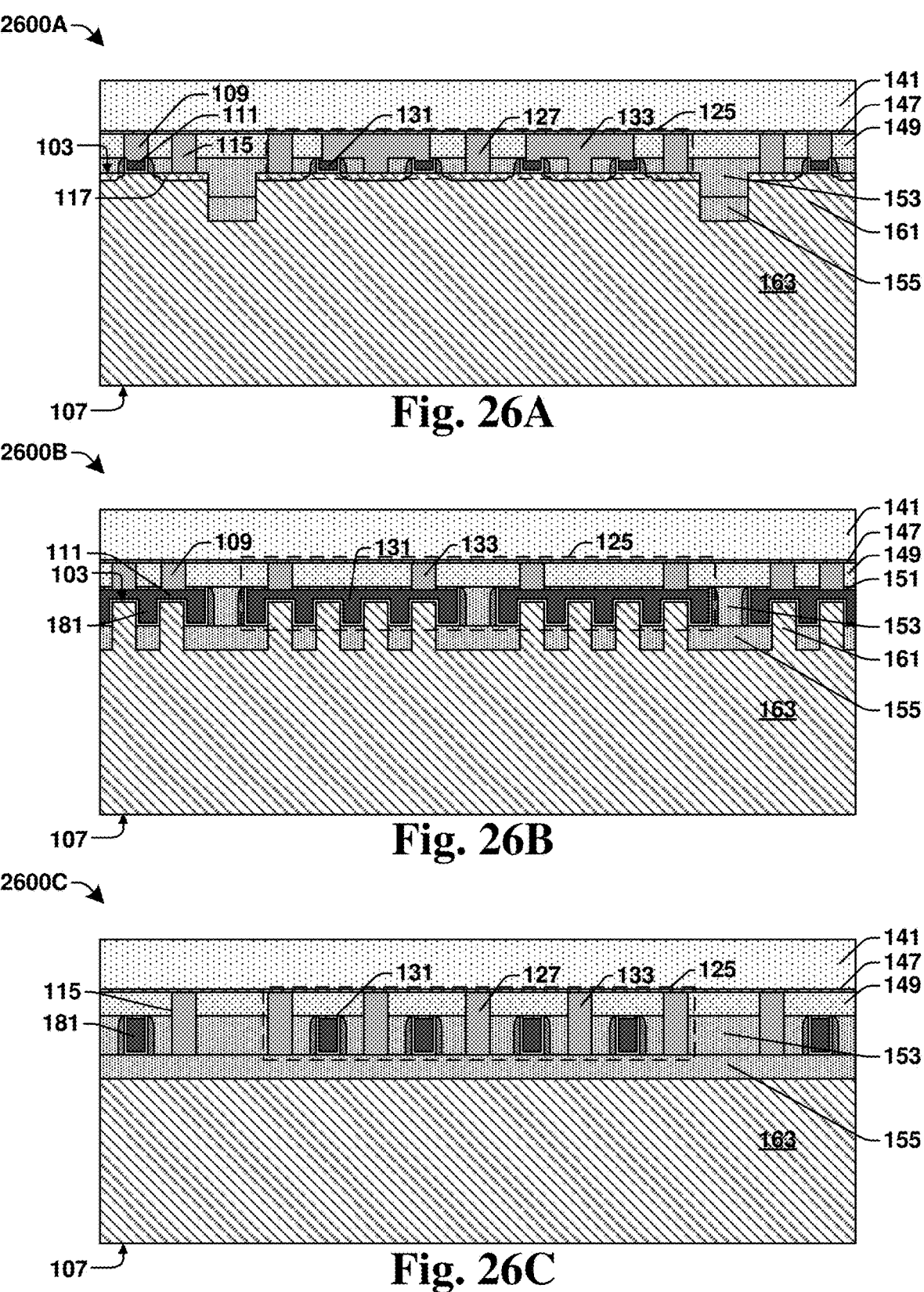

As shown by the cross-sectional views 2600A-C of FIGS. 26A-C, an etch stop layer 147 and a low-κ interlevel dielectric 141 may be formed over the structure shown by FIGS. 25-2A through 25-2D. The etch stop layer 147 may be silicon nitride (SiN), silicon carbide (SIC), silicon carbonitride (SiCN), silicon oxycarbide (SIOC), silicon oxycarbonitiride (SiOCN), the like, or any other suitable material. In some embodiments, the etch stop layer 147 is silicon carbide (SiC) or the like. The low-κ interlevel dielectric 141 may be a low-κ dielectric. In some embodiments, the low-κ interlevel dielectric 141 is an extremely low-κ dielectric. A low-κ dielectric is one having a smaller dielectric constant than silicon dioxide ($SiO_2$). $SiO_2$ has a dielectric constant of about 3.9. Examples of low-κ dielectrics include organosilicate glasses (OSG) such as carbon-doped silicon dioxide, fluorine-doped silicon dioxide (otherwise referred to as fluorinated silica glass (FSG), organic polymer low low-κ dielectrics, and porous silicate glass. An extremely low-κ dielectric is a material having a dielectric constant of about 2.1 or less. An extremely low-κ dielectric material is generally a low-κ dielectric material formed into a porous structure. Porosity reduces the effective dielectric constant. The low-κ interlevel dielectric 141 may be silicon dioxide ($SiO_2$), a low-κ dielectric, or the like. The etch stop layer 147 and the low-κ interlevel dielectric 141 may be deposited by ALD, CVD, PVD, the like, or any other suitable processes.

Figures 27A, 27B, 27C:
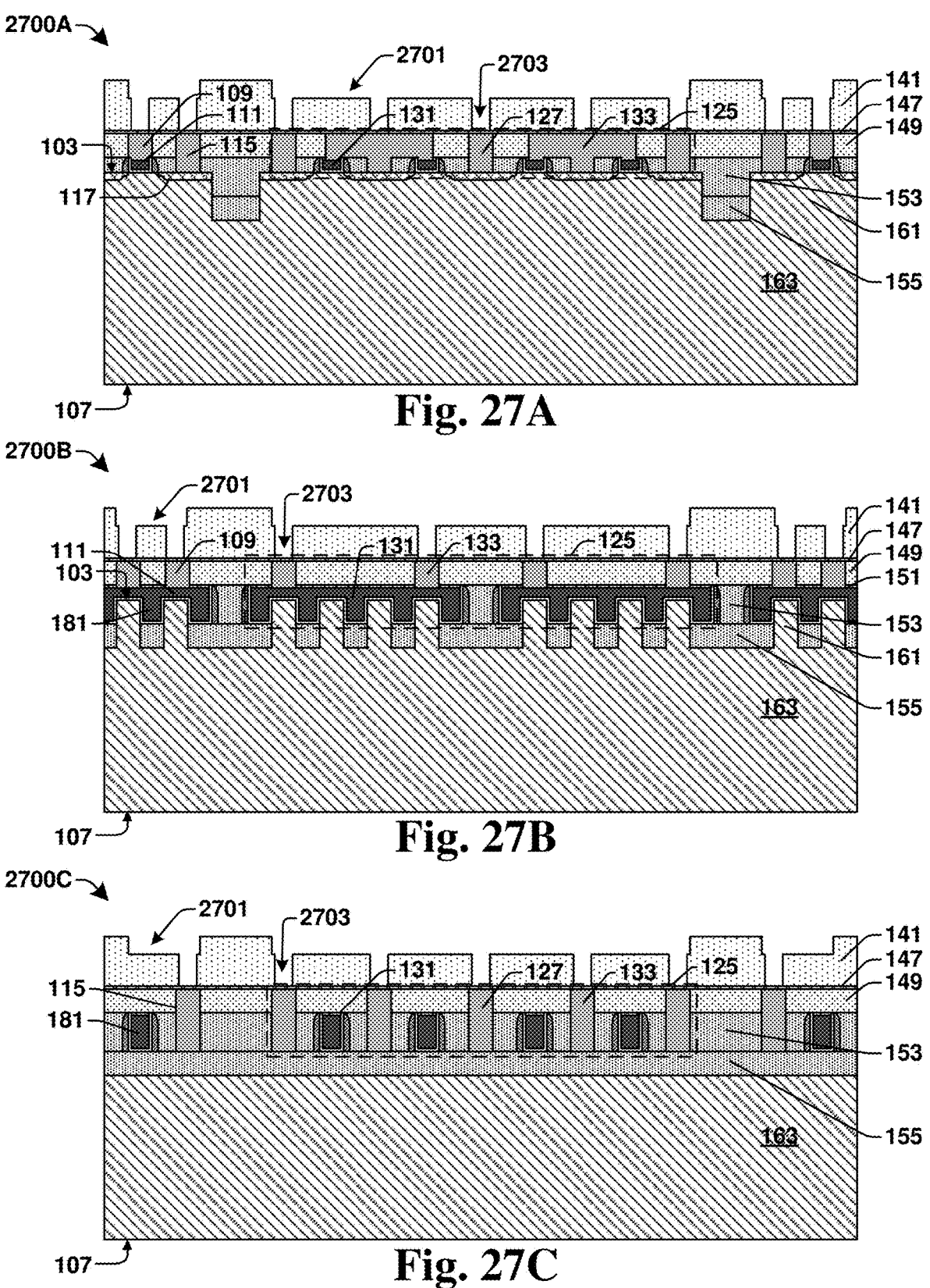

As shown by the cross-sectional views 2700A-C of FIGS. 27A-C, the low-κ interlevel dielectric 141 may be patterned with trenches 2701 and holes 2703. The patterning process may include etching with a first mask to form the trenches 2701 and a second mask to form the holes 2703. The trenches 2701 may be etched first followed by the holes 2703 or the holes 2703 may be etched first followed by the trenches 2701.

Figures 28A, 28B, 28C:
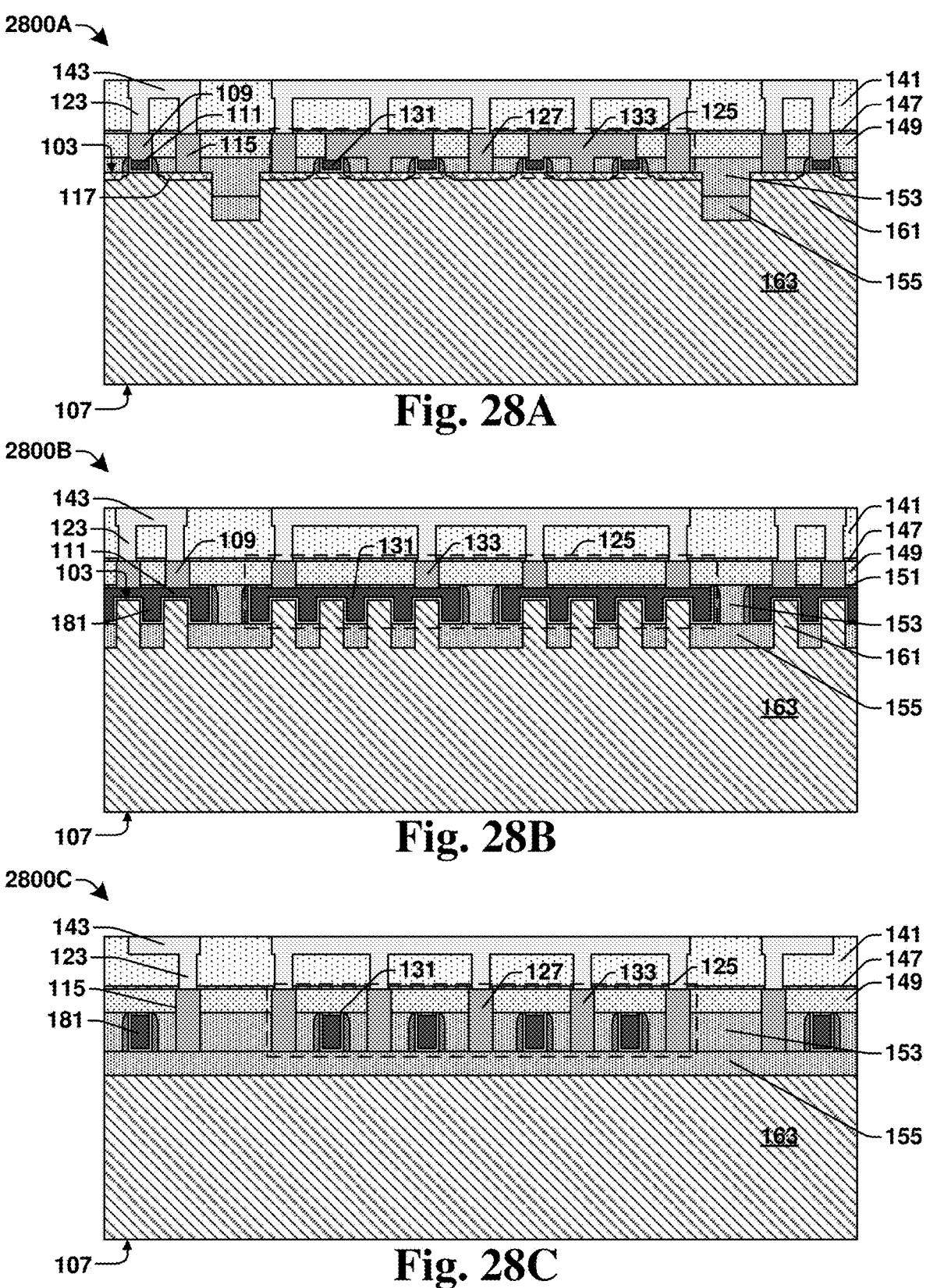

As shown by the cross-sectional views 2800A-C of FIGS. 28A-C, a metal may be deposited to fill the trenches 2701 and the holes 2703 thus forming the metallization layer M1 comprising wires 143 and vias 123. The metal may be any suitable metal or alloy. In some embodiments, the metal is copper (Cu), aluminum (Al), tungsten (W), ruthenium (Ru), an alloy thereof, or the like. In some embodiments, the metal is copper (Cu), aluminum (Al), or the like. The metal may be deposited by electroplating, electroless plating, ALD, CVD, PVD, the like, or any other suitable process. After deposition, a planarization process such as CMP maybe used to remove excess metal. In some embodiments, the M1 metallization layer is thinner than the M0 metallization layer. In some embodiments, the M1 metallization layer is thinner than the electrode metal substructures 131 and the gate strips 181.

Figures 29A, 29B, 29C:
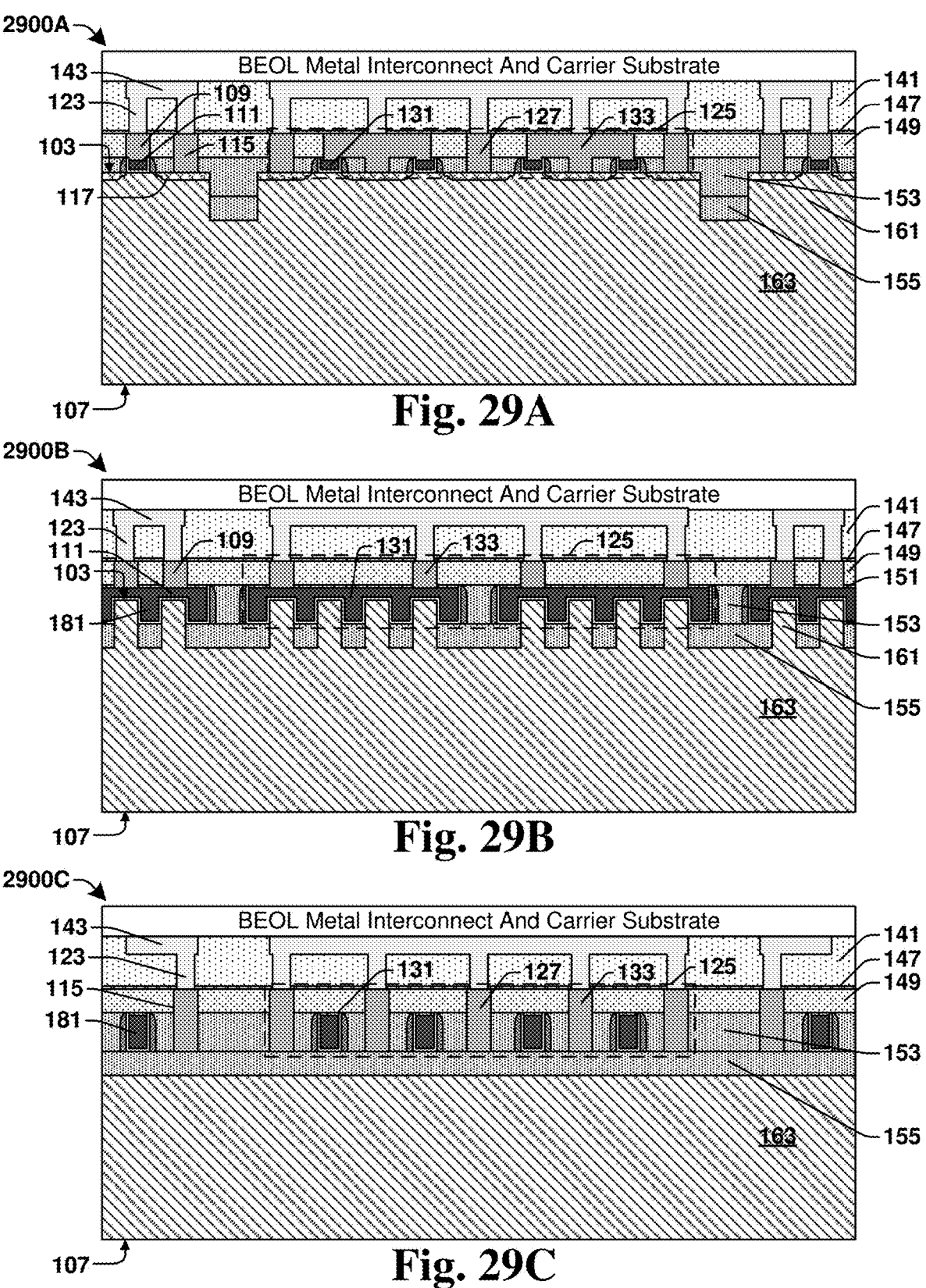

The cross-sectional views 2900A-C of FIGS. 29A-C provide a placeholder for several steps that are shown only schematically for ease of illustration. One of these steps is adding additional metallization layers to complete the formation of the BEOL metal interconnect 101 (see FIG. 1A). Another of these steps is attaching the semiconductor substrate 163 to a carrier substrate or other second substrate through the BEOL metal interconnect 101. The carrier substrate supports the semiconductor substrate 163 through the next optional step, which is thinning the semiconductor substrate 163 by CMP, grinding, or the like from the back side 107. In some embodiments, the semiconductor substrate 163 is reduced to a thickness in the range from about 50 μm to about 100 μm. In some embodiments, the semiconductor substrate 163 is reduced to a thickness in the range from about 3 μm to about 50 μm. In some embodiments, the semiconductor substrate 163 is reduced to a thickness of about 10 μm or less.

Figures 30A, 30B, 30C:
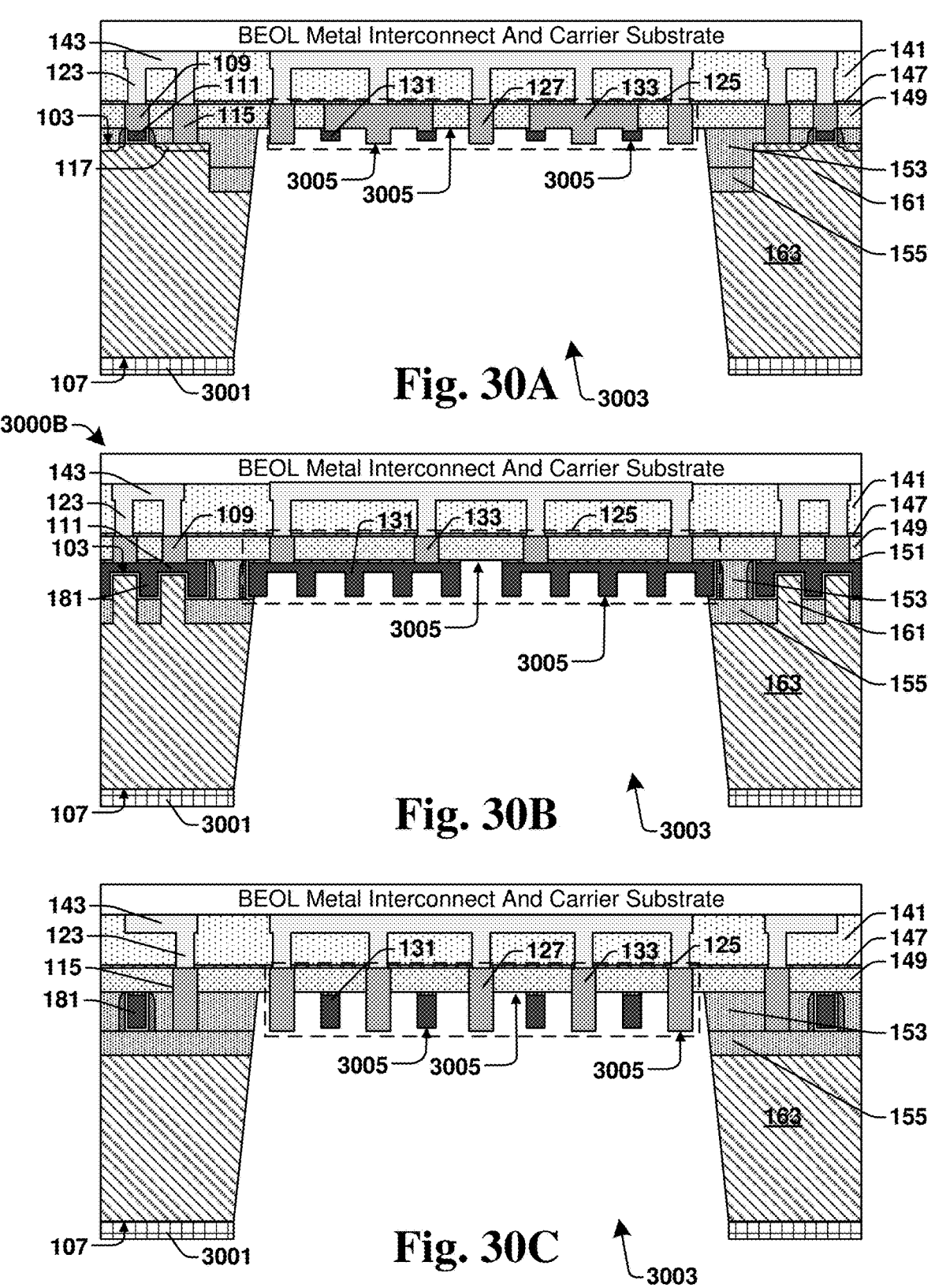

As shown by the cross-sectional views 3000A-C of FIGS. 30A-C, a mask 3001 may be formed on the back side 107 and used to etch the through substrate hole 3003. The horizontal surfaces of the through substrate hole 3003 that are opposite the back side 107 comprise the TSV landing surface 3005. The through substrate hole 3003 begins at the back side 107 and extends through the semiconductor substrate 163 to stop at the TSV landing surface 3005 at the front side 103. The metal coupling structure 125 provides a part of the TSV landing surface 3005 and is exposed within the through substrate hole 3003. The TSV landing surface 3005 may also include one or more dielectrics. In the illustrated embodiment, the TSV landing surface 3005 includes the interlevel dielectric layer 149. In various embodiments, the TSV landing surface 3005 includes one or more of the isolation dielectric layer 153, the interlevel dielectric layer 149, the etch stop layer 147, or the low-κ interlevel dielectric 141. Some portion of the fins 161 may remain in the TSV landing surface 3005, although in some embodiments the fins 161 are etched completely from the TSV landing surface 3005.

The process of forming the through substrate hole 3003 may include one or more stages of dry etching, the like, or any other suitable processes. The conditions for an initial stage of the etching process may be nonselective, or selective for removing semiconductor materials such as silicon (Si) and the like while leaving dielectric material such as silicon dioxide (SiO$_2$) relatively intact. In some embodiments, the initial stage of the etching process concludes when oxide is detected in the etching process exhaust. The conditions for a late stage of the etching process may be selective for removing silicon dioxide (SiO$_2$) and similar dielectrics while leaving metals such as tungsten (W) relatively intact. The conditions for the latter stage of the etching process may also be selective for removing semiconductor materials such as silicon (Si) while leaving metals such as tungsten (W) relatively intact. In some embodiments, the latter stage of the etching process concludes when tungsten (W) or some other metal is detected in the etch process exhaust. In some embodiments, the etch stops in part on an etch stop layer such as the etch stop layer 147.

Figures 31A, 31B, 31C:
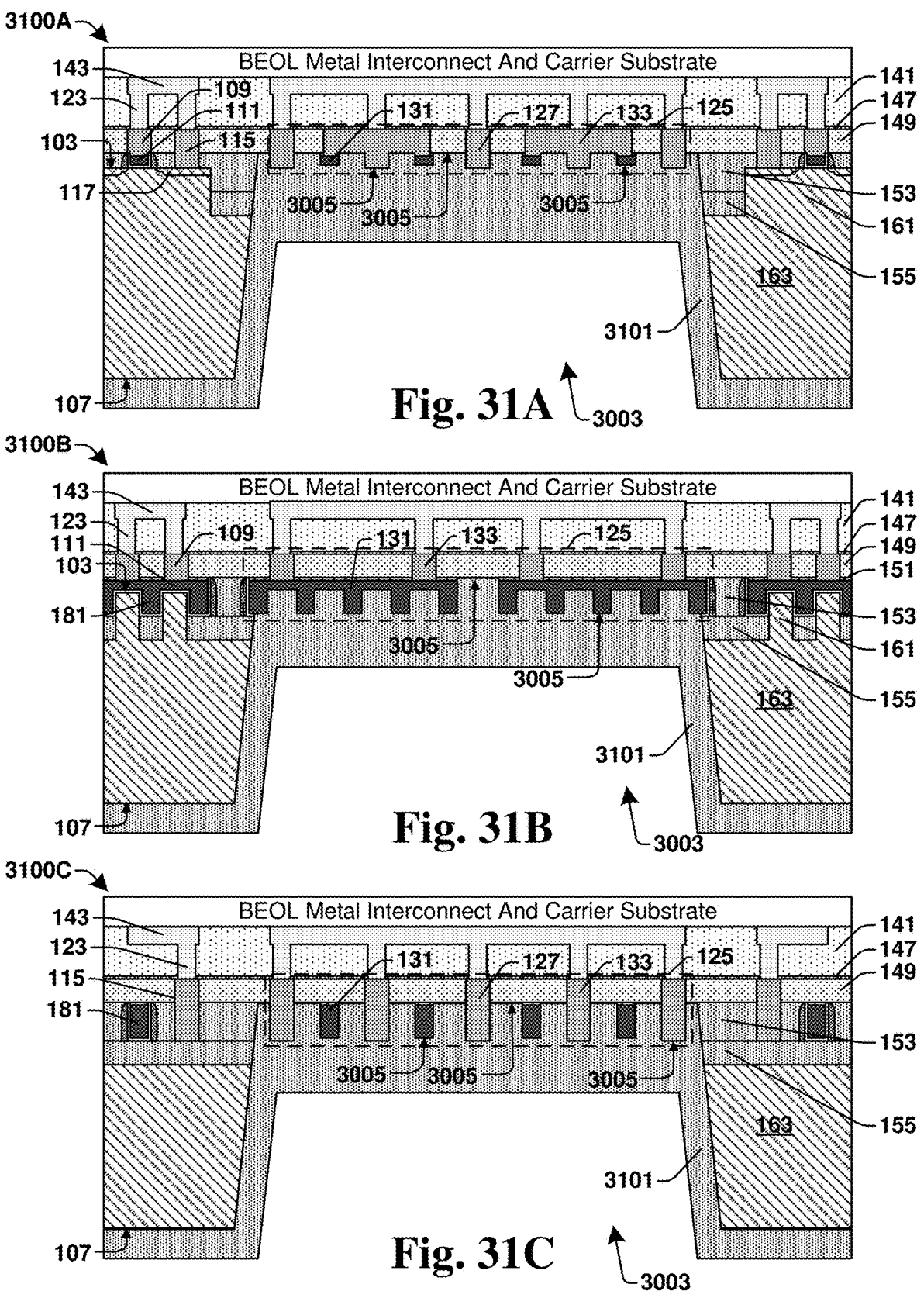

As shown by the cross-sectional views 3100A-C of FIGS. 31A-C, a dielectric 3101 may be deposited so as to line the through substrate hole 3003. The dielectric 3101 may be an oxide, a nitride, or a carbide. In some embodiments, the dielectric 3101 is silicon dioxide (SiO$_2$) or the like. The dielectric 3101 may be deposited by CVD, PVD, or the like. In some embodiments, the dielectric 3101 is deposited so as to be thinner in the through substrate hole 3003 near the front side 103 as compared to on the back side 107.

Figures 32A, 32B, 32C:
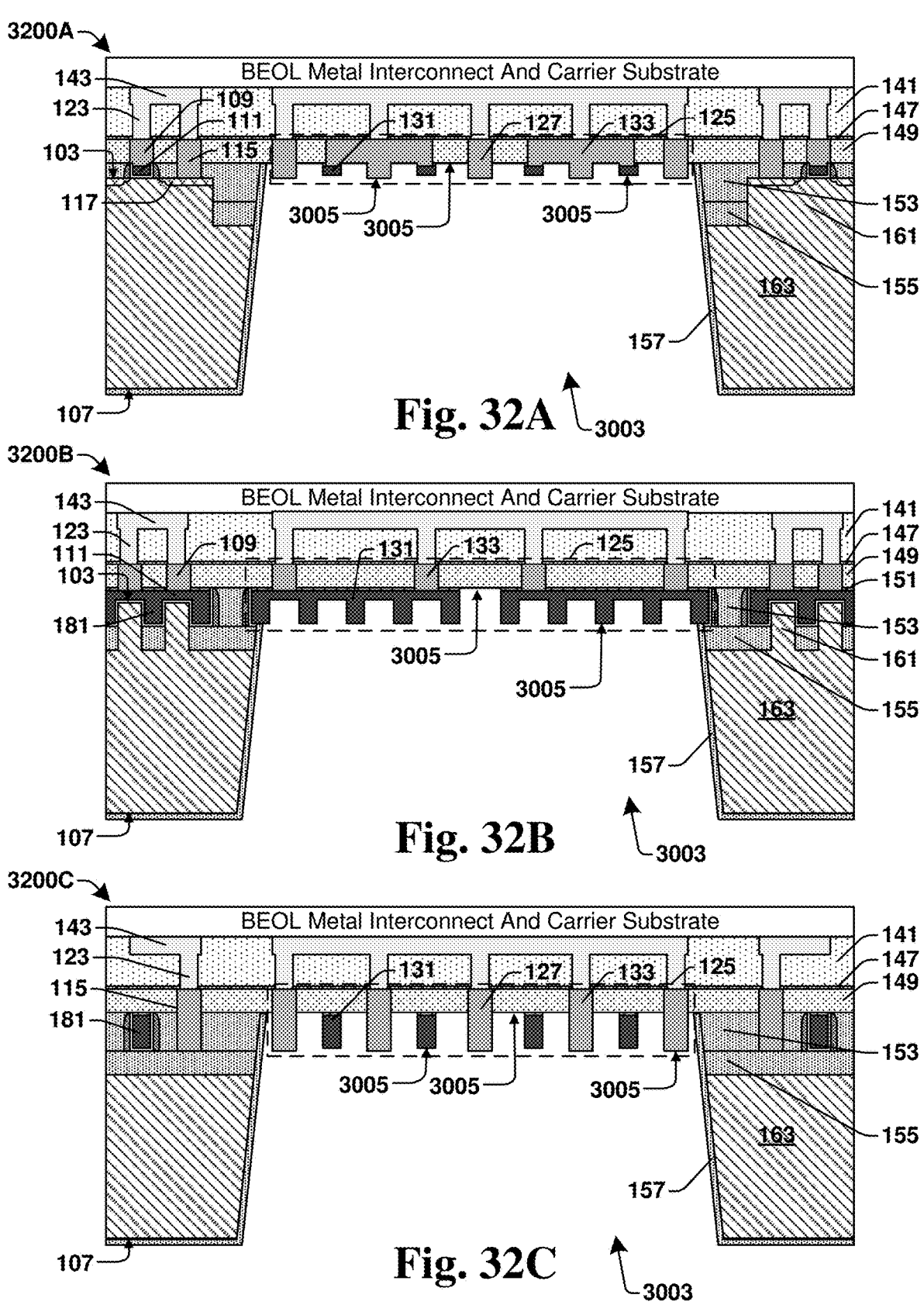
Figures 33A, 33B, 33C:
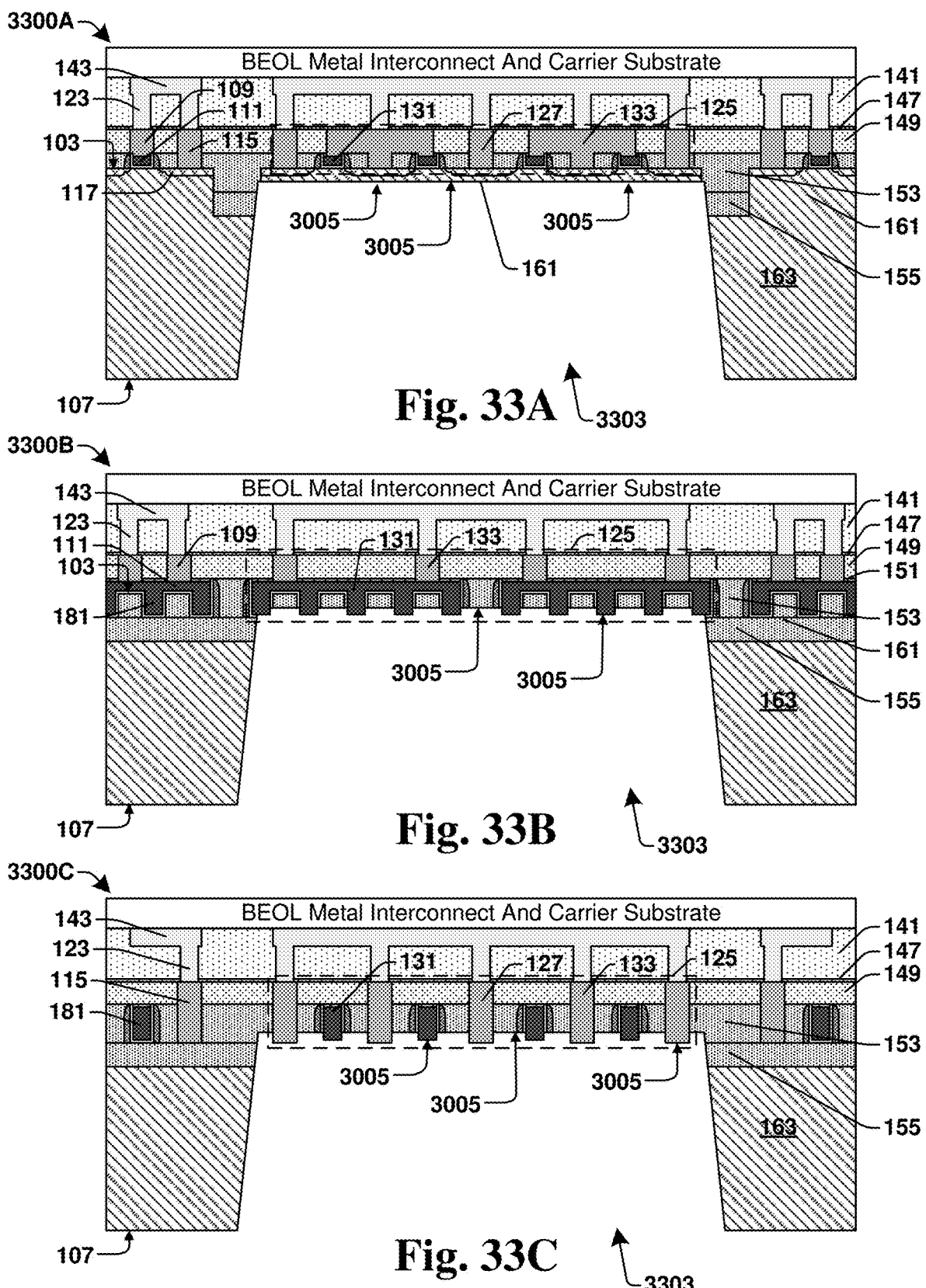
Figures 34A, 34B, 34C:
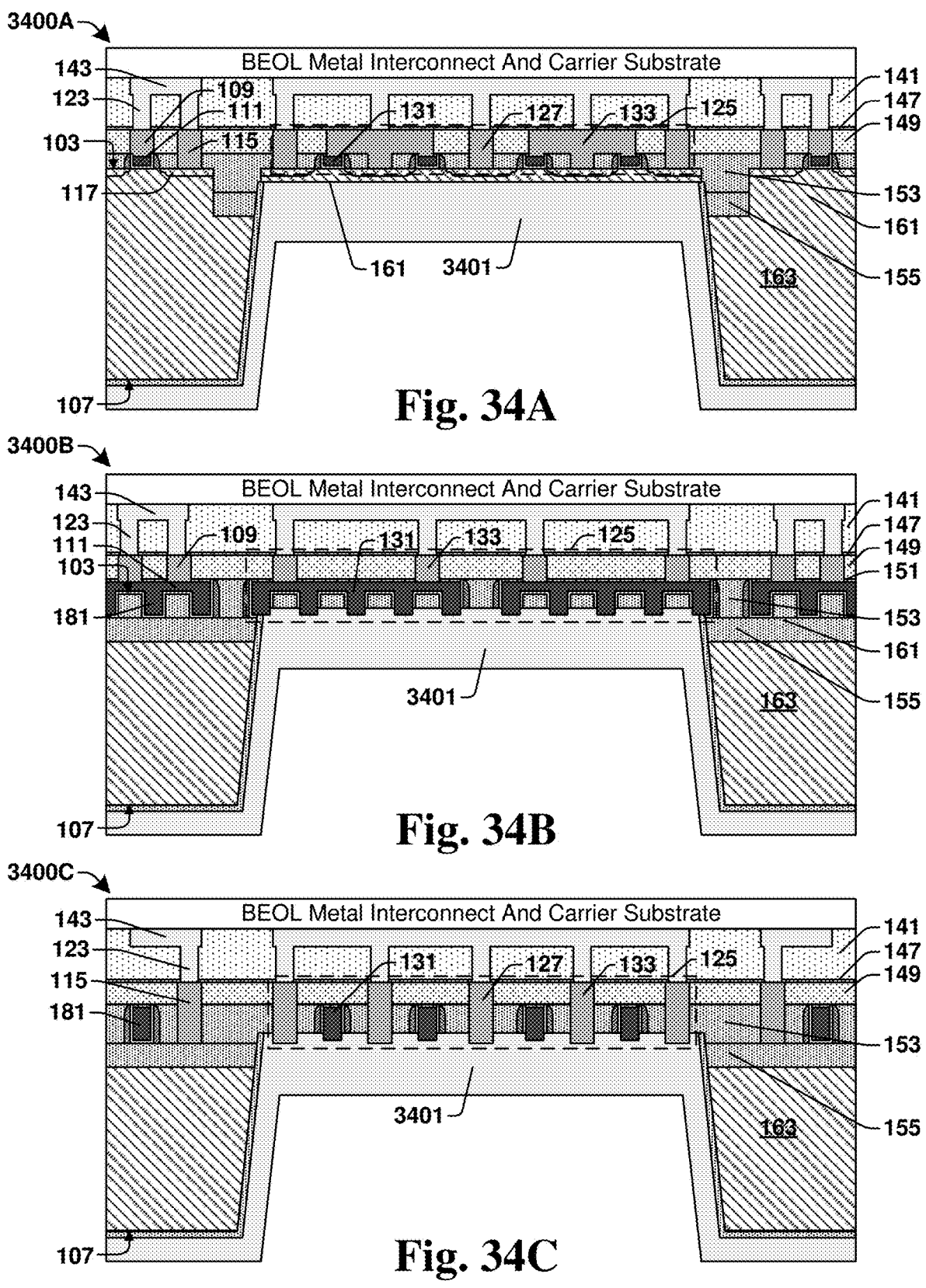
Figures 35A, 35B, 35C:
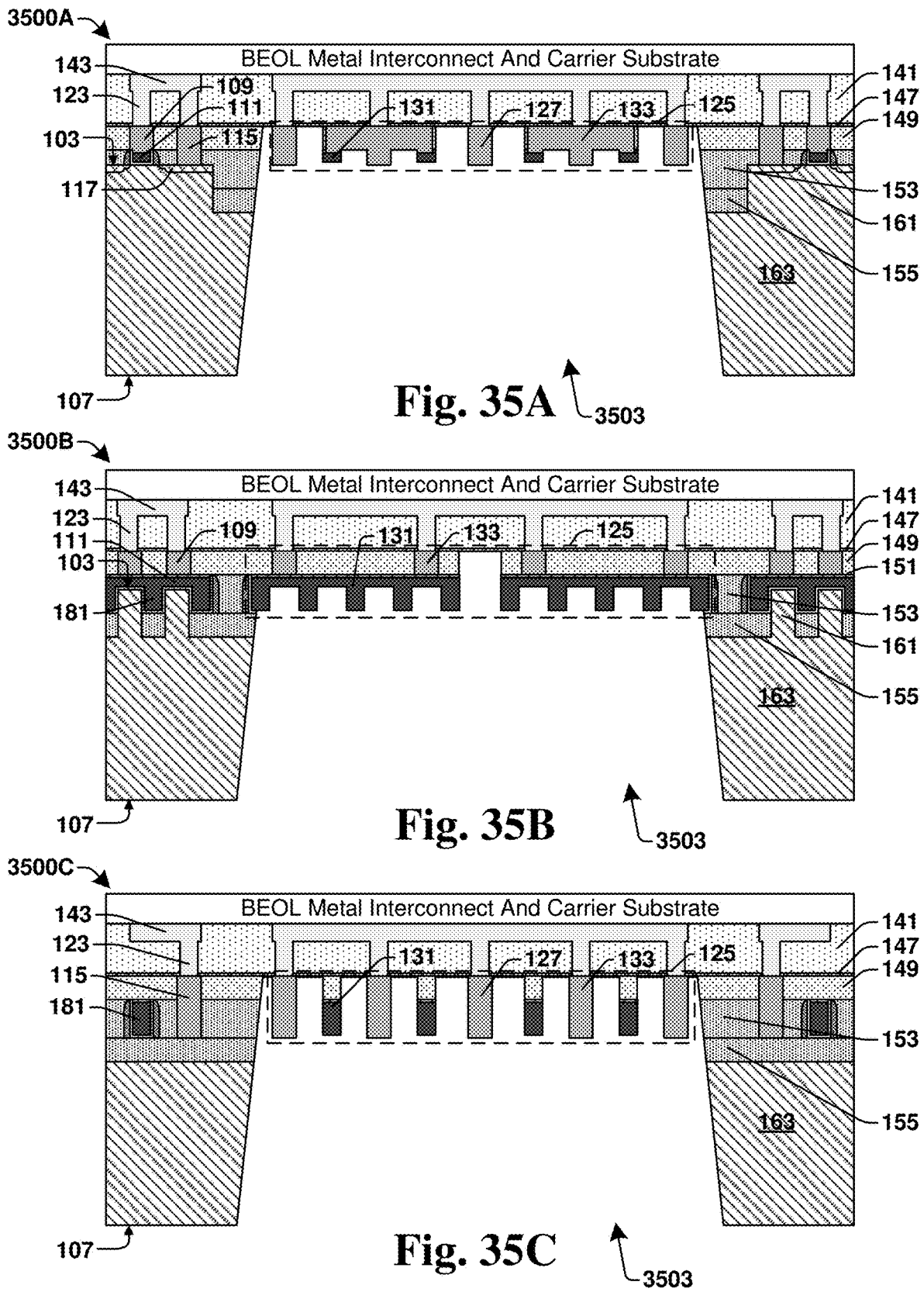

As shown by the cross-sectional views 3200A-C of FIGS. 32A-C, an etch may be carried out to break through the dielectric 3101 on the TSV landing surface 3005 while leaving a portion of the dielectric 3101 to form the dielectric liner 157. The etch may be, for example, a wet etch, an isotropic dry etch, an anisotropic dry etch, a combination thereof, or the like. In some embodiments, a mask is formed so that the etch breaks through the dielectric 3101 in the TSV landing area without removing the dielectric 3101 from the sidewalls of the through substrate hole 3003.

After forming the dielectric liner 157, metal may be deposited in the through substrate hole 3003 to form the TSV 129 as shown in FIGS. 1A-E. Any suitable metal may be used. In some embodiments, the metal is or comprises copper (Cu), tungsten (W), aluminum (Al), or the like. Copper (Cu) has a high conductivity. Tungsten (W) and aluminum (Al) have good conductivity and lend themselves to deposition in high aspect ratio openings. The conductive metal may be deposited by CVD, PVD, electroplating, electroless plating, or the like. The metal may form the contact pad 165 on the back side 107 (see FIG. 1A). A solder ball 167 may be placed on the contact pad 165.

In the foregoing process, finFETs were formed and FEOL processing took place over semiconductor fins. Alternatively, the processing of FIGS. 15A-32C is carried out over a planar surface and related field effect transistors (FETs) are formed along with the metal coupling structure 125. In these alternate embodiments, active areas of the semiconductor substrate 163 take the place of the fins 161 (see FIGS. 15A-C) and shallow trench isolation structures may separate the active areas.

FIGS. 33A-34C illustrate a variation of the process of FIGS. 13A-32C. As shown by the cross-sectional views 3300A-C of FIGS. 33A-C, the etch that forms the through substrate hole 3003 (see FIGS. 30A-C) is replaced by an etch that forms the through substrate hole 3303. The through substrate hole 3303 is shallower. The metal coupling structure 125 is exposed in the through substrate hole 3303, but the fins 161 are not entirely removed from the TSV landing surface 3005. As shown by the cross-sectional views 3400A-C of FIGS. 34A-C, the metal coupling structure 125 will be embedded in a TSV 3401 formed in the through substrate hole 3303, but less deeply that the TSV 129 shown in FIGS. 1A-E. The TSV 3401 contacts remnants of the fins 161.

FIGS. 35A-36C illustrate another variation of the process of FIGS. 13A-32C. As shown by the cross-sectional views 3500A-C of FIGS. 35A-C, in this variation etching forms the through substrate hole 3503. The through substrate hole 3503 is deeper than the through substrate hole 3003 of FIGS. 30A-30C. In some embodiments, the through substrate hole 3503 stops on the etch stop layer 147. The metal coupling structure 125 is more deeply exposed, but the etch does not contaminate or damage the low-κ interlevel dielectric 141 or any of the wires 143. As shown by the cross-sectional views 3600A-C of FIGS. 36A-C, the metal coupling structure 125 is embedded more deeply in the resulting TSV 3601 as compared to the TSV 129 shown in FIGS. 1A-E. The TSV 3601 extends further onto the front side 103 than the TSV 129.

FIGS. 37A-38C illustrate another variation of the process of FIGS. 13A-32C. As shown by the cross-sectional views 3700A-C of FIGS. 37A-C, in this variation etching forms the through substrate hole 3703, which is even deeper. The through substrate hole 3703 reaches the wires 143 in the M1 metallization layer. As shown by the cross-sectional views 3600A-C of FIGS. 36A-C, when the TSV 3801 is formed in the through substrate hole 3703, it directly contacts the M1 metallization layer. Although this contact is generally avoided by the present disclosure, it does not necessarily have any negative consequences, particularly if it only occurs as an outlier in a process where etching does not consistently reach the M1 metallization layer. As shown by these examples, the present disclosure provides a TSV contact structure that tolerates wide variations in processing.

Figures 36A, 36B, 36C:
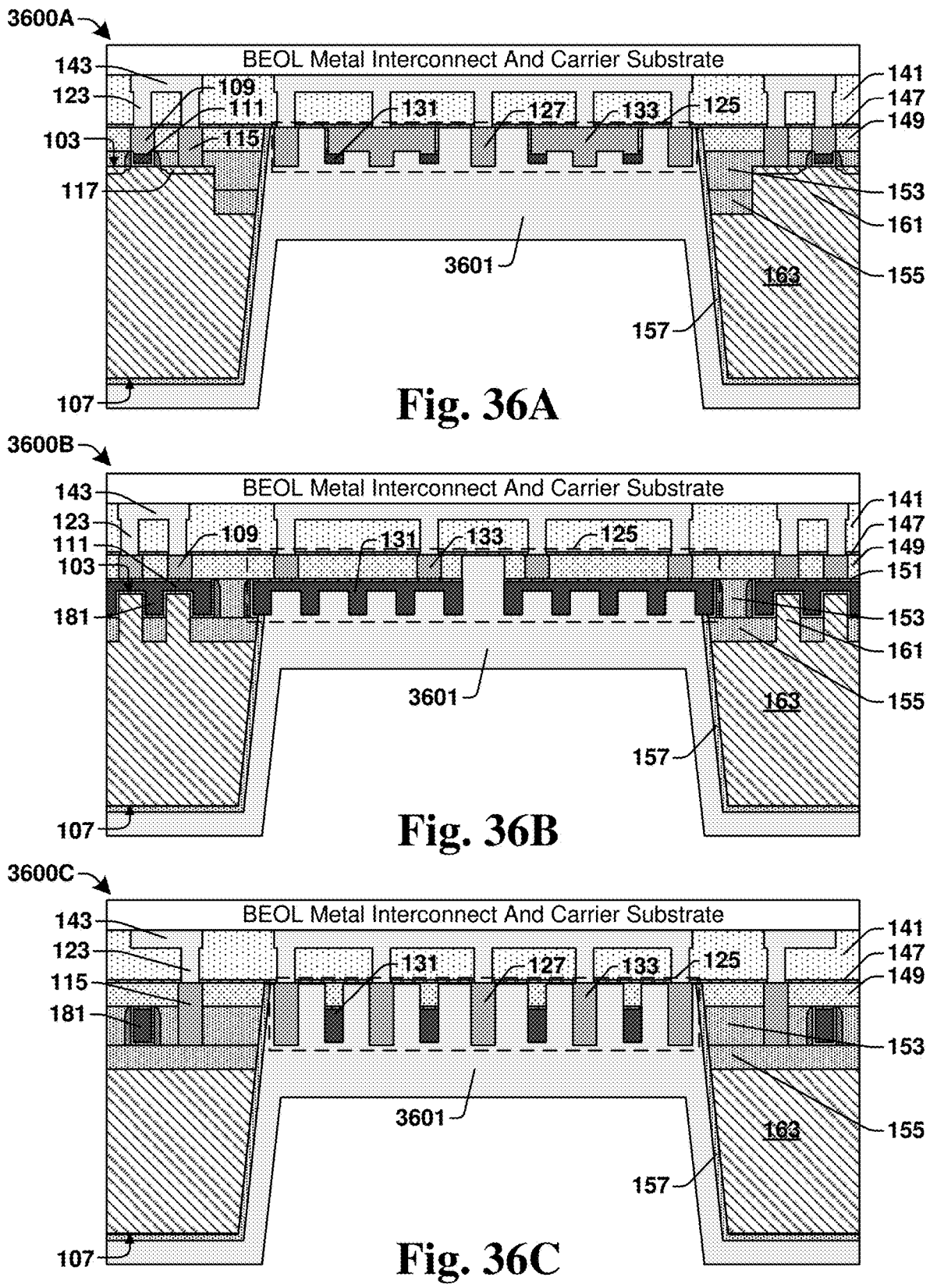
Figures 38A, 38B, 38C:
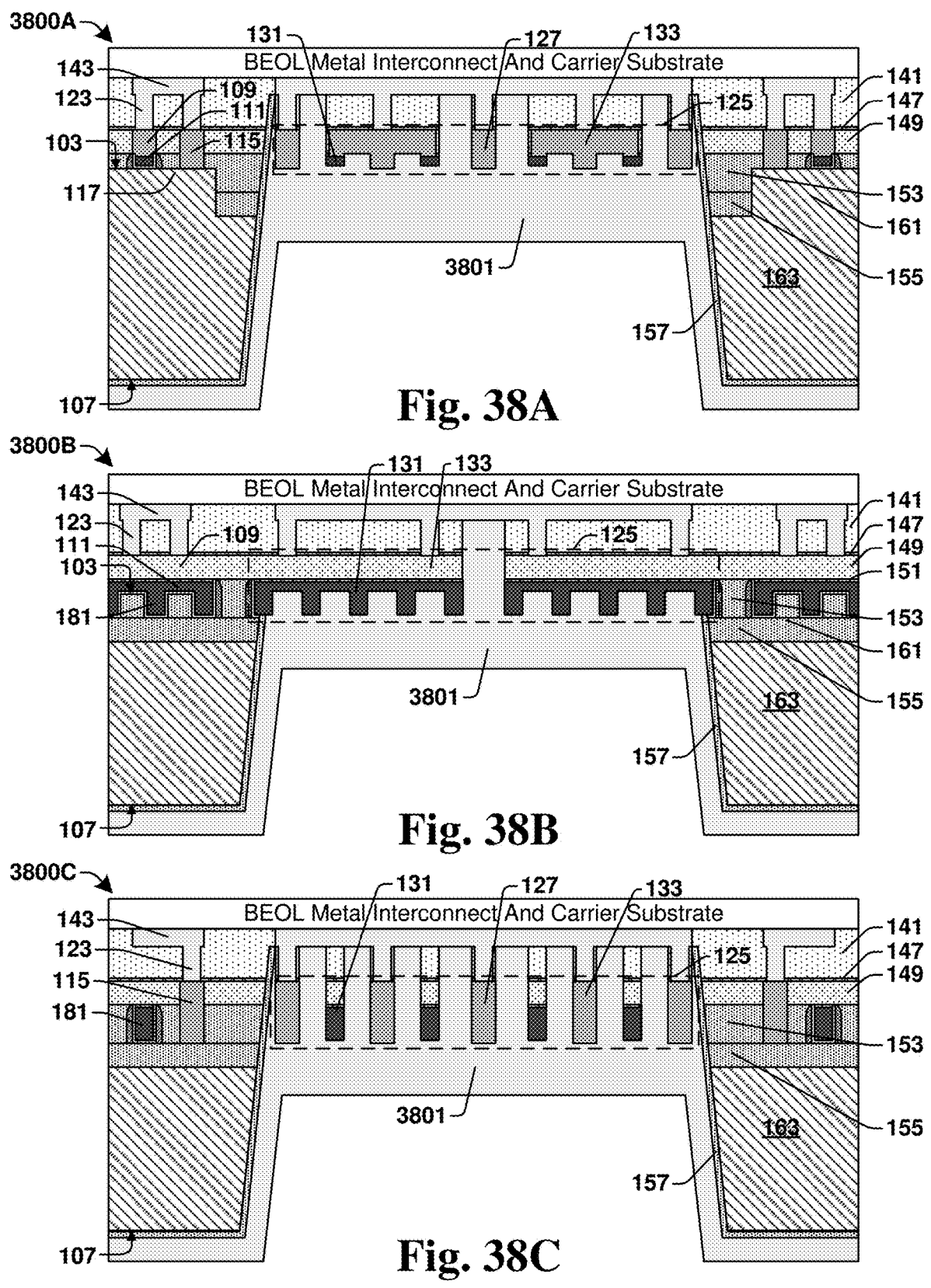

Comparing FIGS. 1A, 34A, 36A, and 38A it can be seen that as the through substrate hole is made deeper, the percentage of the TSV landing surface that is metal increases. The landing surface is distributed among various planes parallel to the front side 103. In the examples of FIGS. 1A, 36A, and 38A, the total contact area between the front end of the TSV and the metal facing the front end 501 (see FIG. 5) of the TSV is greater than the amount in any one plane. The contact area between the front end 501 and the metal coupling structure 125 is supplemented by contact between the TSV and the sides of the metal coupling structure 125 so as to reduce resistance.

FIG. 39 provides a flow chart for a method 3900 according to some embodiments of forming an integrated circuit device with a TSV that lands on an FEOL metal coupling structure according to the present disclosure. While the method 3900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The method 3900 begins with act 3901, generating an integrated circuit layout file. The integrated circuit layout file is generated through the processes of electronic design automation (EDA). EDA begins from a functional specification provided in a hardware description language (HDL) and continues through the specification of a circuit design including the specification of elementary circuit components called cells, specification of the physical arrangement of the cells, and specification of the wiring that interconnects the cells. Within act 3901, a layout unit 1003 (see FIG. 10) is specified and used to tile a TSV landing zone 193. The EDA process requires adherence to design rules including the FEOL process design rules that apply to the layout units 1003 and their arrangement in the TSV landing area.

The physical portion of the method 3900 begins with act 3903, providing a semiconductor substrate with fins. As noted previously, the fins are optional, however, the three-dimensional structures of fins may relate to thicker gate strips and transistor-level (M0) wiring structures which are used to form a metal coupling structure on which a TSV lands in accordance with the present disclosure. The cross-sectional views 1300A-C and the plan view 1300D of FIGS. 13A-D provide an example of a semiconductor substrate with fins in a TSV landing area.

Act 3905 is recessing the dielectric around the fins so that the fins protrude. The cross-sectional views 1400A-C of FIGS. 14A-C provide an example.

Act 3907 is forming and patterning a dummy gate stack to form dummy gate strips in a TSV landing area and outside the TSV landing area. The dummy gates strips cross the fins. The cross-sectional and plan views 1500A-1600D of FIGS. 15A-16D provide an example.

Act 3909 is forming spacers around the dummy gate stacks. The cross-sectional views 1700A-C and the plan view 1700D of FIGS. 17A-D provide an example.

Act 3911 is forming an isolation dielectric layer between the spacers so as to provide a planar surface for the subsequent gate replacement process. The isolation dielectric layer is at the height of the dummy gates. The cross-sectional views 1900A-C of FIGS. 19A-C provide an example.

Act 3913 is a gate replacement process. The gate replacement process forms high-κ metal gates and includes a planarization step. The cross-sectional and plan views 2000A-2100D of FIGS. 20A-21D provide an example.

Act 3915 is forming an interlevel dielectric layer over the isolation dielectric layer and the metal gates. The cross-sectional views 2310A-C of FIGS. 23-1A-C provide an example.

Act 3917 is forming a transistor level (M0) metal interconnect. Forming the transistor level metal interconnect involves etching through the first interlevel dielectric layer and into the isolation dielectric layer, which is at the level of the gates. The cross-sectional and plan views 2320A-2520D of FIGS. 23-2A-25-2D provide an example.

Act 3919 is forming a BEOL metal interconnect that includes vias that connect to the structures of the transistor level metal interconnect. The BEOL metal interconnect may be formed through a series of damascene or dual damascene processes. The cross-sectional views 2600A-2800C of FIGS. 26A-28C provide an example illustrating the formation of the first metallization layer in the BEOL metal interconnect.

Act 3921 is attaching the semiconductor substrate to a second substrate and then thinning the semiconductor substrate from the back side.

Figures 37A, 37B, 37C:
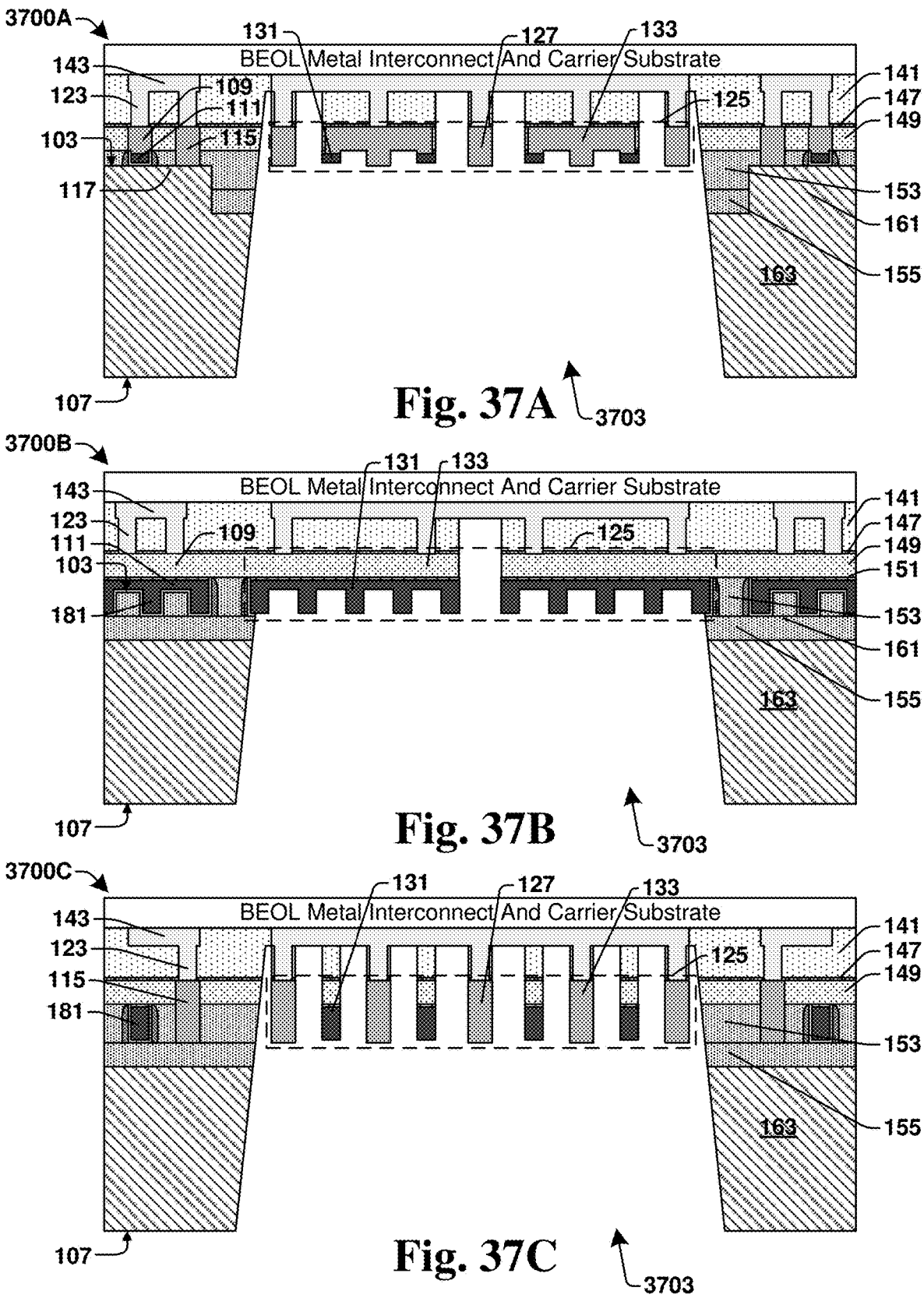

Act 3923 is etching a through substrate hole from the back side, wherein the through substrate hole lands on gate metal structures formed in act 3913 and transistor level metal interconnect structures formed in act 3917. The cross-sectional views 3000A-C of FIGS. 30A-C provide an example. The cross-sectional views 3300A-C of FIGS. 33A-C, the cross-sectional views 3500A-C of FIGS. 35A-C, and the cross-sectional views 3700A-C of FIGS. 37A-C provide additional examples.

Act 3925 is lining the through substrate hole with dielectric. The cross-sectional views 3100A-3200C of FIGS. 31A-32C provide an example.

Act 3927 is forming a TSV in the through substrate hole. The cross-sectional views of FIGS. 1A-E provide an example. The cross-sectional views 3400A-C of FIGS. 34A-C, the cross-sectional views 3600A-C of FIGS. 36A-C, and the cross-sectional views 3800A-C of FIGS. 38A-C provide additional examples.

Some aspects of the present teachings relate to an integrated circuit device having a metal interconnect structure on the front side of a semiconductor substrate and a through substrate via extending from the back side. A metal coupling structure on the front side couples the through substrate via to the metal interconnect structure. The through substrate via lands the metal coupling structure. The metal coupling structure is connected to the metal interconnect structure by vias that contact the metal coupling structure. The metal coupling structure includes a first substructure of a first metal composition, which is distinct from a composition of the wires and vias of the metal interconnect structure. In some embodiments, the through substrate via has a notched end that lands on the metal coupling structure, and the metal coupling structure has protrusions that mesh with the notched end. In some embodiments, some of the protrusions have the first metal composition and others of the protrusions have a distinct metal composition. In some embodiments, the metal coupling structure comprises an electrode metal substructure that has a distinct composition from the first substructure. In some embodiments, the electrode metal substructure is coupled to the vias through the first substructure.

Some aspects of the present teachings relate to an integrated circuit device having a metal interconnect structure on the front side of a semiconductor substrate and a through substrate via extending from the back side. The through substrate via has a notched front end. In some embodiments, the notched front end contacts a plurality of metal structures having distinct compositions. In some embodiments, a contact area for the front end defines a landing surface for the through substrate via, and the landing surface includes both metal and dielectric in direct contact with the front end.

In some embodiments, the integrated circuit device further comprises a metal interconnect structure on the front side. The metal interconnect structure has wires arranged in a plurality of metallization layers. The through substrate via is coupled to the metal interconnect structure through a metal coupling structure disposed between the metal interconnect structure and the front end. In some embodiments, a total contact area between the front end and the metal coupling structure is greater than a contact area between the front end and the metal coupling structure in any one plane parallel to the front side. In some embodiments, the metal coupling structure and the wires of the metal interconnect structure that are lowest over the front side are connected by vias.

In some embodiments, the integrated circuit device further comprises a transistor having a gate electrode and a channel. The semiconductor substrate provides the channel. The metal coupling structure and the gate electrode are disposed in a common plane parallel to the front side. In some embodiments, a height to which the through substrate via extends over the front end is less than or equal to a top of the gate electrode. In some embodiments, the metal coupling structure comprises a plurality of distinct substructures of a first metal composition. In some embodiments, the distinct substructures are arranged so as to form a two-dimensional array. In some embodiments, the front end protrudes between the distinct substructures. In some embodiments, the distinct substructures are laterally separated by dielectric.

Some aspects of the present teachings relate to a method of manufacturing an integrated circuit device. The method includes providing a semiconductor body, forming a dummy gate stack, patterning the dummy gate stack to form dummy gates, forming spacers around the dummy gates, filling an area between the spacers with an isolation dielectric, performing a gate replacement process, planarizing the isolation dielectric and the high-κ metal gates, forming a first interlevel dielectric layer over the isolation dielectric and the high-κ metal gates, etching trenches through the first interlevel dielectric layer, wherein the trenches extend into the isolation dielectric, filling the trenches with a first metal, wherein the first metal forms a first metal structure in a TSV landing area, forming a second interlevel dielectric layer over the first interlevel dielectric layer, etching holes in the second interlevel dielectric layer, filling the holes with a second metal, wherein the second metal forms a first via contacting the first metal structure, forming a metal interconnect structure on the front side, wherein the metal interconnect structure includes the first via, etching a through substrate hole from the back side, wherein the first metal structure is exposed in the through substrate hole, and depositing a third metal in the through substrate hole, wherein the third metal in the through substrate hole forms a through substrate via that contacts the first metal structure. In some embodiments, etching the through substrate hole stops on an etch stop layer. In some embodiments, the gate electrode metal forms a second metal structure, and the second metal structure is exposed in the through substrate hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a substrate having a first side and a second side opposite the first side;
a through substrate via;
a metal interconnect structure on the first side, wherein the metal interconnect structure comprises wires arranged in a plurality of metallization layers;
a metal coupling structure on the first side; and
vias connecting the metal coupling structure to the metal interconnect structure;
wherein the through substrate via extends from the second side to meet the metal coupling structure;
the metal coupling structure includes a first substructure of a first metal composition, which is distinct from a composition of the wires of the metal interconnect structure; and
the through substrate via has a notched end that lands on the metal coupling structure, and the metal coupling structure has protrusions that mesh with the notched end.

2. The integrated circuit device of claim 1, wherein some of the protrusions have the first metal composition and others of the protrusions have a second metal composition, and the second metal composition is distinct from the first metal composition.

3. The integrated circuit device of claim 1, wherein the metal coupling structure comprises a second substructure of a second metal composition, which is distinct from the first metal composition.

4. The integrated circuit device of claim 3, wherein the second substructure is coupled to the vias through the first substructure.

5. An integrated circuit device, comprising:
a substrate having a first side and a second side;
a through substrate via extending from the second side to the first side, wherein the through substrate via has a back end at the second side and a front end at the first side and the front end is notched;
a metal interconnect structure on the first side, wherein the metal interconnect structure comprises wires arranged in a plurality of metallization layers; and
a metal coupling structure disposed between the metal interconnect structure and the front end;
wherein the through substrate via is coupled to the metal interconnect structure through the metal coupling structure.

6. The integrated circuit device of claim 5, wherein the front end contacts a plurality of metal structures having distinct compositions.

7. The integrated circuit device of claim 5, wherein the front end defines a landing surface for the through substrate via, and the landing surface includes both metal and dielectric in direct contact with the front end.

8. The integrated circuit device of claim 5, wherein a total contact area between the front end and the metal coupling structure is greater than a contact area between the front end and the metal coupling structure in any one plane parallel to the first side.

9. The integrated circuit device of claim 5, wherein the metal coupling structure and the wires of the metal interconnect structure that are lowest over the first side are connected by vias.

10. The integrated circuit device of claim 5, further comprising a transistor having a gate electrode and a channel, wherein the substrate comprises a semiconductor body that provides the channel, and the metal coupling structure and the gate electrode are disposed in a common plane parallel to the first side.

11. The integrated circuit device of claim 10, wherein a height to which the through substrate via extends over the front end is less than or equal to a top of the gate electrode.

12. The integrated circuit device of claim 5, wherein the metal coupling structure comprises a plurality of distinct substructures of a first metal composition.

13. The integrated circuit device of claim 12, wherein the distinct substructures are arranged so as to form a two-dimensional array.

14. The integrated circuit device of claim 12, wherein the front end protrudes between the distinct substructures.

15. The integrated circuit device of claim 12, wherein distinct substructures are laterally separated by dielectric.

16. The integrated circuit device of claim 5, wherein:

the metal interconnect structure comprises wires of a first metal composition;

the metal coupling structure comprises a second metal composition; and the first metal composition is distinct from the second metal composition.

17. The integrated circuit device of claim 16, further comprising transistors having gate electrodes, wherein the gate electrodes comprise the second metal composition.

18. A method of manufacturing an integrated circuit device, the method comprising:

providing a semiconductor body, wherein the semiconductor body has a first side and a second side;

forming a dummy gate stack;

patterning the dummy gate stack to form dummy gates;

forming spacers around the dummy gates;

filling an area between the spacers with an isolation dielectric;

performing a gate replacement process to replace the dummy gates with high-κ metal gates comprising a gate electrode metal;

planarizing the isolation dielectric and the high-κ metal gates;

forming a first interlevel dielectric layer over the isolation dielectric and the high-κ metal gates;

etching trenches through the first interlevel dielectric layer, wherein the trenches extend into the isolation dielectric;

filling the trenches with a first metal, wherein the first metal forms a first metal structure in a TSV landing area;

forming a second interlevel dielectric layer over the first interlevel dielectric layer;

etching holes in the second interlevel dielectric layer;

filling the holes with a second metal, wherein the second metal forms a first via contacting the first metal structure;

forming a metal interconnect structure on the first side, wherein the metal interconnect structure includes the first via;

etching a through substrate hole from the second side, wherein the first metal structure is exposed in the through substrate hole; and depositing a third metal in the through substrate hole, wherein the third metal in the through substrate hole forms a through substrate via that contacts the first metal structure.

19. The method of claim 18, wherein etching the through substrate hole stops on an etch stop layer.

20. The method of claim 18, wherein the gate electrode metal forms a second metal structure, and the second metal structure is exposed in the through substrate hole.

* * * * *